(12) United States Patent
Oshima et al.

(10) Patent No.: US 7,855,742 B2
(45) Date of Patent: Dec. 21, 2010

(54) SOLID STATE IMAGING DEVICE WITH HORIZONTAL TRANSFER PATHS AND A DRIVING METHOD THEREFOR

(75) Inventors: Hiroyuki Oshima, Asaka (JP);
Hirokazu Kobayashi, Asaka (JP);
Kazuya Oda, Asaka (JP); Katsumi Ikeda, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 782 days.

(21) Appl. No.: 11/727,139

(22) Filed: Mar. 23, 2007

(65) Prior Publication Data

US 2007/0229691 A1     Oct. 4, 2007

(30) Foreign Application Priority Data

Mar. 30, 2006   (JP)   ............... 2006-094407
Mar. 30, 2006   (JP)   ............... 2006-094567
Mar. 30, 2006   (JP)   ............... 2006-095198
Mar. 30, 2006   (JP)   ............... 2006-095374

(51) Int. Cl.
*H04N 3/14*      (2006.01)
*H04N 5/335*     (2006.01)

(52) U.S. Cl. .................. 348/294; 348/311; 348/312; 348/313

(58) Field of Classification Search ......... 348/311–324; 257/215–249
See application file for complete search history.

(56) References Cited

U.S. PATENT DOCUMENTS

| | | | | |
|---|---|---|---|---|
| 4,403,237 A | * | 9/1983 | Ohkubo et al. | ............... 257/240 |
| 5,063,439 A | | 11/1991 | Tabei | |
| 5,303,053 A | * | 4/1994 | Miyatake et al. | ............ 348/312 |
| 5,309,240 A | * | 5/1994 | Miwada | ..................... 348/311 |
| 5,491,512 A | * | 2/1996 | Itakura et al. | ............... 348/321 |
| 5,587,576 A | * | 12/1996 | Maki | ..................... 235/462.41 |

(Continued)

FOREIGN PATENT DOCUMENTS

JP          3-174890 A           7/1991

(Continued)

OTHER PUBLICATIONS

Office Action with English translation for corresponding JP Application No. 2006-094407 mailed Sep. 14, 2010.

(Continued)

*Primary Examiner*—Jason Chan
*Assistant Examiner*—Pritham Prabhakher
(74) *Attorney, Agent, or Firm*—Birch, Stewart, Kolasch & Birch, LLP

(57) ABSTRACT

In a solid state imaging device, signal charges are branched to be output to in the form of one or plural outputs. At a horizontal transfer speed not lower than a predetermined transfer speed, the imaging device transfers signal charges of color attributes classified by a branching section, to plural horizontal transfer paths, where the signal charges are converted into analog voltage signals, which will be output synchronously. At a horizontal transfer speed lower than the predetermined transfer speed, the analog voltage signal converted is output from, e.g. the horizontal transfer path which has been selected. Output amplifiers arranged on the horizontal transfer paths are differentiated in sensitivities in detecting signal charges, depending on color attributes of signal charges supplied, and output the analog voltage signals.

29 Claims, 57 Drawing Sheets

U.S. PATENT DOCUMENTS

| | | | |
|---|---|---|---|
| 5,652,664 A * | 7/1997 | Kusaka et al. | 358/483 |
| 6,236,434 B1 | 5/2001 | Yamada | |
| 7,027,093 B2 * | 4/2006 | Miyahara | 348/313 |
| 7,414,655 B2 * | 8/2008 | Meisenzahl et al. | 348/315 |

FOREIGN PATENT DOCUMENTS

| | | |
|---|---|---|
| JP | 5-227364 A | 9/1993 |
| JP | 5-244340 A | 9/1993 |
| JP | 7-50409 A | 2/1995 |
| JP | 7-183491 A | 7/1995 |
| JP | 8-298626 A | 11/1996 |
| JP | 10-136391 A | 5/1998 |
| JP | 11-274472 A | 10/1999 |
| JP | 2005-20275 A | 1/2005 |

OTHER PUBLICATIONS

Notification of Reason for Refusal for JP 2006-095198 mailed Nov. 2, 2010 with English translation.

* cited by examiner

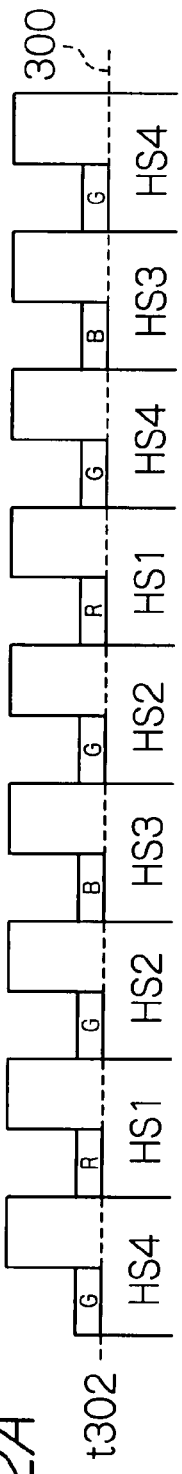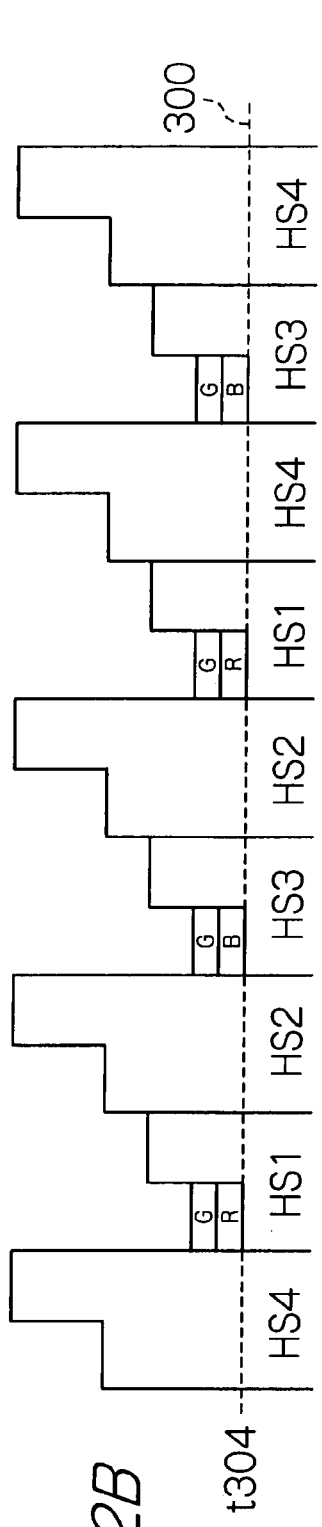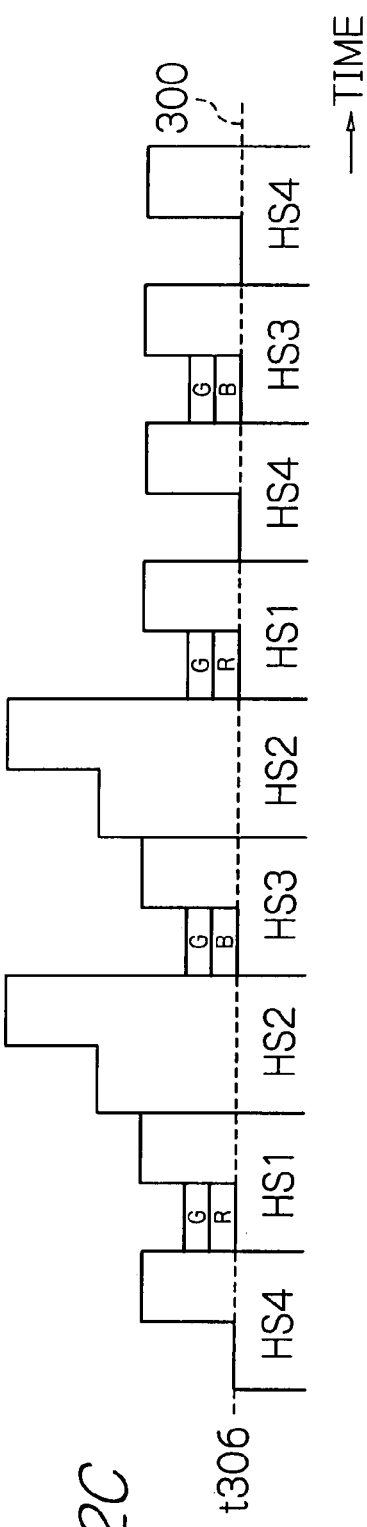

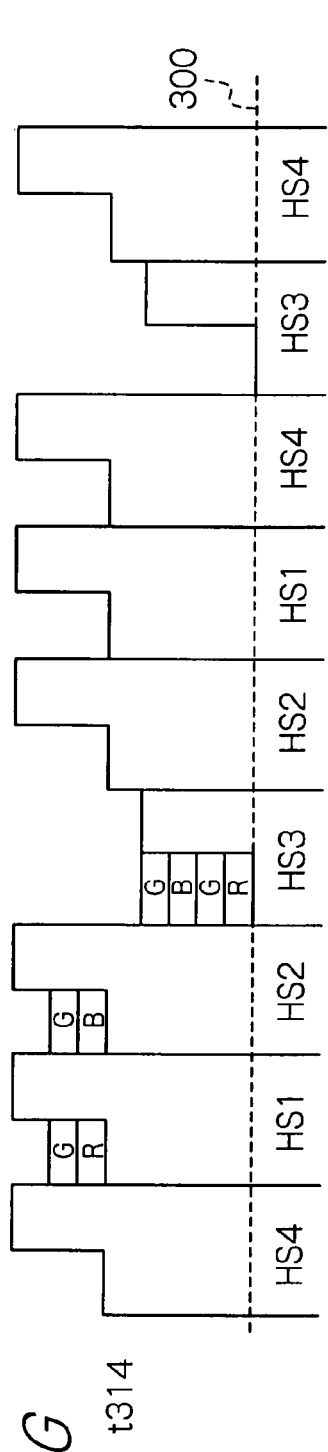
FIG. 32G  t314
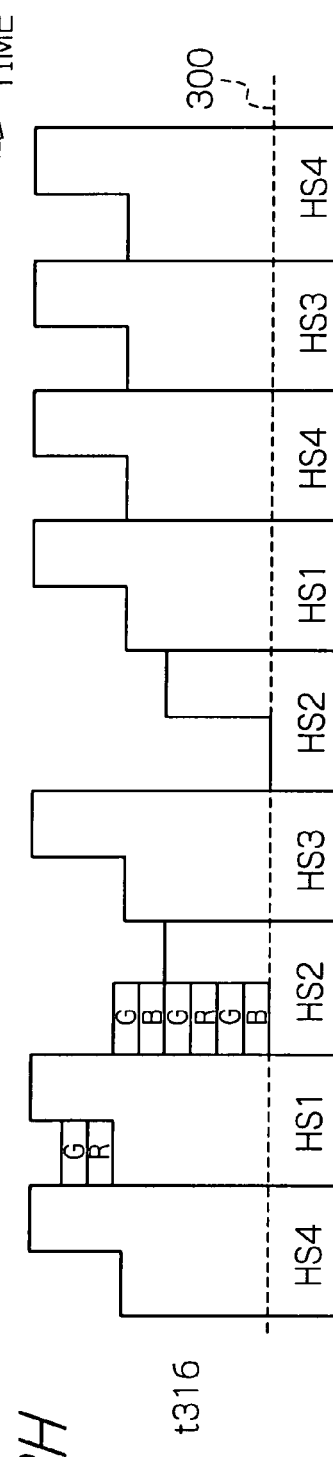
FIG. 32H  t316
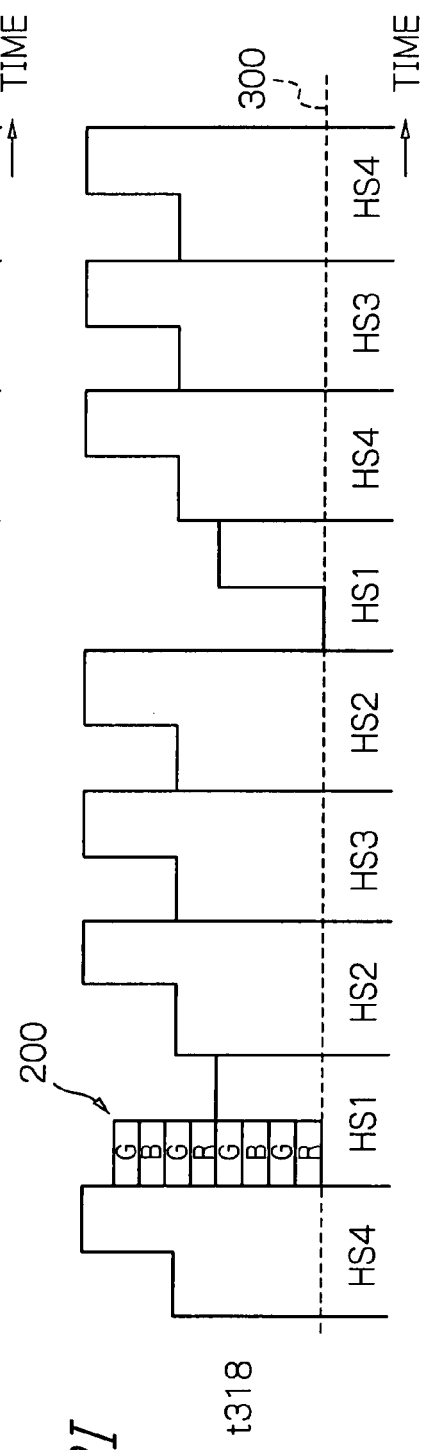
FIG. 32I  t318

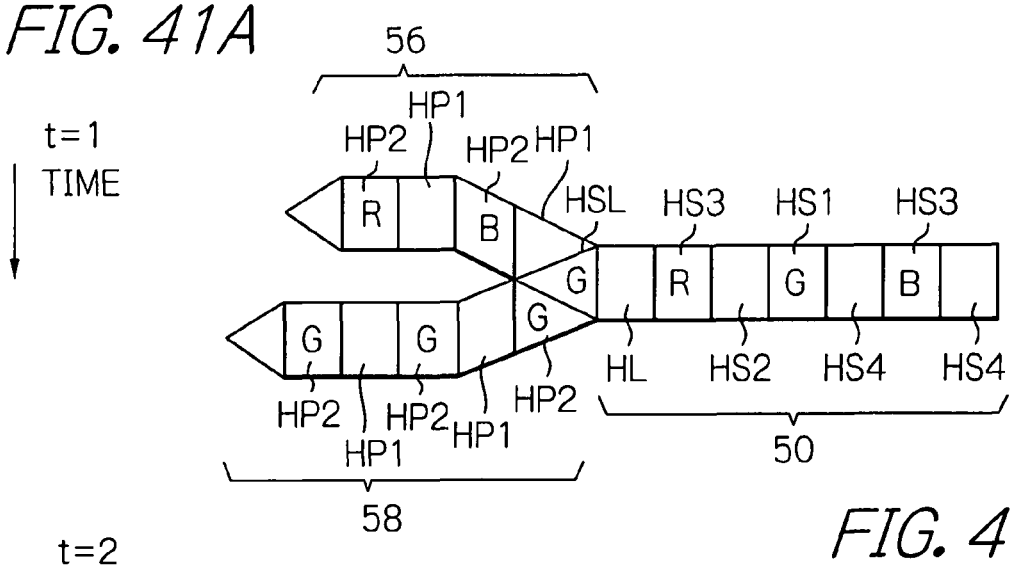
FIG. 41A
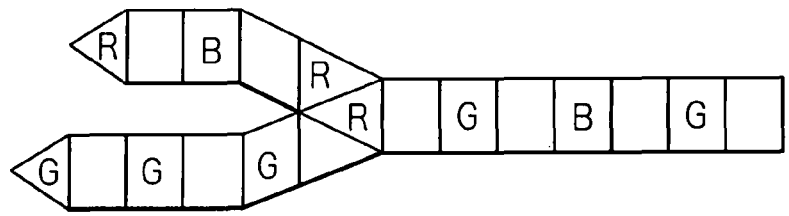
FIG. 41B
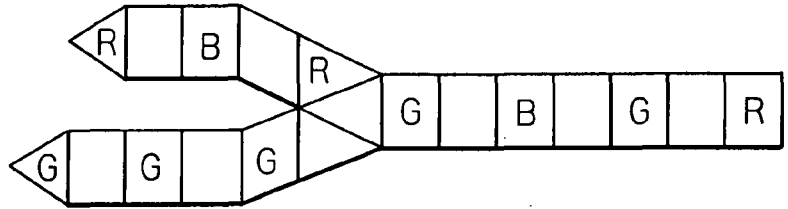
FIG. 41C
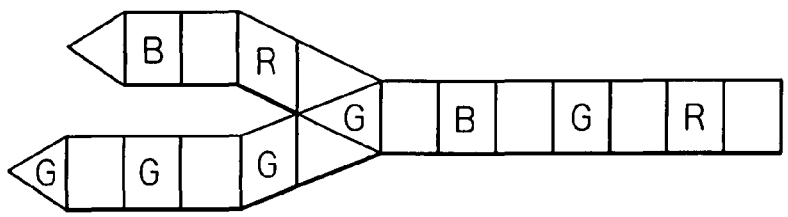
FIG. 41D
FIG. 41E

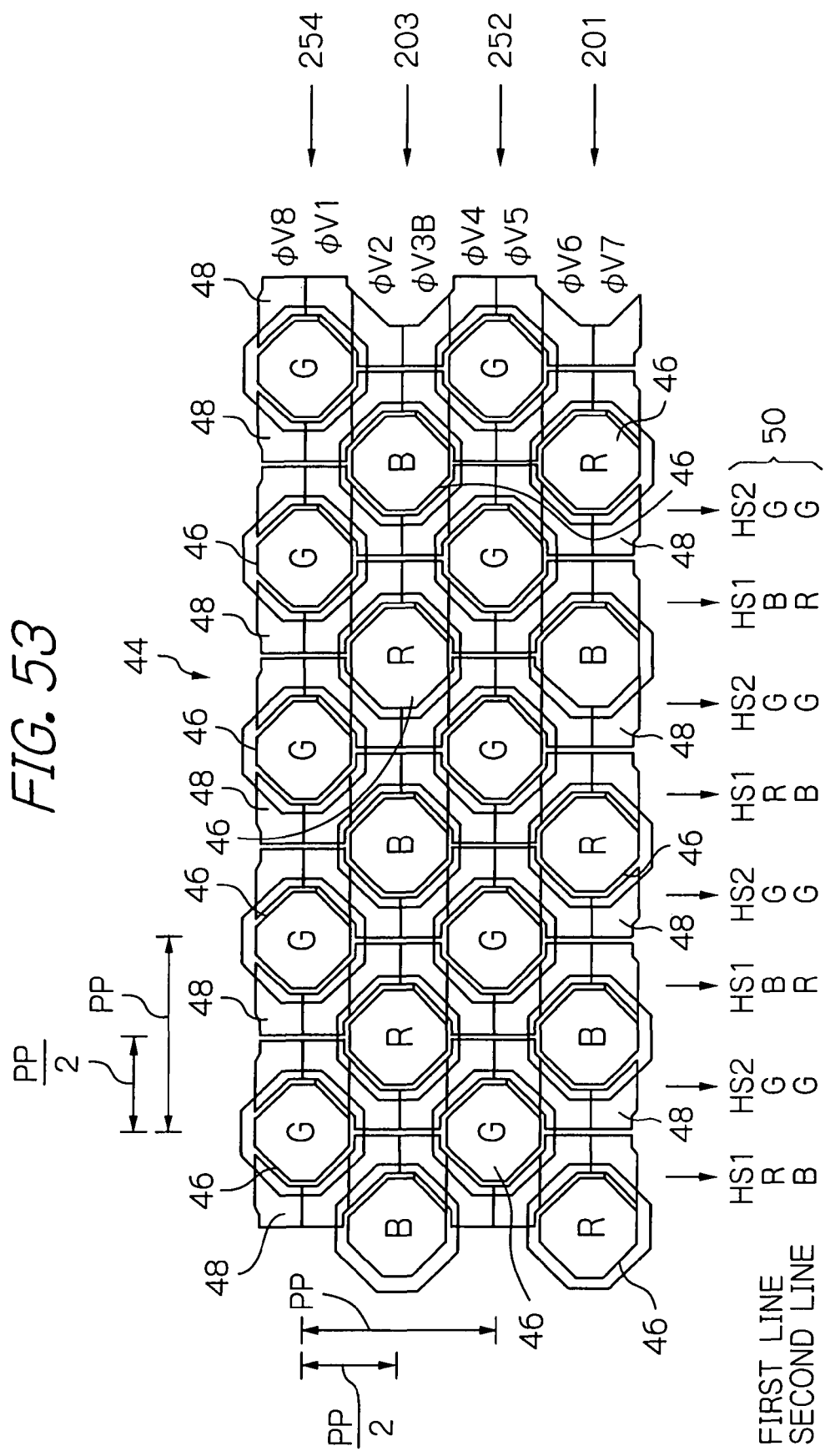

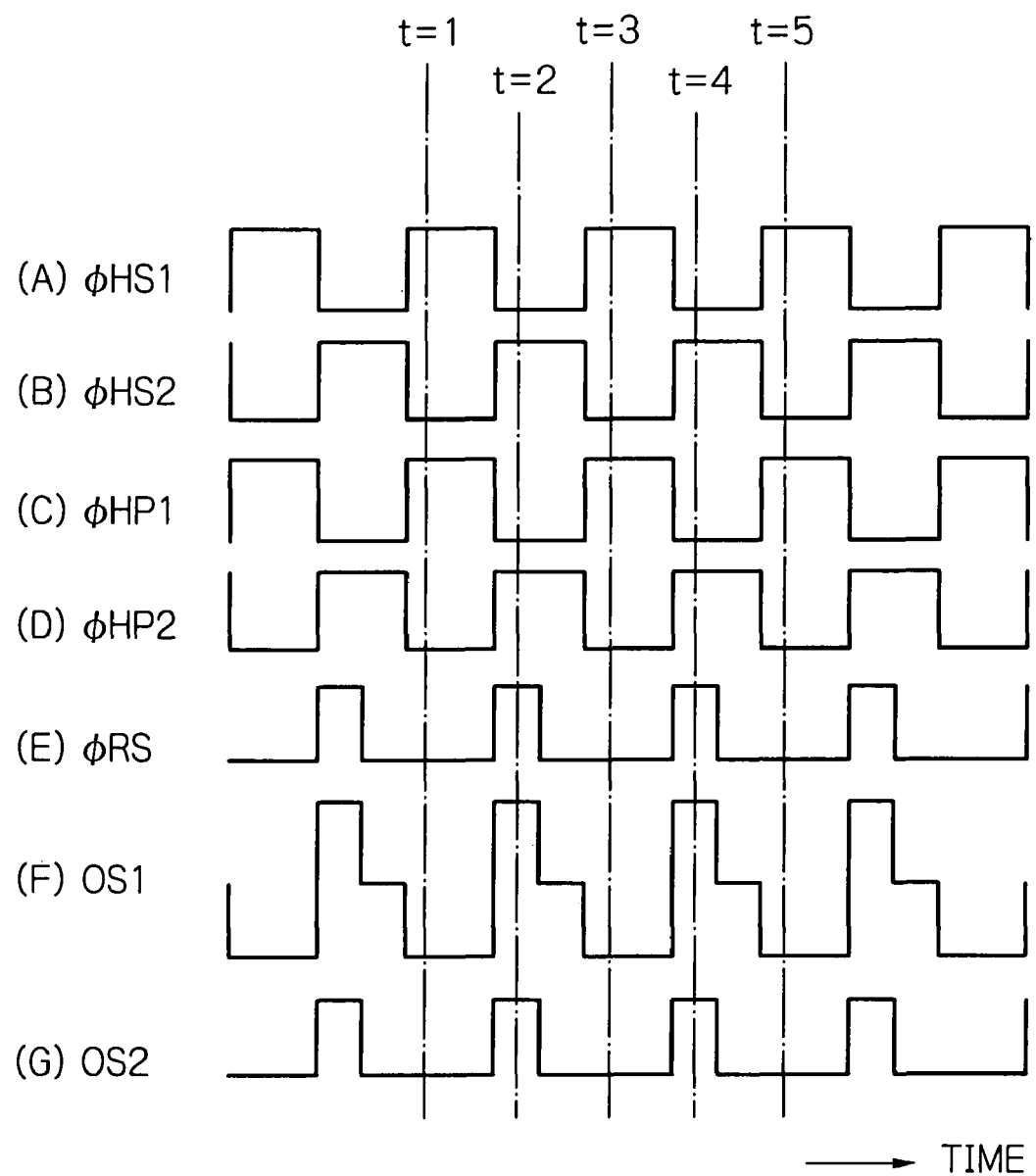

SOLID STATE IMAGING DEVICE WITH HORIZONTAL TRANSFER PATHS AND A DRIVING METHOD THEREFOR

BACKGROUND OF THE INVENTION

1. Field of the Invention

The present invention relates to a solid-state imaging device and a driving method therefor. More particularly, the present invention relates to a solid-state imaging device such as a CCD (Charge-Coupled Device) imaging device for transducing incident light into signal charges and horizontally transferring the charges to output an image signal through an output amplifier. The invention also more specifically relates to a driving method of driving the imaging device for horizontal transfer.

2. Description of the Background Art

Japanese patent laid-open publication No. 50409/1995 discloses bifurcating a sole transfer path, that is, a shift register, and providing an amplifier at the distal end of each bifurcated transfer path. Each amplifier is a floating diffusion amplifier (FDA) and differs from one another in charge detection sensitivity or charge-to-voltage conversion efficiency. When a subject being imaged is of lower luminance, the higher-efficiency amplifier outputs the output signal. This amplifier selection improves the voltage conversion efficiency for lower signal charges obtained on light reception, and raises the sensitivity. When the subject being imaged is of higher luminance, the lower-efficiency amplifier outputs the output signal. With the use of this amplifier, the image generated by the output signal is of a wider dynamic range. Another Japanese patent laid-open publication No. 298626/1996 is substantially similar to the '409 publication.

Still another Japanese patent laid-open publication No. 244340/1993 also teaches bifurcating a sole transfer path, or a shift register. However, the signal charges obtained on light reception or optical sensing are alternately switched at the bifurcating section and transferred to the respective amplifiers. The frequency of the driving pulse supplied to the transfer path not bifurcated is twice as high as the driving pulse supplied to the bifurcated transfer paths. In other words, a driving frequency one-half the usual driving frequency suffices for driving the bifurcated transfer paths. Thus, the amplifier renders it possible to raise the transfer speed as the driving frequency is maintained within the frequency band prescribed as its operating characteristics.

In the '409 and '626 publications, there is simply disclosed guiding the signal charges to a selected transfer path. The '340 publication discloses alternately outputting signal charges. If those publications are simply combined together, it would indeed be possible to output images that satisfy the requirements for high sensitivity and wide dynamic range.

In producing a color image, color attributes are allocated to the respective signal charges. However, there is neither suggestion nor disclosure as to how the signal charges are transferred and distributed to the bifurcated transfer paths from color to color. Thus, with those prior art publications combined together, it would not be possible to provide an image reduced in noise based on a white-balance gain with respect to color.

If with the conventional solid state imaging device a subject with lower color temperature, for example, is shot, then the amounts of signal charges obtained in the photosensitive cells of the imaging device are larger for red (R) pixels and smaller for blue (B) pixels. If the signal charge are horizontally transferred from the transfer path not bifurcated in the sequence of an R pixel, a first green (G1) pixel, a B pixel and a second green (G2) pixel, the amount of charges left over by the forward R pixel and mixed into the rear side G1 pixel is greater than the amount of charge mixing between the forward side B pixel and the rear side G2 pixel. Thus, the G1 and G2 pixels which are of the same color signal differ in the signal quantity, thus affecting the finished image as a fixed pattern noise.

In addition, deterioration in the transfer efficiency of signal charges is caused with the solid state imaging device in which signal charges are not branched optimally at a branching electrode such that signal charges to be sent to one of the horizontal transfer paths are intruded into the other transfer path.

More specifically, such a case is now considered in which signal charges are transferred from a sole horizontal transfer path in the sequence of a G1 pixel, an R pixel, a G2 pixel and a B pixel, and are branched at the branching electrode, signal charges of the pixels G1 and G2 are sent to one of the horizontal transfer paths and those of the pixels R and B are sent to the other transfer path. If the ambient temperature at the time of imaging is low, part of signal charges of the pixel G1 is mixed into signal charges of the pixel R.

Such deterioration in the transfer efficiency, i.e., transfer deterioration, of signal charges is caused not only when the ambient temperature at the time of imaging is low, but also when the color temperature of a subject being imaged is low or the ISO (International Organization for Standardization) sensitivity is high. In particular, in case of a subject with a low color temperature, signal charges are mixed in different quantities, even if the signal charges are of the same color. More specifically, supposing that signal charges of pixels G1, R, G2 and B obtained on imaging a subject of a low color temperature are transferred in that order, the signal charges are mixed in the pixel R from the pixel G1 in larger quantity than the quantity of the signal charges mixed from the pixel G2 into the pixel B. The result is that signal quantities of the pixels R and B become different from each other, with the difference in signal quantity then being visualized as noise in the image.

In the meantime, in those prior art publications, there is neither suggestion nor disclosure as to the sequence of readout of color signals or as to how signal charges are to be split to the branched transfer paths depending on the colors. It is noted that, if the branching section receives signals of different colors, and cannot correctly transfer the signal charges to the branches, part of those signals of different colors may be mixed with each other on the branches.

SUMMARY OF THE INVENTION

It is an object of the present invention to provide a solid state imaging device and a driving method therefor with which it is possible to branch signal charges to output the so branched signal charges on either one or plural paths, as well as to achieve the noise reduction based on the white balance gain.

It is another object of the present invention to provide a solid state imaging device and a driving method therefor in which the ill effect of transfer deterioration ascribable to the bifurcation may be moderated even with the use of an imaging device having its horizontal transfer path bifurcated partway to output signal charges in either one or plural paths, thereby enabling an optimum image to be produced.

It is still another object of the present invention to provide a driving method for a solid state imaging device which is free from deterioration in the transfer efficiency at the branching electrode and is capable of producing an optimal image, as well as to provide a driving method for use in an imaging apparatus including the solid state imaging device.

It is yet another object of the present invention to provide a solid state imaging apparatus and an imaging method, in which, even in case the branching section cannot correctly transfer signal charges, signal mixing between different colors is minimized.

In accordance with the present invention, there is provided a solid state imaging device including a two-dimensional array of photosensitive cells, a first horizontal transfer circuit for transferring signal charges, a branching circuit, a plurality of second horizontal transfer circuits, and a plurality of output circuits. The photosensitive cells are supplied with incident light from a field being imaged, via color filter segments adapted for color separating the incident light. The photosensitive cells operate for transducing the light transmitted through the color filter segments into electrical signals depending on the volume of transmitted light. The first horizontal transfer circuit operate for transferring signal charges having color attributes, read out from each of the photosensitive cells and transferred in a vertical direction, in a horizontal direction perpendicular to the vertical direction. The branching circuit is arranged adjacent to an output end of the first horizontal transfer circuit for transiently holding the signal charges transferred and for distributing the signal charges to a plurality of output destinations related with the color attributes of the signal charges. The second horizontal transfer circuits are connected to the branching circuit as branching destinations. The output circuits are each provided at an output end of each of the second horizontal transfer circuits. The output circuits each operate for converting the signal charges into an analog voltage signal responsive to detection of the signal charges to amplify the analog voltage signal. The signal charges supplied to the branching circuit at a horizontal transfer speed during horizontal transfer not lower than a predetermined transfer speed are classified depending on the color attributes and transferred to each of the second horizontal transfer circuits. The signal charges supplied from the output circuits are converted into analog voltage signals which are output. The analog voltage signals are output from selected horizontal transfer circuit with transfer at a horizontal transfer speed lower than the predetermined transfer speed. The plural output circuits exhibit differential detection sensitivities for the signal charges depending on the color attributes of the signal charges supplied. The output circuits output the analog voltage signals.

With the solid state imaging device according to the present invention, signal charges of the color attributes, classified in the branching circuit, are transferred to each of a plural number of horizontal transfer means for horizontal transfer with a horizontal transfer speed not lower than a predetermined speed. The analog voltage signals, converted from the signal charges, are output. For horizontal transfer with the horizontal transfer speed lower than the predetermined transfer speed, the analog voltage signals converted from the signal charges are output from the selected horizontal transfer circuit. As each of the output circuits associated with plural horizontal transfer means has differential sensitivities in detecting the signal charges, depending on the color attributes of the signal charges supplied thereto, it is possible to modulate the sensitivities of the red and blue signals with respect to those of the green signals to suppress unneeded gain and hence reduce the noise.

In accordance with the present invention, there is also provided a method for driving a solid state imaging device for transferring signal charges having color attributes. The solid state imaging device includes a plurality of vertical transfer circuits and horizontal transfer circuit. The vertical transfer circuits operate for reading out signal charges having color attributes from each of photosensitive cells each adapted for transducing incident light into an electrical signal. The vertical transfer circuits transfer the read-out signal charges having the color attributes, in the vertical direction. The horizontal transfer circuit transfers the signal charges transferred from the vertical transfer circuits, in the horizontal direction. The solid state imaging device also includes a plurality of horizontal transfer circuits branched from a transfer region adapted for branching signal charges from the horizontal transfer circuit having color attributes. The plural horizontal transfer circuits exhibit differential detection sensitivities to signal charges having the color attributes. The method comprises classifying the signal charges, supplied to the branching transfer region with high speed driving with the horizontal transfer speed not less than a predetermined transfer speed, according to the color attributes, sending the signal charges of the color attributes on each of the plural horizontal transfer circuits, converting the signal charges of the color attributes into analog voltage signals, outputting the analog voltage signals, outputting the analog voltage signals from selected horizontal transfer circuit with low speed driving at a horizontal transfer speed lower than the predetermined transfer speed, and adjusting the branched output destination of the signal charges having color attributes by changing the phase of a driving pattern in horizontal transfer, before branching, with respect to the driving in at least one branched horizontal transfer.

With the method for driving the solid state imaging device, the plural horizontal transfer circuits exhibit differential detection sensitivities to signal charges having the color attributes. The branched output destination of the signal charges having color attributes may be adjusted by changing the phase of a driving pattern in horizontal transfer, before branching, with respect to the driving in at least one branched horizontal transfer. This renders it possible to freely change the sensitivity in charge detection for signal charges supplied and to set the gain flexibly in keeping with imaging conditions on hand. In this manner, data of high accuracy may be obtained to provide a high-quality image.

In accordance with the present invention, there is also provided a solid state imaging apparatus including a solid state imaging device. The solid state imaging device includes a plurality of photosensitive cells, a plurality of color filter segments, a vertical transfer circuit, a first horizontal transfer circuit, a branching circuit, second and third transfer circuits and first and second output circuits. The photosensitive cells are arrayed in a matrix of rows and columns for photo-electrically transducing incident light from a field being imaged into signal charges. The color filter segments are arranged in register with the photosensitive cells for color separating the incident light into plural colors to cause the light of the plural colors to be incident on the photosensitive cells. The vertical transfer circuit operates for vertically transferring the signal charges read out from the photosensitive cells. The first horizontal transfer circuit operates for receiving the signal charges vertically transferred from the vertical transfer circuit to transfer the received signal charges horizontally. The branching circuit is arranged at an output end of the first horizontal transfer circuit for distributing the horizontally transferred signal charges to an optional one of a plurality of output destinations. The second and third transfer circuits are adapted for receiving the signal charges distributed from the branching circuit to further horizontally transfer the signal charges. The first and second output circuits are arranged at output ends of the second and third transfer circuits, respectively. The solid state imaging apparatus comprises transfer efficiency measuring means for measuring the transfer efficiency on the second and third transfer circuits in the course of transfer of the signal charges from the branching circuit through the second and third transfer circuits to the first and second output circuits. The driving start time of a first drive signal for driving the first horizontal transfer circuit or a second drive signal for driving the second and third horizontal transfer circuits is changed depending on the result of measurement by the transfer efficiency measuring circuit. One of the second and third horizontal transfer circuits is preferentially used to transfer the signal charges.

Thus, with the solid state imaging apparatus according to the present invention, when the signal charges obtained by the imaging unit from the photosensitive cells, during high speed driving, are transferred via a plural number of vertical transfer paths to a first horizontal transfer path, and the signal charges horizontally transferred from the first horizontal transfer path are branched and transferred to the second and third horizontal transfer paths, the phase of the horizontal timing signal controlling the driving of the horizontal transfer path of the imaging unit is offset from that of the initial driving condition, depending on the results of measurement by the transfer efficiency measurement unit. By so doing, it is possible to interchange the signal charges transferred to the second horizontal transfer path and those transferred to the third horizontal transfer path, by way of reversing the branching.

Moreover, with the solid state imaging apparatus according to the present invention, signal charges of red and blue pixels are transferred on one of the second and third horizontal transfer paths which has a higher transfer efficiency, during high speed driving, while those of green pixels are transferred on the remaining horizontal transfer path. By so doing, the quantity of residual transfer charges from the red and blue pixels to the green pixels may be reduced to provide for an optimum image.

With the solid state imaging apparatus according to the present invention, all signal charges are transferred during low speed driving to the second or third horizontal transfer paths which has a higher transfer efficiency, depending on the results of measurement by the transfer efficiency measurement unit. By so doing, the quantity of residual transfer charges of the pixels may be decreased to moderate any adverse effect of transfer deterioration of the entire image to provide for an optimum image.

Furthermore, with the solid state imaging apparatus according to the present invention, the imaging unit switches between the output destinations of the second and third horizontal transfer paths, depending on the transfer efficiency. By so doing, there is no necessity of changing the wiring of the external circuit of the imaging unit even if the output site of the color signals is changed between the second and third horizontal transfer paths.

In accordance with the present invention, for accomplishing the above other object of the present invention, the duty cycle and/or the period of the drive signal driving the transfer circuit before branching, which is an electrode directly upstream of the branch electrode in the solid state imaging device, is changed, or the duty cycle and/or the period of the drive signal driving the horizontal transfer path transferring branched signal charges signal charges is changed, in order to provide for transfer time for signal charges from the electrode before branching to the branch electrode longer than the usual transfer time, or for transfer time from the branch electrode to the horizontal transfer path transferring branched signal charges longer than the usual transfer time.

In more detail, attention is directed in the present invention to the fact that, if part of signal charges of red and blue pixels is intruded into signal charges of the green pixels, the result is the noise represented on the image. Thus, the transfer time of signal charges of red and blue pixels to the branch electrode from the electrode before branching or the transfer time of transfer to the horizontal transfer path of branched signal charges of red and blue pixels from the branch electrode, is set so as to be longer than the usual value.

The usual transfer time is the transfer time prior to changing the duty cycle or the period of the drive signal, that is, the transfer time in which no transfer efficiency deterioration has occurred, viz, the transfer time in which the transfer efficiency is maintained. Meanwhile, the duty cycle is the temporal relation between the periodically alternating high and low levels, and specifically is the ratio of the high level time of a signal in a signal period, or a duty ratio.

By providing for the transfer time during transfer of the signal charges of the red and blue pixels longer than the usual transfer time, it is possible to secure sufficient shifting of the signal charges. Hence, it is possible to prevent part of the signal charges of red and blue pixels from being left over and mixing into the signal charges of the green pixel.

The processing for providing for the transfer time longer than the usual transfer time may be changed in dependence upon the temperature, color temperature of the subject, sensitivity or the rate of reading out electrical signals. How much the duty cycle or the period is to be changed may be found by calculating the transfer efficiency, which transfer efficiency may be calculated using a reference signal charge.

According to the present invention, it is possible to prevent deterioration of the transfer efficiency in the branch electrode and to obtain an optimum image free of noise.

In accordance with the present invention there is also provided a solid state imaging apparatus comprising a color filter, a plurality of photosensitive cells, a first transfer circuit, a second transfer circuit, a branching circuit, a plurality of third transfer circuits, and output circuits. The color filter operates for color separating the incident light from a field being viewed into a plurality of colors. The photosensitive cells operate for photo-electrically transducing the light transmitted through the color filter. The photosensitive cells are arranged in register with the colors. The first transfer circuit operates for transferring signal charges readout from the photosensitive cells in a first direction. The second transfer circuit operates for transferring signal charges read out from the first transfer means in a second direction. The branching circuit is arranged at an output end of the second transfer circuit for distributing the signal charges transferred to a plurality of output destinations. The third transfer circuits are connected as the output destinations to the branching circuit, and the output circuits are connected to an output end of the third transfer circuits. The plural colors are divided into a plurality of groups. The second transfer circuit, the branching circuit and the third transfer circuits transfer signal charges read out from the photosensitive cells related with colors of the same group, and subsequently transfer signal charges read out from the photosensitive cells related with colors of a different group or groups.

According to the present invention, in case the second transfer circuit, for example, the horizontal transfer path, is branched partway, outputting is to be made at plural output parts, and the colors belonging to different groups, for example, red (R) and blue (B) on one hand and green (G) on the other hand, may be read out in a state completely isolated from each other. For example, in transferring G signals and RB signals contained in the same line or field, it is possible to transfer the G signals contained in a given line or field, and subsequently to transfer the RB signals contained in the same line or field. That is, the G signals and the RB signals contained in the same line or field, may be separately read out as if these G signals and RB signals belong to a distinct line of field.

Hence, there is no fear that different colors alternately pass through the branching circuit, so that it is possible to prevent G signals from mixing into R and B signals or to prevent R and B signals from mixing into the G signals, so as to provide an image in an optimum state. The reason signal mixing is likely to be produced in branching circuit is that it is necessary for the branching circuit to be able to transfer signal charges in plural directions and hence is larger in size or of a special profile other than a square with the result that signal charges cannot be transferred unobjectionably. For example, it may occur that the signal at a terminal part of branching circuit cannot be transferred.

According to the present invention, the signal charges transferred in a lump as belonging to the same group are not necessarily the signal charges of one line or field, and may be signal charges of more or less than one line or field. A plural number of lines or fields, one frame, a plural number of frames or one-half line of signal charges may be transferred in a lump.

In the present invention, if the plural colors are three colors of red, green and blue, it is preferred to provide two groups, namely a group of red and blue and a group of green. The reason is that, even though signal mixing occurs between red and blue, this state can be corrected rather easily.

If there are plural colors belonging to one of the groups, the signal charges read out from the photosensitive cells related with the respective colors are preferably transferred from color to color using specified one of third transfer circuits. Since output circuits are determined from color to color, it is possible to prevent differential intensities (step differences) between the same colors ascribable to individual differences of the output parts.

In case signal charges are transferred using a plural number of third transfer circuits, it is preferred to use correction circuit for correcting the difference in characteristics between the plural output circuits in order to correct the difference in characteristics between the plural output circuits. This corrects the step difference of colors ascribable to individual differences of the output parts.

The present invention may be applied to an imaging method not exploiting branching circuit. That is, the present invention may be applied to an imaging method comprising color-separating incident light from a field being imaged by a color filter, photo-electrically transducing the light transmitted through the color filter by a plurality of photosensitive cells related with the colors, transferring signal charges read out from the photosensitive cells by first transfer circuit in a first direction, transferring the signal charges transferred by the first transfer circuit, by second transfer means in a second direction, and outputting signal charges via output circuits arranged at an output end of the second transfer circuit. The plural colors are divided into a plurality of groups. The second transfer circuit transfers the signal charges read out from the photosensitive cells related with the color belonging to the same group, and subsequently transfer signal charges read out from the photosensitive cells related with the color belonging to the different group.

According to the present invention, there may be provided a solid state imaging method and apparatus in which signal mixing may not be produced among different colors even in case branching circuit cannot unobjectionably transfer signal charges.

BRIEF DESCRIPTION OF THE DRAWINGS

The objects and features of the present invention will become more apparent from consideration of the following detailed description taken in conjunction with the accompanying drawings in which:

FIGS. 32A through 32I showing how the potential level changes which is formed in the respective transfer elements by horizontal pixel mixing on the horizontal transfer path before branching in the device of FIG. 1;

FIGS. 41A to 41E schematically show the state of transfer of signal charges on the horizontal transfer path in FIG. 35;

FIG. 53 is a partial plan view of an array of offset pixels and color filter segments as applied to the device of FIG. 1;

FIG. 62 is a timing chart showing the timing of drive signals supplied to the electrodes of FIG. 55 on transferring the signal charge G;

FIGS. 63A through 64B schematically show the potential level generated on applying the drive signal shown in FIG. 62;

DESCRIPTION OF THE PREFERRED EMBODIMENTS

Figure 1:
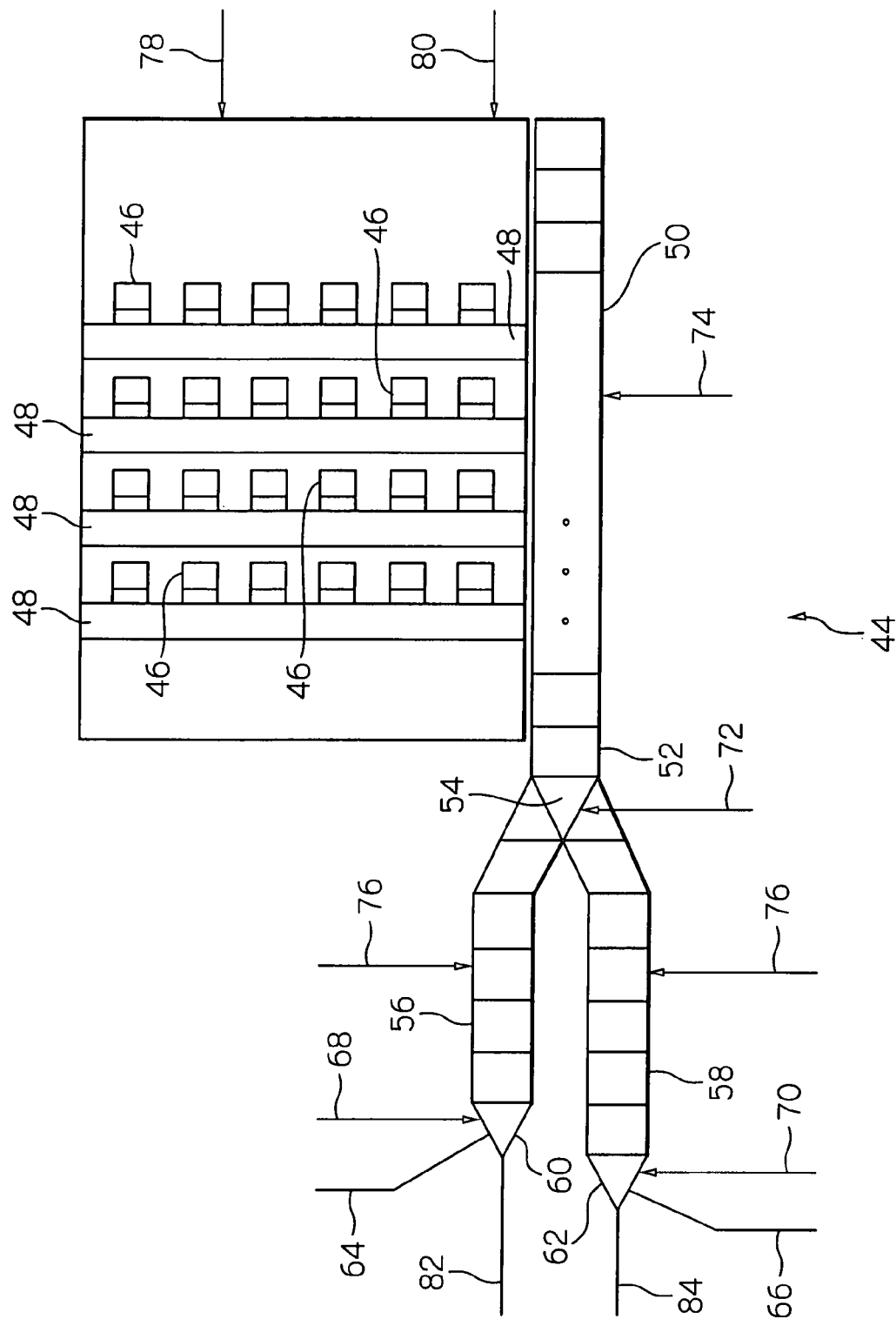
FIG. 1 is a schematic block diagram showing a preferred embodiment of a two-line readout CCD implemented as a solid state imaging device according to the present invention.

A solid state imaging device according to the present invention will now be described with reference to the accompanying drawings. With reference to FIG. 1, in a preferred embodiment of a solid state imaging device 44, signal charges of attributes of colors classified by a branching section 54 are transferred with a horizontal transfer speed or rate higher than a predetermined transfer speed, on both of the horizontal transfer paths 56 and 58, and converted analog voltage signals 82 and 84 are output simultaneously. For transfer with a horizontal transfer speed lower than the predetermined transfer speed, the converted analog voltage signal 82 is output from the selected horizontal transfer path, such as path 56. The output amplifiers 60 and 62 arranged on plural, e.g. two, horizontal transfer paths 82 and 84 exhibit differential sensitivities for signal charge detection, depending on the attributes of colors of signal charges supplied. By outputting the analog voltage signals 82 and 84 under this condition, it is possible to modulate the sensitivity of red and blue signals with respect to the green color to suppress unneeded gain to suppress noise.

In the present embodiment, the solid state imaging device of the present invention is applied to a digital camera 10. The parts or components not directly pertinent to understanding the present invention are not shown nor described.

Figure 2:
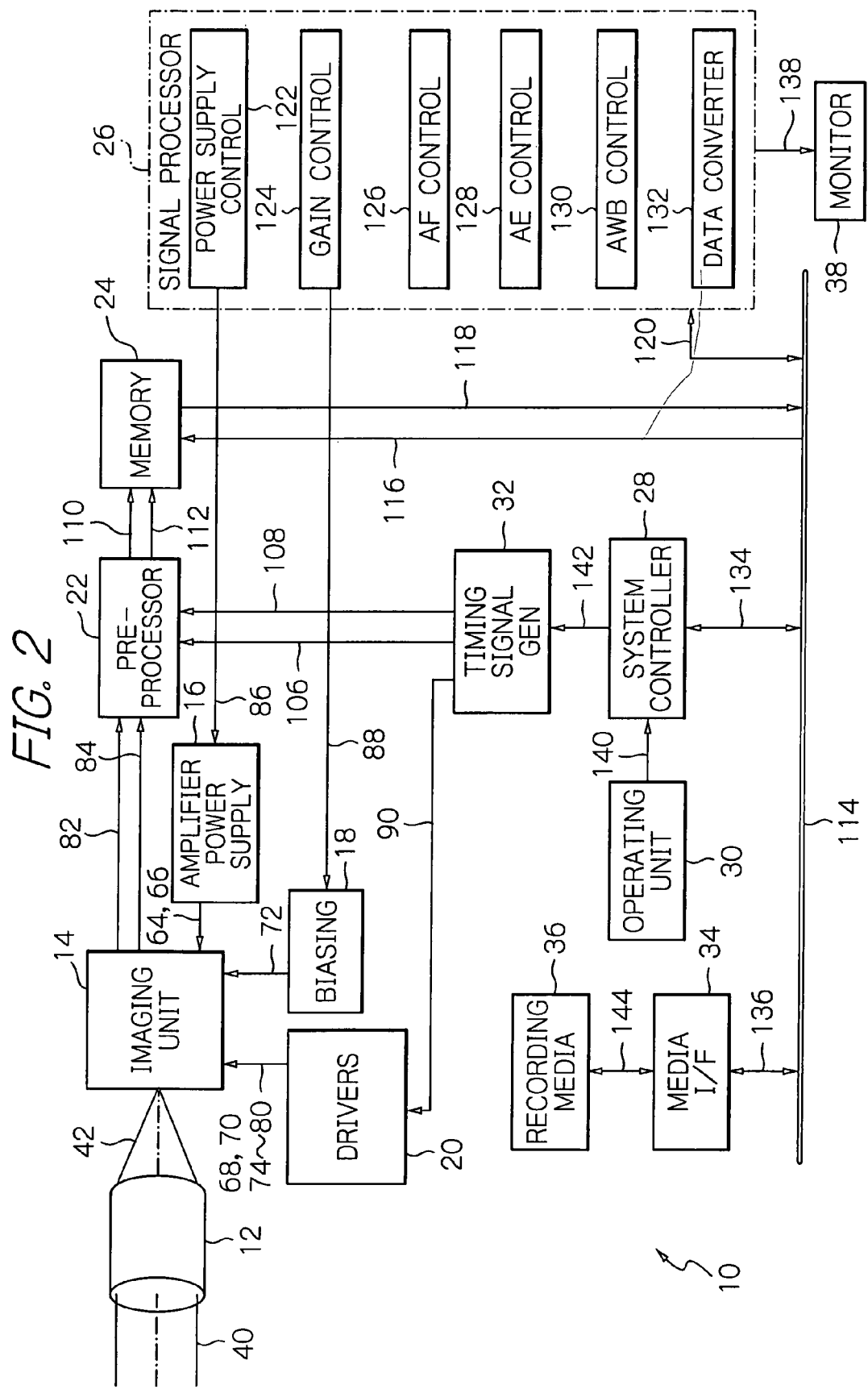
FIG. 2 is a schematic block diagram showing a preferred embodiment of a digital camera employing the solid state imaging device of FIG. 1.

Referring to FIG. 2, the digital camera 10 includes an optical system 12, an imaging unit 14, an amplifier power supply 16, a biasing circuit 18, drivers 20, a pre-processor 22, a memory 24, a signal processor 26, a system controller 28, an operating unit 30, a timing signal generator 32, a media interface (I/F) circuit 34, media 36 and a monitor display 38, which are interconnected as illustrated.

The optical system 12 has an automatic focusing (AF) function of receiving incident light 40 from a field being imaged to focus an image of the field on the imaging surface of the imaging unit 14 responsive to an operation from the operating unit 30. The optical system 12 adjusts the angle of view or focal length, responsive to a zooming operation or a half-stroke depression of a shutter release button, not shown, on the operating unit 30. The optical system 12 also has the function of adjusting the diaphragm or iris stop for the incident light 40 to a value in keeping with the manipulation on the operating unit 30 in the imaging unit 14. The optical system 12 adjusts the incident light 40 to a light beam 42 based on these functions to focus the light beam 42 onto the imaging unit 14.

Figure 14:
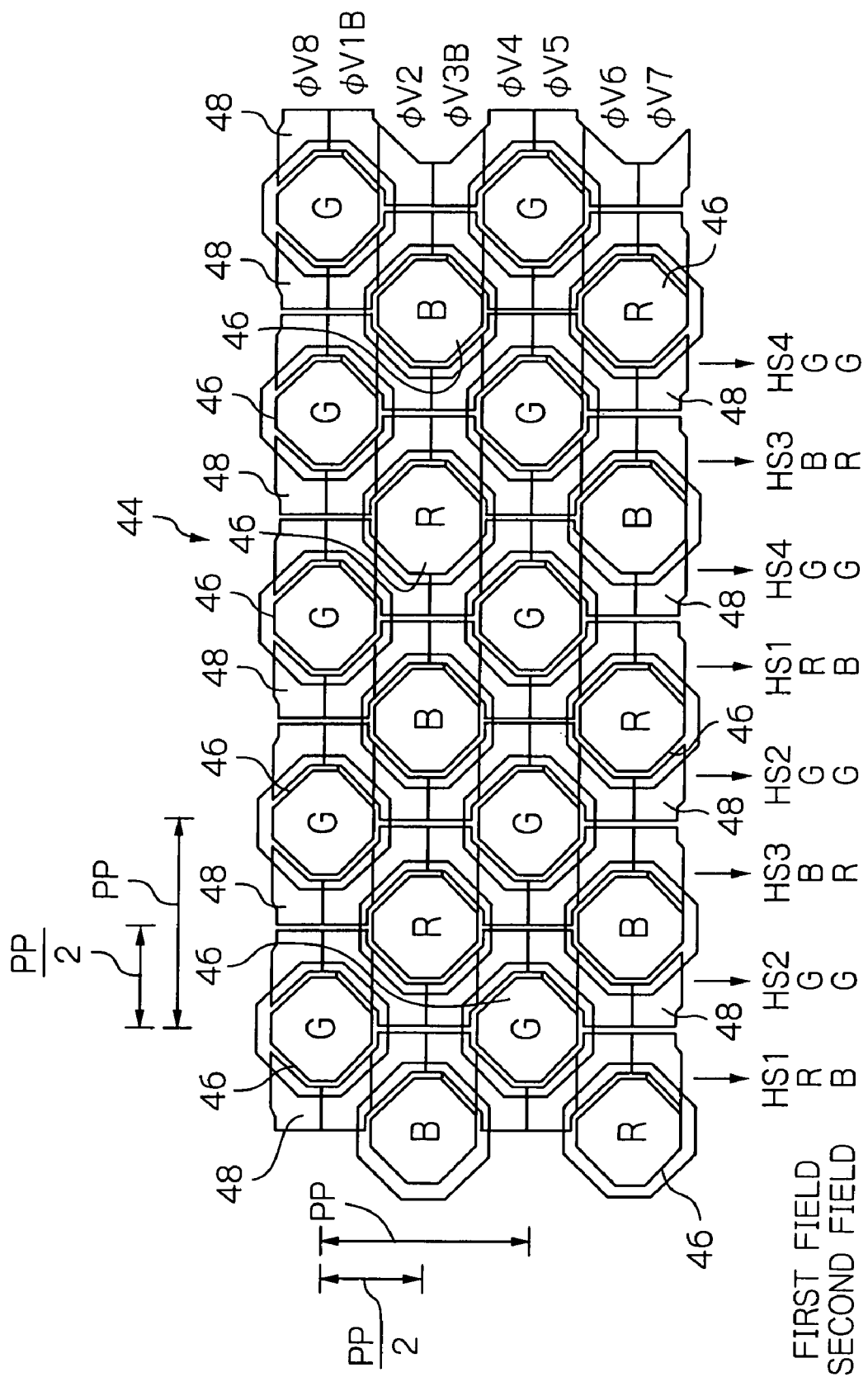
FIG. 14 is a partial plan view of an array of offset pixels and color filter segments in the solid state imaging device of FIG. 1.

The imaging unit 14 includes a solid state imaging device 44, which is implemented by a charge-coupled device (CCD) shown in FIG. 1 with the illustrative embodiment. The imaging device 44 includes color filter segments, as shown in FIG. 14, arranged in the incoming direction of the incident light beam 42 according to the mounting positions of photosensitive cells. The device 44 has the function of color-separating the incident light beam 42, converting the light of the color components resulting from the color separation into signal charges by photosensitive cells 46 and outputting corresponding electrical signals. The device 44 reads out signal charge accumulated in proportion to light exposure, to a vertical transfer path 48 for transferring sequentially in the vertical direction. The device 44 includes a horizontal transfer path 50 extending in a direction substantially perpendicular to the vertical transfer path 48. The signal charges, transmitted vertically, are supplied to the horizontal transfer path 50.

The horizontal transfer path 50 of the present embodiment has its output end 52 including a branching section 54. From the branching section 54, there are formed horizontal transfer paths 56 and 58 in a branching fashion. Separate output amplifiers 60 and 62 are provided at output ends of the horizontal transfer paths 56 and 58, respectively. The output amplifiers 60 and 62 are floating diffusion amplifiers having the function of converting signal charges into a corresponding analog voltage signal. To the output amplifiers 60 and 62 are connected power supply lines 64 and 66, respectively. The power supply lines 64 and 66 are connected independently from the power supply 16. The output amplifiers 60 and 62 are supplied from the drivers 20 with reset signals 68 and 70, respectively. The output amplifiers 60 and 62 thus supplied with the reset signals may run independently. In the description to follow, signals are denoted by reference numerals of connection lines on which they appear.

The branching section 54 is supplied with a bias signal 72 from the biasing circuit 18. With the bias signal thus supplied, the signal charges from the horizontal transfer path 50 are branched to the horizontal transfer path 56 or 58. A horizontal drive signal 74 is supplied to the horizontal transfer path 50, while a horizontal drive signal 76 is supplied to each of the horizontal transfer paths 56 and 58. The horizontal drive signal 76 has a frequency equal to, for example, one half the frequency of the horizontal drive signal 74. By driving the horizontal transfer paths 56 and 58 in this manner, high speed readout may be enabled even though the design frequency ranges of the output amplifiers 60 and 62 are halved. The device 44 is also supplied with an overflow drain (OFD) pulse 78 and with a vertical drive signal 80.

In this manner, the device 44 outputs two channels of output signals 82 and 84 from the output amplifiers 60 and 62, respectively to the pre-processor 22. The horizontal transfer in the device 44 will be described in detail subsequently.

Reverting to FIG. 2, the amplifier power supply 16 has the function of supplying the supply power to the output amplifiers 60 and 62 arranged in the device 44. The amplifier power supply 16 supplies the supply power depending on whether the device 44 is to supply a one-channel output or a two-channel output. This power supply is controlled by a control signal 86 supplied from the signal processor 26 to the amplifier power supply 16.

The biasing circuit 18 has the function of supplying a bias signal 72 to the branching section 54. The bias signal 72 is applied as a bias voltage which prescribes the gain. The biasing circuit 18 is controlled by a control signal 88 supplied from the signal processor 26.

Figure 3:
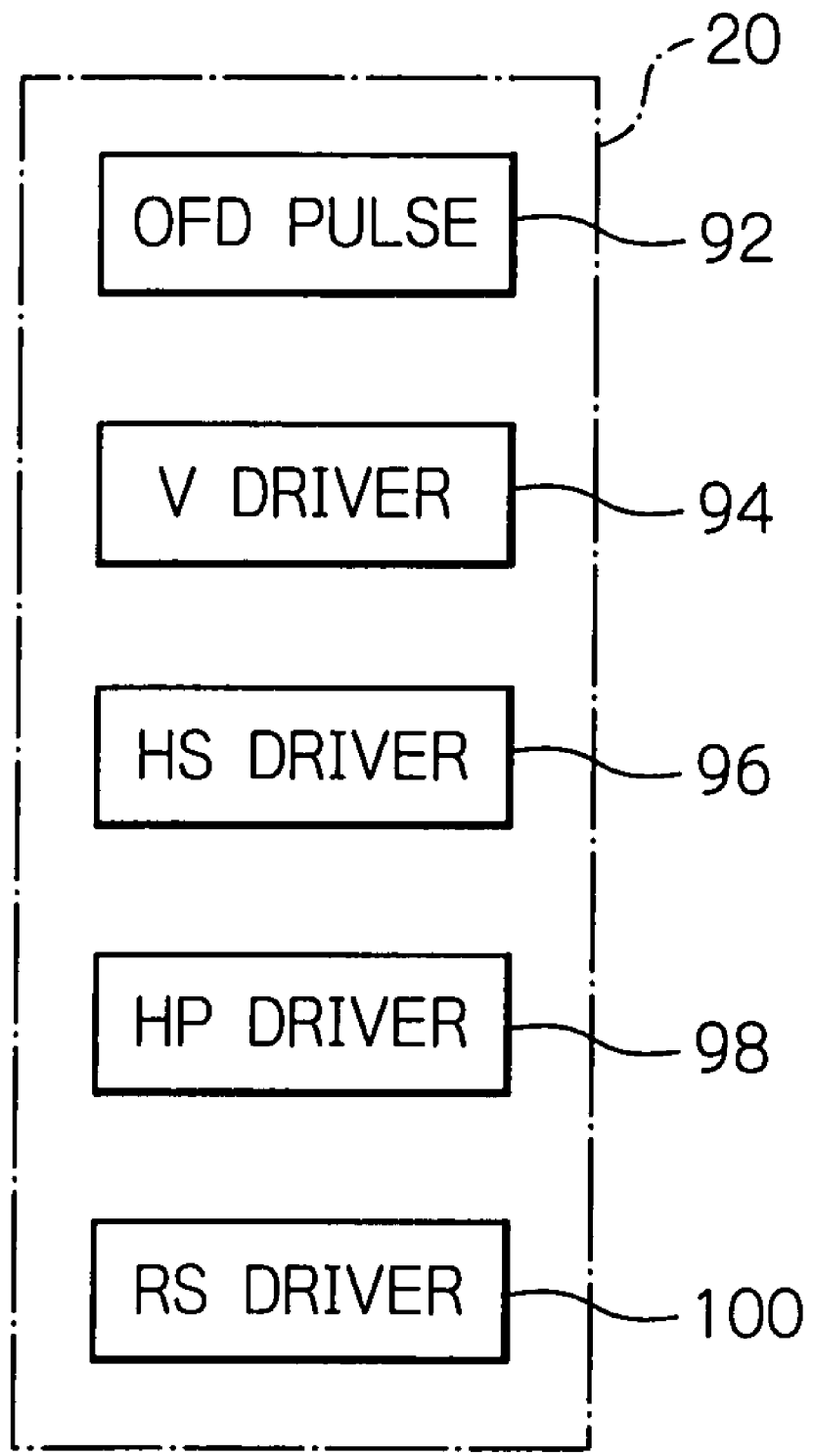
FIG. 3 is a schematic block diagram showing drivers shown in FIG. 2.

The drivers 20 have the function of supplying a variety of drive signals for driving the device 44. The drivers 20 are supplied with plural timing signals 90 from the timing signal generator 32. The drivers include an OFD pulse output circuit 92, a vertical (V) driver 94, a horizontal series (HS) driver 96, a horizontal parallel (HP) driver 98, and a reset (RS) driver 100, as shown in FIG. 3. The OFD pulse output circuit 92 outputs an OFD pulse 78 to the device 44. The V driver 94, HS driver 96 and HP driver 98 output a vertical drive signal 80, the horizontal drive signal 74 and the horizontal drive signals 76 to the device 44, respectively. The horizontal drive signal 76 has a period double that of the horizontal drive signals 74. The RS driver 100 outputs the reset signals 68, 70 to the device 44.

Reverting to FIG. 2, the pre-processor 22 has an analog front-end (AFE) function. This function removes the noise by correlated double sampling (CDS) for the analog electrical signals 82, 84 supplied, while digitizing the noise-free analog electrical signals by analog-to-digital (A/D) conversion. The pre-processor 22 is supplied from the timing signal generator 32 with a timing signal or with sampling signals 106 and 108 for performing pre-processing on the input signals of respective channels for noise removal and A/D conversion. It is noted that two channels of analog electrical signals 82 and 84 are supplied to the pre-processor 22. In case only one of the two channels is supplied with an input, and one of the sampling signals 106 and 108 for the input channel is supplied for the sole channel thus receiving the input, it may be sufficient to activate only one channel of the operation of the CDS sampling and A/D conversion, thereby reducing power consumption. The pre-processor 22 is responsive to the supply of the sampling signals 106 and 108 to output one or two of channels of digital signals 110 and 112 to the memory 24.

The memory 24 has the function of temporarily storing the digital signals 110 and 112 supplied and outputting the stored signals. Specifically, a line memory is provided for each channel in the memory 24. The memory 24 has its input and output controlled by a control signal 116 supplied over a bus 114. The memory 24 is responsive to the control signal 116 to output the input digital signals 110 and 112 as a digital signal 118 over the bus 114 and signal line 120 to the signal processor 26.

The signal processor 26 has the function of processing the digital signal 118 supplied to generate a control signal. The signal processor 26 includes a power supply control 122, a gain control 124, an AF control 126, an automatic exposure (AE) control 128, an automatic white balance (AWB) control 130 and an data converter 132. The power supply control 122 has the function of generating a control signal 86 depending on high speed readout or low speed readout, based on, for example, scene discrimination in the system controller 28. The power supply control 122 outputs the generated control signal 86 to the power supply 16.

The gain control 124 has the function of generating a control signal 88 depending on which of the horizontal transfer paths 56 and 58 the signal charge from the horizontal transfer path 50 via the branching section 54 are to be supplied to. The gain control 124 outputs the control signal 88 to the bias control 18. The bias control 18 routes the bias signal 72 to the branching section 54. The AF control 126 has the function of adjusting the focus based on produced image data. The AE control 128 has the function of finding an evaluation value based on the produced image data, for adjusting the diaphragm and the shutter speed. The AF control 126 and the AE control 128 are responsive to adjustment to transmit a control signal, not shown, over signal line 120, bus 114 and signal line 134 to the system controller 28. The AWB control 130 has the function of adjusting the white balance based on produced image data. The data converter 132 has the function of converting the image data, obtained on high-speed readout as two-channel data, into, e.g. dot sequential image data corresponding to the array of the color filter segments, and forming one frame of image. In case the output from the pre-processor 22 is obtained by low speed readout, the data converter 132 is to cope with one-channel output, and accordingly performs the positional conversion for a one-channel output.

The signal processor 26 also has the function, not shown, of simultaneously outputting the three-color data supplied, and using the image data of the three primary colors obtained simultaneously to produce luminance/chrominance (Y/C) signals, which is sometimes referred to as synchronization. The signal processor 26 also has the function of converting the produced Y/C signals into displayable signals, such as signals appropriate for a liquid crystal display monitor. The signal processor 26 also has the function of compressing the Y/C signals produced, depending on the recording modes, and decompressing the compressed signals for restoring and reproducing the image data. The recording modes may be exemplified by JPEG (Joint Photographic Experts Group), MPEG (Moving Picture Experts Group) and raw data modes. The signal processor 26 transmits the image data processed in accordance with the recording modes over a signal line 120, a bus 114 and a signal line 136 to the media I/F circuit 34. The signal processor 26 also outputs a liquid crystal monitor signal 138 to the monitor display 38.

The system controller 28 has the function of generating a variety of control signals responsive to an operating signal 140 from the operating unit 30, as later described. The system controller 28 includes a setting and operational control functional unit, not shown. This setting and operational control functional unit receives the control signal 140 from the operating unit 30 as a setting condition to generate a control signal 142 depending on the setting condition. The setting and operational control functional unit generates the control signal 142 which controls whether an output of horizontal transfer is to cause a double output or a single output. Thus, the system controller 28 verifies whether or not the horizontal transfer is adapted for high speed readout, depending on moving picture mode setting, speed setting of repeated shooting, scene decision and a depressing operation for a shutter release button, not shown. The system controller 28 then outputs the control signal 142 generated to the timing signal generator 32. In addition, the system controller 28 controls the memory 24, the signal processor 26 and the media I/F circuit 34.

The operating unit 30 includes a power supply switch, a zoom button, a menu display selector switch, a select key, a moving picture mode setting unit, a repeated shooting speed setting unit and a shutter release button which are not shown. The power supply switch is used for turning on or off the power supply of the digital camera 10. The zoom button controls the angle of view of the field being imaged, inclusive of a subject being imaged, and adjusts the focal length of the subject responsive to the control. The menu display selector switch is used for selecting the menu displayed on the liquid crystal monitor display to cause movement of a select cursor, and may, for example, be a cross switch. The selector key is used for selecting the items of the menu displayed.

The moving picture setting unit sets whether or not a moving picture is to be displayed on the liquid crystal monitor display, using, e.g. a flag. By this setting, the digital camera 10 displays an image of the field captured on the monitor display 38 in the form of through-image. The moving picture setting unit includes items for setting the resolution, the number of displayed frames and the repeated shooting speeds. The items for resolution are those for selecting the resolution of, for example, HDTV (High-Definition Television) standard/the reference VGA (Video Graphics Array). The number of displayed frames is an item for selecting one of 30 and 15 (30/15).

The repeated shooting speed setting unit sets the speed in repeated shooting from plural repeated shooting speeds as set. It sets the speed in repeated shooting depending on two inputs/one input. The number of times of repeated shooting is set for an image with a predetermined number of pixels. One input or two inputs is selected, respectively, in driving the solid-state imaging device, depending on that the number of times of repeated shooting is less, or equal to or greater than a threshold value of the number.

The shutter release button has the function of selecting the operational timing or the operational mode of the digital camera 10 responsive to half-stroke/full-stroke depressions. The shutter release button initiates the AE and AF operations responsive to the half-stroke depression. The AE and AF operations use an image obtained on moving picture display to find out a diaphragm, a shutter speed and a focal length which may be optimum. The shutter release button also sends the recording start/recording end timing to the system controller 28, as an operating signal 140, by the full-stroke depression, to define an operational timing responsive to the setting mode of the digital camera 10. The setting modes may be exemplified by, for example, a still image recording mode and a moving picture recording mode.

The timing signal generator 32 has the function of generating a variety of timing signals for the device 44 of the imaging unit 14. These timing signals may be exemplified by vertical and horizontal synchronous signals, field shift gate signals, vertical and horizontal timing signals, OFD pulse signals and reset signals. This function generates a variety of timing signals 90, 106 and 108 responsive to the control signal 142 from the system controller 28. The timing signal generator 32 outputs a variety of the timing signals 90 to the drivers 20. The timing signal generator 32 has the function of generating a reference clock signal and, in particular, generates the horizontal timing signal. The timing signal generator 32 frequency-divides the horizontal timing signal to generate two horizontal timing signals of frequencies different from each other. The timing signal generator 32 is responsive to the control signal 142 from the system controller 28 to output one of the sampling signals 106 and 108 as one-channel output. In this manner, it is possible to suppress power consumption of the digital camera 10.

The media I/F circuit 34 has the interface control function of controlling the recording and/or reproduction of image data depending on the recording media which may be in use. The media I/F circuit 34 is able to control recording/readout of image data 144 for a PC (Personal Computer) card as a semiconductor recording medium. The media I/F circuit 34 is also able to control recording/readout of image data 136 supplied over bus 114 under control by an enclosed USB (Universal Serial Bus) controller. There are a variety of standards for the semiconductor memory cards used for the recording media 36.

For the monitor display 38, a liquid crystal monitor display, for example, may be used. The image data 138 supplied from the signal processor 26 is displayed on the monitor display 38.

With the above-described configuration, the digital camera 10 may be run satisfactorily as signal charges from the horizontal transfer path 50 are read out as two inputs at a high speed or as one output at a low speed.

The electrode structure in which the horizontal transfer path 50 is bifurcated at the branching section 54 into the horizontal transfer paths 56 and 58, and the transfer of signal charge responsive to a drive signal, will now be described. For facility in description, the side of the horizontal transfer path 56 and that of the horizontal transfer path 58 are separately described. For each of the horizontal transfer paths 50, 56 and 58, each transfer element is formed by paired two electrodes of polycrystalline silicon (polysilicon) and paired two impurity layers in the vicinity of a silicon substrate. A stepped potential gradient is formed by applying a drive signal of the same potential to the two electrodes.

Figure 4:
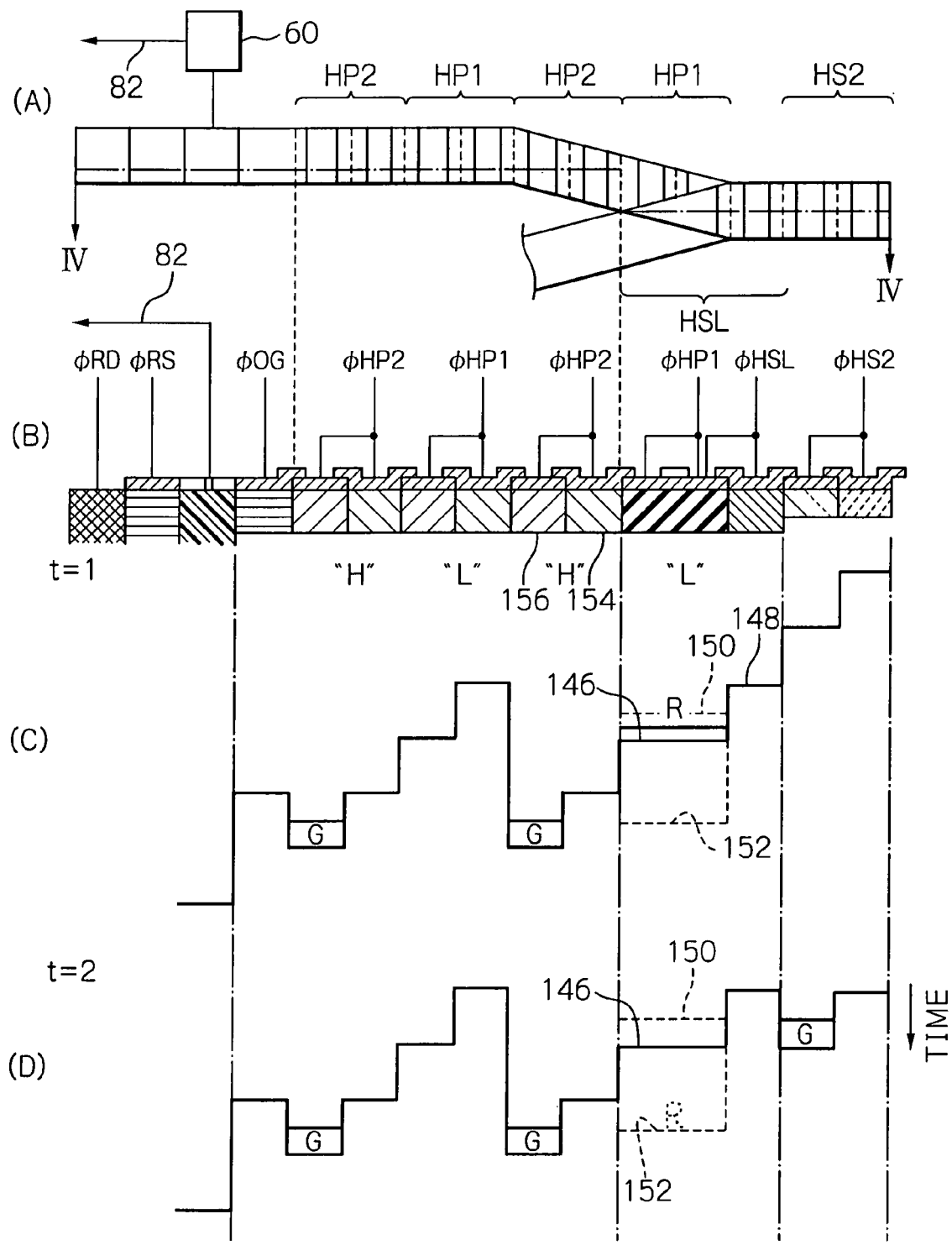
FIG. 4, part (A) is a partial plan view looked from above, and showing the schematic constitution of a horizontal transfer path in the solid state imaging device of FIG. 1, part (B) is a cross-sectional view of the transfer path, taken along a section line IV-IV, and parts. (C) and (D) show how the potential changes in various parts of the horizontal transfer path.

From the right-hand side towards an electrode HSL of the branching section 54, there are sequentially formed polysilicon electrodes HS4, HS3, HS4, HS1, HS2, HS3, HS2 and HS1 on the horizontal transfer path 50 with each polysilicon electrode being formed by an electrode pair. Referring to FIG. 4, four polysilicon electrodes HP1, HP2, HP1 and HP2, and an OG (Output Gate) electrode are formed from the electrode HSL of the branching section 54 towards an output amplifier 60. Adjacent to the left side of the OG electrode, there is formed a floating diffusion (FD) layer. Adjacent to the left end of the FD layer is formed a reset electrode (RS). Ultimately, next to the left end of the reset electrode is formed a reset drain (RD) layer.

Next, the above electrodes are imaginarily sectioned, beginning from the reset drain RD on the left end to the electrode HP1 on the horizontal transfer path 56 and further from the branching section 54 to the electrode HS2 on the horizontal transfer path 50 for illustrating the sectioned surfaces as shown by a chain-dotted line IV-IV. As may be seen from these sectioned surfaces, an impurity layer is formed directly below each electrode on a P-type substrate not shown. A plural number of the impurity layers are formed in register with the respective electrodes. For generating the respective impurity layers, impurities are doped by using, e.g. an ion implantation method. The sorts and the concentrations of the impurities doped characterize the magnitudes of the potential gradients. The potential gradients of preset magnitudes are determined in dependence upon the voltage level of the drive signals applied to the electrodes formed directly on the top of the impurity layers.

A variety of drive signals supplied to the respective electrodes will now be described. A drive signal φHS2 is supplied to the electrode HS2. A drive signal φHSL is supplied to the electrode HSL. The drive signal φHSL is a constant bias voltage. Drive signals φHP1 and φHP2 are supplied to the electrodes HP1 and HP2, respectively. Drive signals φOG, φRS and φRD are supplied to the electrodes OG, RS and the reset drain RD, respectively.

Figure 5:
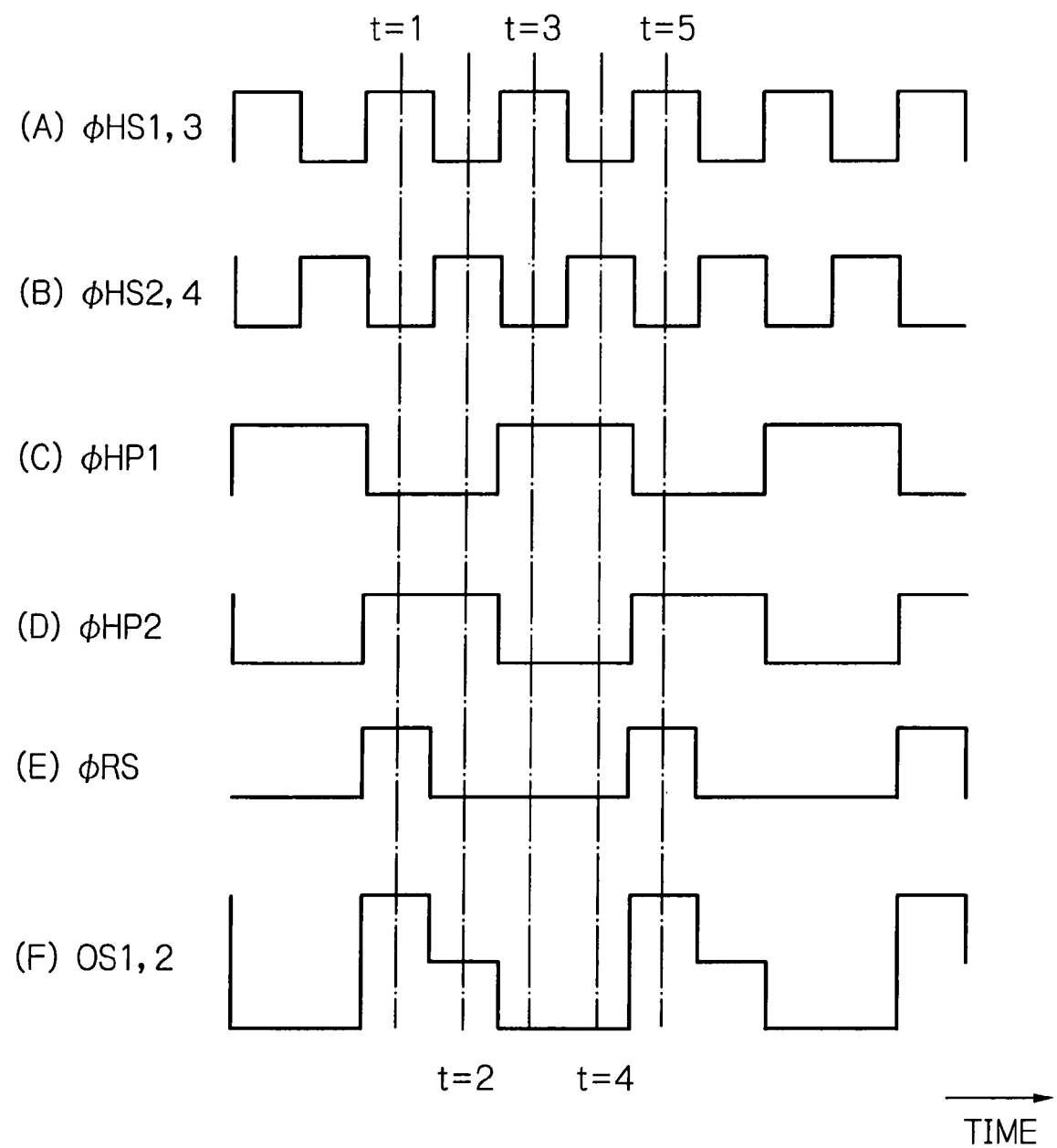
FIG. 5 is a timing chart showing the timing of drive signals supplied to respective electrodes of FIG. 4, parts (A) and (B)

FIG. 5 shows the timing for these drive signals. As regards the phase of each of the drive signals, the drive signals φHS1 and φHS3 of FIG. 5, part (A), are two phase drive signals phase-reversed by 180° from the drive signals φHS2 and φHS4 shown in part (B). The drive signal φHP1 of part (C) and the drive signal φHP2 of part (D) are phase-reversed from each other and are each a two-phase drive signal.

Turning to the period of the drive signal, the drive signals of the sets of FIG. 5, parts (A) and (B), are of the period one-half that of the drive signals of the sets of parts (C) and (D). That is, frequency of the drive signals of the sets of parts (A) and (B) is twice that of the drive signals of the sets of parts (C) and (D). The drive signal φRS supplies a level "H" at timings of, e.g. t=1, t=5, . . . , that is, at timing of t=4n+1, where n is a variable inclusive of zero. Output signals OS1 and OS2 are supplied as indicated in part (F).

Reverting to FIG. 4, since the drive signal φHSL is supplied in a manner not shown, there are generated, in a region directly below the electrode HSL supplied with the drive signal φHSL, a potential level of a perpetually fixed reference level 146 and a potential level or barrier 148 prohibiting reverse flow of signal charges supplied from the horizontal transfer path 50.

The potential generated responsive to the drive signals supplied, and the movement of signal charges accompanying the potential generation will now be described. Signal charges having attributes of colors red (R), green (G) and blue (B) are termed signal charge R, G and B, respectively. Referring to FIG. 5, part (B), the drive signal φHS2 is at a level "L", and the drive signals φHSL and φHSP1 are supplied. The drive signal φHS1 is at a level "L". When the drive signals are supplied in this manner, the signal charge R is retained in the branching section 54. The level "L" is supplied at this time to the impurity layer of the electrode HP1, not shown, adjacent to the electrode HSL, so that there is generated a potential or a barrier which is just high enough to prohibit, for example, the signal charge R from mixing into the horizontal transfer path 56, as indicated by a broken line 150.

The drive signal φHP2 of the level "H" is supplied to the other electrode HP2 neighboring to the branching section 54. This generates a potential level 152 lower than the reference level to permit the signal charge R to flow into the horizontal transfer path 58. At this time, the signal charge R is present in both packets of the reference level 146 and the potential level 152.

There are formed impurity layers 154 and 156 directly underneath the electrodes HP2 and HP1. When the level "H" is supplied, there are generated stepped potential levels composed of a level lower than the reference level 146 and the lowest level. When the level "L" is supplied, there are generated stepped potentials composed of a level higher than the reference level 146 and the same level as the reference level 146. Hence, the potential generated becomes sequentially lower in a stepped fashion along the transfer direction of the signal charges. At a timing t=1, signal charges G are stored at every second electrodes on the horizontal transfer path 56.

At the next timing t=2, the drive signal φHS2 at a level "H" is applied to the electrode HS2 as shown in FIG. 5, part (B). This causes the impurity layers of the electrode HS2 to generate a potential level 148 and the reference level 146. This allows the electrode HS2 to generate a packet between it and the electrode HSL. This packet holds the signal charge G. The rear side electrodes are supplied with the drive signals of the same level as at the timing t=1. Hence, the potential levels are the same as those at timing t1. In the interim, the signal charge R at the electrode HSL is moved to the electrode HP2 on the horizontal transfer path 58 on a lower side not shown, on the figure sheet. The signal charge R in this state is indicated by a broken line.

Figure 6:
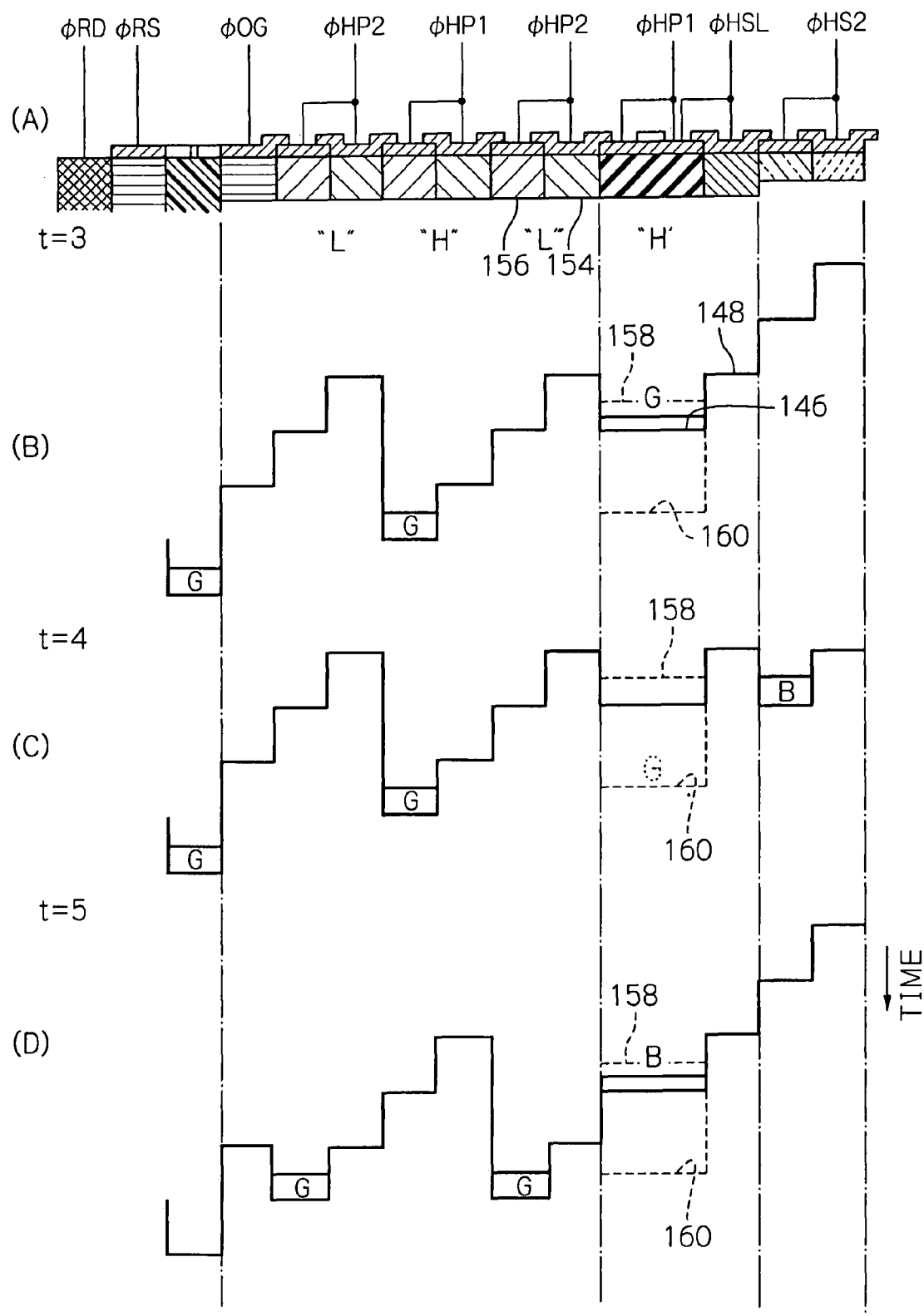
FIG. 6, part (A) continuing from the lower part of FIG. 4 is a cross-sectional view of the transfer path, and parts (B), (C) and (D) show how the potential changes.

At the next timing t3, the drive signal φHS2 of the level "L" is applied to the electrode HS2 as shown in FIG. 6. This sets the potential levels at the timing t1. The signal charge G held in the packet generated at the timing t=2 is moved to the reference level 146 at the branching section 54. At this time, the drive signal φHP1 of the level "H" is supplied to the electrode HP1 of the horizontal transfer path 56 neighboring to the electrode HSL. The potential generated in the impurity layer associated with the electrode HP1 is higher in level than the reference level 146, as indicated by a broken line 158. As a result, the signal charge G is present in both packets of the reference level 146 and the potential level 160. At this time, the drive signal φHP2 of the level "L" is supplied to the electrode HP2 of the horizontal transfer path 58. This generates the potential level of a broken line 158 in the electrode HP2. This potential level prohibits the signal charge G from mixing into the horizontal transfer path 58. The signal charge G at the branching section 54 is moved to the packet formed at the electrode HP1 on the horizontal transfer path 56 on an upper part of the drawing sheet.

The drive signal φHP2 of the level "L" is applied to the electrode HP2 neighboring to the electrode HP1. This generates the potential level 148 and the reference level 146 in the impurity layers 154, 156, respectively. The drive signal φHP1 of the level "H" is applied to the electrode HP1 neighboring to the electrode HP2. This generates a level lower than the reference level 146 and the lowest potential level in the impurity layers 154 and 156, respectively. The potential level 148 and the reference level 146 are generated by the level "L" supplied to the neighboring electrode HP2. As a result, the signal charge G held in the packet at t=2 is moved to and retained in the packet generated in the electrode HP1.

The signal charge G, retained in the packet, generated at the timing t=2, is moved towards the output side, and thence transferred via electrode OG because of the increment of the potential level.

Next, at a time t=4, the drive signal φHS2 of level "H" is supplied to the electrode HS2, so that, at this electrode, the potential which is the same as that at time t=2 is generated. The signal charge B is retained in the packet generated at this time. The signal charge G at the branching section 54 is moved to the packet formed directly underneath the electrode HP1 on the horizontal transfer path 56. A drive signal of the same level as that at time t=3 is supplied to all of rear side electrodes. Hence, the potential levels generated are the same as those at time t=3.

Next at time t=5, the impurity layers in register with the electrode HS2 generate the same potential levels as at time t=1. This generates a potential level 158, directly underneath the electrode HP1, neighboring to the branching section 54, thus providing a potential barrier against the signal charge B. The signal charge B may be made not to be color-mixed into the horizontal transfer path 56. The branching section 54 causes the incoming signal charge B to be moved further to the horizontal transfer path 58. The horizontal transfer path 56 is supplied with the drive signals which are of the same level as at time t=1. Hence, the potential levels generated are the same as that at time t=1. At time t=4, the signal charge G supplied to the FD layer is converted into an analog voltage signal which is output to the output amplifier 60.

Next, the above electrodes are imaginarily sectioned, beginning from the reset drain RD on the left end to the electrode HP2 on the horizontal transfer path 58 and further from the branching section 54 to the electrode HS2 on the horizontal transfer path 50, for illustrating the sectioned surfaces. As may be seen from these sectioned surfaces, an impurity layer is formed directly underneath each electrode on a P-type silicon substrate. The P-type silicon substrate is not shown. A plural number of the impurity layers are formed in register with the respective electrodes. In generating the impurity layers, the concentration of each of the impurity layers is adjusted to generate preset potential levels depending on the voltage levels of the drive signals. The horizontal transfer path 58 is featured by having one more electrodes than the horizontal transfer path 56.

At time t=1, the drive signal φHS2 of the level "H", the drive signal φHSL of the constant bias voltage and the drive signal φHP1 of the level "L" are supplied to the electrodes of the horizontal transfer path 58, as shown in FIG. 5, part (B). When the drive signals are applied in this manner, a signal charge R is retained in the branching section 54. At this time, the potential level generated by the impurity layer of the electrode HP2, not shown, adjacent to the electrode HSL, on applying the drive signal φHP2, is lower by one step than the reference level 146. The potential level 150 generated directly underneath the electrode HP1 on the horizontal transfer path 56, operates as a potential barrier, and prevents mixing of the signal charge R.

A sum total of four electrodes, that is, the electrodes HP1 and HP2 are provided next to the electrode HP2. Hence, the number of the electrodes provided on the horizontal transfer path 58 is one more than that on the horizontal transfer path 56. The impurity layers 154 and 156 of FIG. 4, for example, are sequentially provided, when looking from the right side, as the impurity layers lying directly underneath the four electrodes. Since the drive signal φHP1 of the level "L" is supplied to the electrode HP1, the potential level 148 and the reference level 146 are formed directly underneath the electrode HP1. The drive signal φHP2 of the level "H" is supplied to the electrode HP2. This generates the level by one step lower than the reference level 146 and the lowest potential level directly underneath the electrode HP2.

At time t=1, the drive signals are supplied as described above, and hence a packet is generated directly underneath the electrode HP2. The signal charge R and G are retained in packets sequentially from the branching section 54.

Next, at time t=2, the drive signal φHS2 of the level "H" is applied to the electrode HS2 as shown in FIG. 5, part (B). This causes the impurity layers of the electrode HS2 to generate potential levels which are of the same level as that at time t=2 of FIG. 4 to generate a packet. The signal charge G is retained in this packet. From this time on, the drive signals of the same level as at time t=1 are supplied to the electrodes of the horizontal transfer path 58. Hence, the potential levels generated are the same as those at time t=1.

Figure 8:
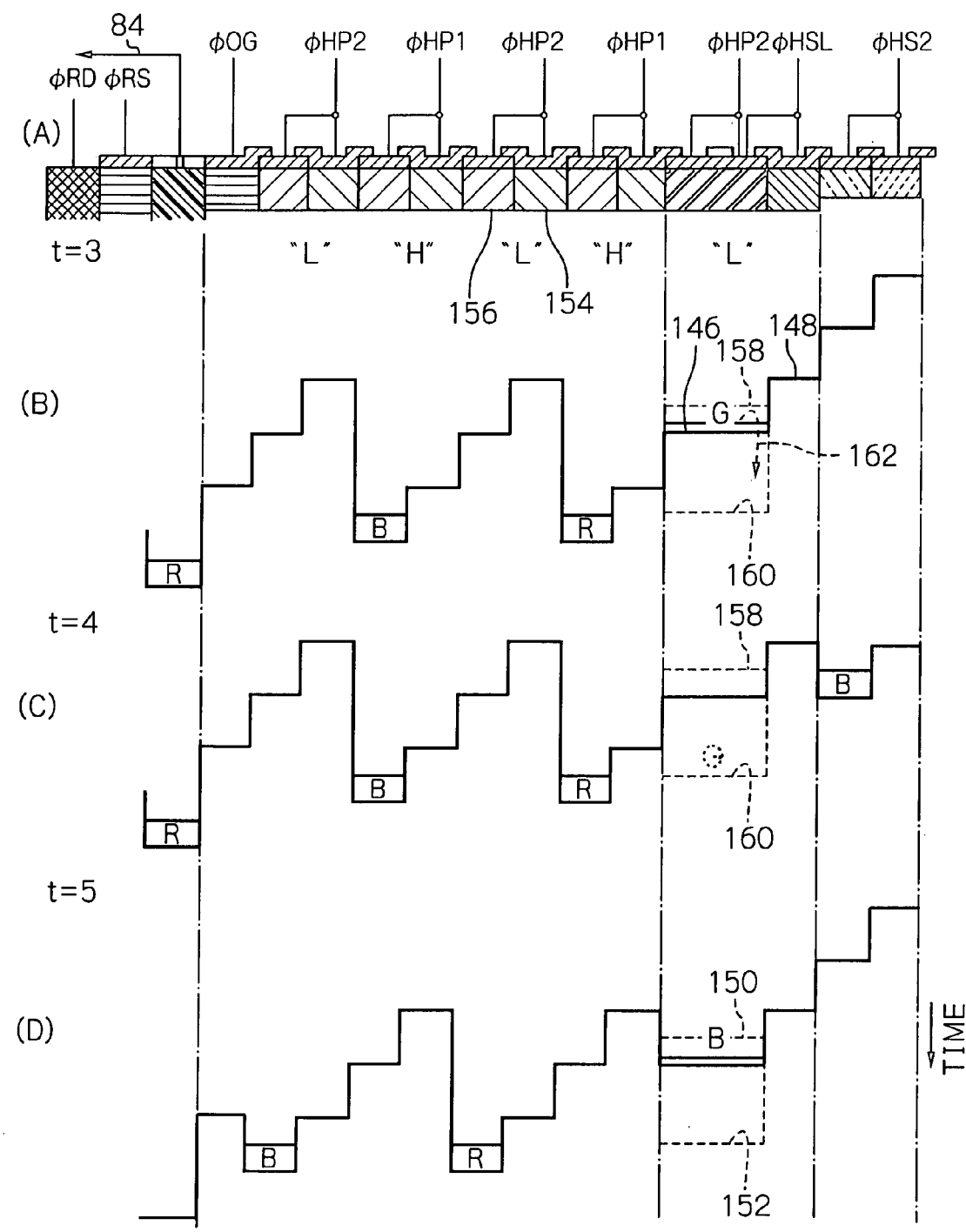
FIG. 8, part (A) continuing from the lower part of FIG. 7 is a cross-sectional view of the transfer path, and parts (B), (C) and (D) show how the potential changes.
Figure 9A:
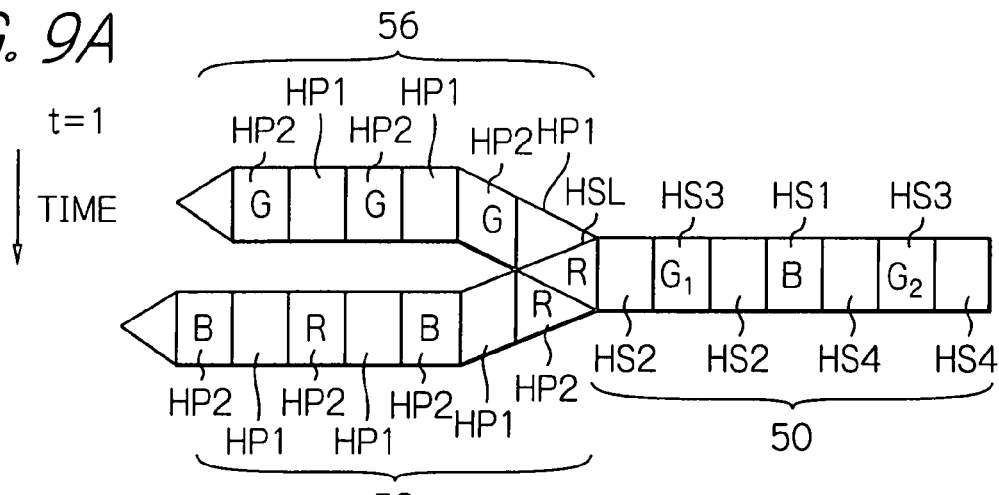
FIGS. 9A to 9E are schematic views for illustrating the transfer of signal charge with color attributes over horizontal transfer paths in the solid state imaging device of FIG. 1.
Figure 9B:
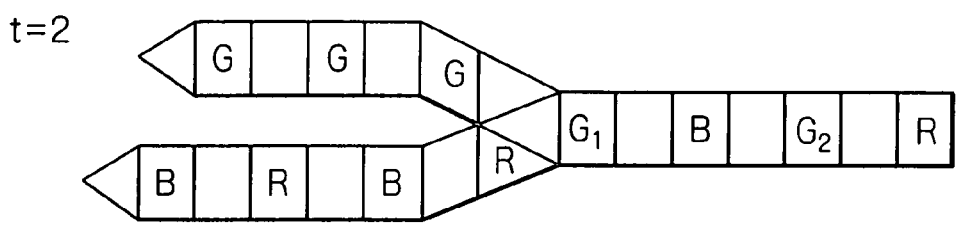
Figure 9C:
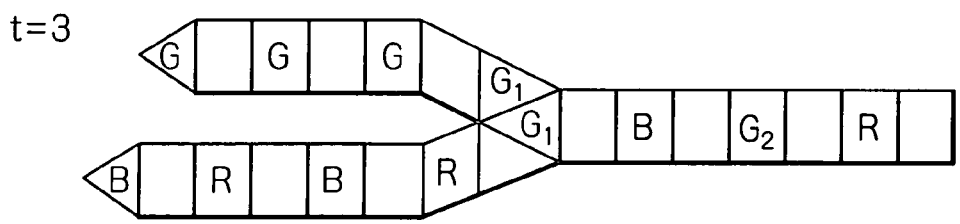
Figure 9D:
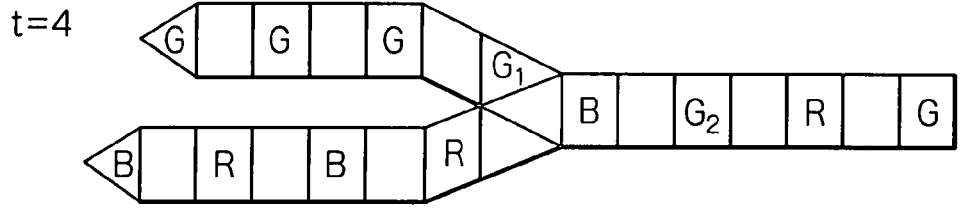
Figure 9E:
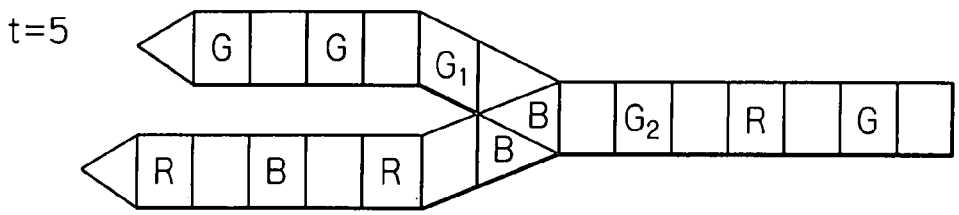

The potential levels at t=3 are shown in FIG. 8, part (B). At time t=3, the drive signal φHS2 is applied at level "L" to the electrode HS2. This sets the potential levels which are the same as those at time t=1. The signal charge G retained in the packet directly below the electrode HS2 at time t=2 is moved to the branching section 54 of the reference level 146. At this time, the drive signal φHP2 is applied at level "L" to the electrode HP2 on the horizontal transfer path 58 neighboring to the electrode HSL. The potential level for the electrode HP2 is slightly higher than the reference level 146 as indicated by broken line 158, due to the impurity layer associated with the electrode HP2 which is not shown because of cross-section. That is a potential barrier is formed to prevent the mixing of the signal charges G into the horizontal transfer path 58. On the other hand, the potential indicated by a broken line 160 is formed by the potential level "H" supplied to the electrode HP1 of the horizontal transfer path 56. This causes movement of the signal charge G along the direction perpendicular to and into the drawing sheet, as indicated by arrow 162. There is generated a packet by the potential 160 directly underneath the electrode HP1 supplied with the drive signal φHP1 on the horizontal transfer path 56 as indicated at time t=1 in FIG. 4.

On the horizontal transfer path 58, the packet generated on the electrode HP2 at time t=2 is formed on the electrode HP1, responsive to the supply of the level "H" of the drive signal φHP1. The signal charges R and B are retained in the packets of the electrodes HP1 sequentially from the branching section 54. The signal charge R on the electrode HP2, retained in the packet, generated at time t=2 is shifted towards the output with rise in the potential level, and transferred to the FD layer via the electrode OG.

Next at time t=4, there are generated the same potential levels as those at time t=2. The signal charge B is retained in a packet then generated. The drive signals of the same levels as those at time t=3 are supplied to the rear side electrodes. Hence, the potential levels generated are the same as those at time t=3. The potential level directly underneath the electrode HP2 neighboring to the electrode HSL is higher than the reference level 146 as indicated by a broken line 158. On the other hand, the potential level formed directly underneath the electrode HP1 neighboring to the electrode HSL is lower than the reference level 146 as indicated by a broken line 160.

Then, at time t=5, the same potential level as that at time t=1 is generated. The signal charges R and B are retained in the packets of the electrode HP2 sequentially from the branching section 54. At time t=4, the signal charge R supplied to the FD layer is converted into an analog voltage signal which is output from the output amplifier 60.

The operating principle of horizontal transfer responsive to supply of drive signals is shown in FIGS. 9A to 9E. In horizontal transfer, the signal charges R_G1_B_G2 supplied at time t=1 from the horizontal transfer path 50 to the branching section 54 are distributed at the branching section 54 to the horizontal transfer paths 56 and 58. The symbol_ denotes a potential barrier region. It may be seen that, on the horizontal transfer path of FIG. 9, the potential barrier separating the signal charge is generated for the length of one electrode. The horizontal transfer path 56 transfers only the signal charges G responsive to the drive signals supplied. At the above time point, the potential barrier is formed at the electrode HP1 of the horizontal transfer path 56 neighboring to the branching section 54 to prevent the signal charge R from being mixed into the horizontal transfer path 56. The horizontal transfer path 58 transfers the signal charge R and B responsive to the drive signals supplied.

The horizontal transfer path 50 is operated at a frequency double that of the horizontal transfer paths 56 and 58. Thus, at time t=2, the horizontal transfer path 50 horizontally transfers one packet of the signal charge it holds, towards the branching section 54, responsive to the drive signals supplied. Conversely, on the horizontal transfer paths 56, 58, there is no change in the transfer of signal charges, because the drive signals undergo no level changes. However, the signal charge R in the branching section 54 is moved to a packet generated in the electrode HP2, because the potential level at the electrode HP2 is lower than the reference level 146.

At time t=3, the horizontal transfer path 50 horizontally transfers the signal charges it holds, by one packet each towards the branching section 54. A signal charge G1 is retained in the packet generated directly underneath the branching section 54 and the electrode HP1 of the horizontal transfer path 56 neighboring to the branching section 54. At this time point, there is generated a potential barrier in the electrode HP2 on the horizontal transfer path 58 neighboring to the branching section 54 to prohibit the signal charge G1 from mixing into the horizontal transfer path 58. The horizontal transfer paths 56 and 58 horizontally transfer the signal charge it holds, towards the output amplifiers 60 and 62 on the packet-by-packet basis. This transfers the signal charge G and B to the FD layers of the output amplifiers 60 and 62 on the horizontal transfer paths 56 and 58.

Then, at time t=4, the horizontal transfer path 50 horizontally transfers the signal charges it holds, towards the branching section 54 by one packet. The signal charge $G_1$ is moved to a packet directly underneath the electrode HP1 of the horizontal transfer path 56 neighboring to the branching section 54. The signal charge R is moved to a packet directly underneath the electrode HP1 of the horizontal transfer path 58 neighboring to the branching section 54.

At time t=5, the horizontal transfer paths 50, 56 and 58 horizontally transfer the signal charges by one packet towards the output side. Thus, the output amplifiers 60, 62 simultaneously convert the signal charges of the colors G and B into analog voltage signals, which are then output as output signals OS1 and OS2. This eliminates difference generated in the processing of the output signals OS1 and OS2 with lapse of time.

Meanwhile, if the difference in the processing with lapse of time is tolerable, the output signals OS1 and OS2 may be output alternately.

By the above sequence of operations, it is possible to classify signal charges having color attributes to transfer and output the signal charges without color mixing. In general, it is required of the solid state imaging device to read out signal charge generated, at a high speed in order to cope with the increasing number of pixels. This demand affects the frequency band in the output amplifiers on the horizontal transfer path. The solid state imaging device is difficult to drive at a frequency higher than a preset frequency due to shortage in the frequency band. However, with the device 44 of the instant embodiment, it is possible to read out output signal charges from color to color within a preset frequency band by bifurcating an output and increasing the number of output channels even though the driving frequency of the horizontal transfer path 50 is increased in order to cope with the increasing number of pixels. That is, an improved signal charge readout speed may be achieved.

The sensitivity of charge detection in the output amplifiers 60 and 62 will now be described. The output amplifier is divided into a floating diffusion section FD and an amplifier section. The sensitivity of charge detection basically depends on the parasitic capacitance $C_{fd}$ of the floating diffusion section FD. This parasitic capacitance $C_{fd}$ in turn depends on the sum of five capacitances. These five capacitances are the PN (Positive-Negative) junction capacitance $C_{sub}$ between the floating diffusion section FD and the substrate, the parasitic capacitance $C_o$ with the output gate OG terminal, the capacitance of the reset RS terminal $C_r$, the gate-drain capacitance $C_d$ of an MOS (Metal Oxide Semiconductor) transistor in an output amplifier connected to the section FD as a source follower amplifier, and a gate-to-source capacitance $C_s$ of the MOS transistor.

It is noted that the gate-to-source capacitance $C_s$ appears to be smaller due to the source follower gain G. Thus, the parasitic capacitance $C_{fd}$ may be expressed by $C_{fd}=C_{sub}+C_o+C_r+C_d+C_s(1-G)$.

Figure 10A:
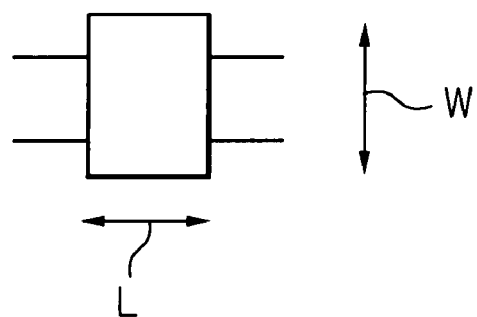
FIGS. 10A and 10B schematically show the difference in gate capacitances in the output amplifier of FIG. 1.
Figure 10B:
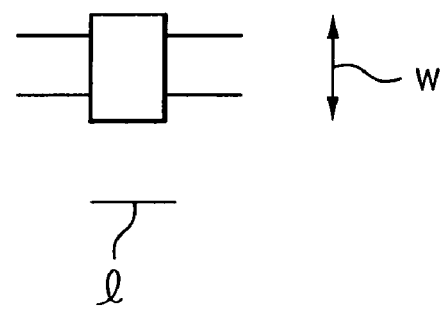

If desired to provide a difference in sensitivity in charge detection of the output amplifiers 60 and 62, several conditions are involved. The first condition is to provide a difference in the gate capacitances of the output amplifiers. For providing the difference in the gate capacitances, the difference in the sensitivity is varied mainly by the gate-drain capacitance $C_d$. The channel widths and channel lengths in the MOS transistors of the output amplifiers 60 and 62 are W, w, L and l, respectively, as shown in FIGS. 10A and 10B. Neither the ratio of the channel width to the channel length W/L of the MOS transistor shown in FIG. 10A nor the ratio of the channel width to the channel length w/l of the MOS transistor shown in FIG. 10B is changed. By so setting, the frequency response or the gain G is not changed appreciably. However, the gate capacitance may be varied significantly. By this variation, the difference in sensitivity in charge detection may be afforded to the output amplifiers 60 and 62. That is, the output amplifier 60 may have low sensitivity in charge detection, while the output amplifier 62 may have high sensitivity in charge detection.

Figure 11A:
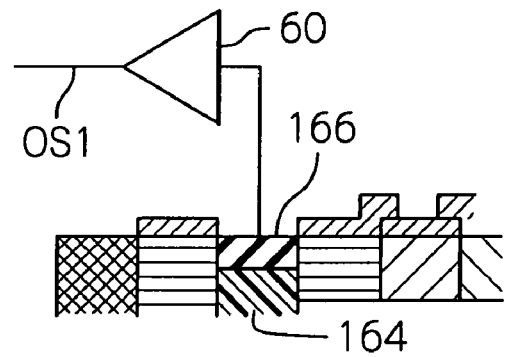
FIGS. 11A and 11B schematically show the difference in film thickness formed in the floating diffusion in the output amplifier of FIG. 1.
Figure 11B:
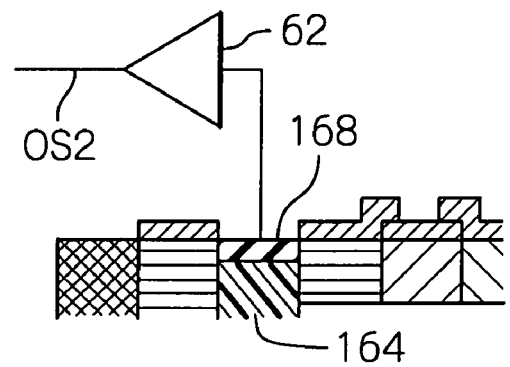

The second condition is providing a difference in thickness of a silicon nitride film (SiN) 166 formed on an N+ layer 164 in the floating diffusion section (FD). The thickness of the nitride film 166 gives rise to the connection capacitance of the nitride film 166 and the N+ layer 164, in a manner different from the PN junction capacitance Csub. If the thickness of the nitride film 164 is thicker than the nitride film 168 of FIG. 11B, the junction capacitance is increased. The difference in sensitivity in charge detection may be afforded to the output amplifiers 60 and 62 by taking advantage of this feature. That is, the output amplifier 60 is lowered in sensitivity in charge detection, while the output amplifier 62 is raised in sensitivity in charge detection.

Figure 12A:
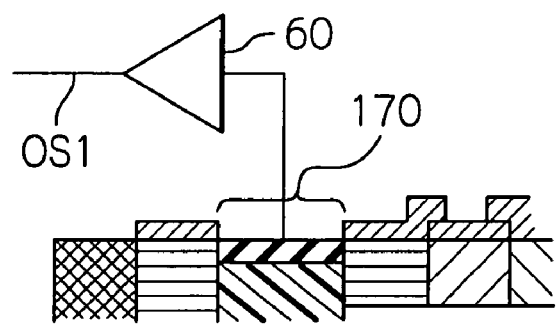
FIGS. 12A and 12B schematically show the difference in the surface area in the floating diffusion in the output amplifier of FIG. 1.
Figure 12B:
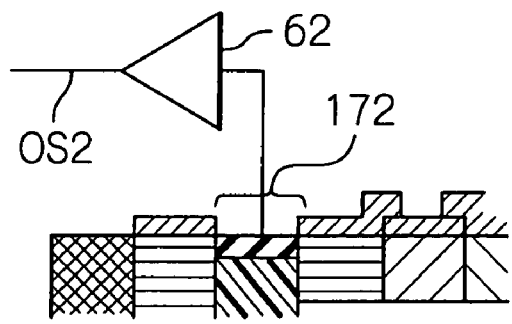

The surface area in the floating diffusion section FD represents a third condition in mainly varying the PN junction capacitance $C_{sub}$. This third condition takes advantage of the fact that the surface of the PN junction is proportional to parasitic capacitance. The output amplifier 60 may be decreased in sensitivity in charge detection in proportion to the increase in a surface area 170 of the nitride film as shown in FIG. 12A, while the output amplifier 62 may be increased in sensitivity in charge detection in proportion to the decrease in a surface area 170 of the nitride film as shown in FIG. 12B.

Figure 13A:
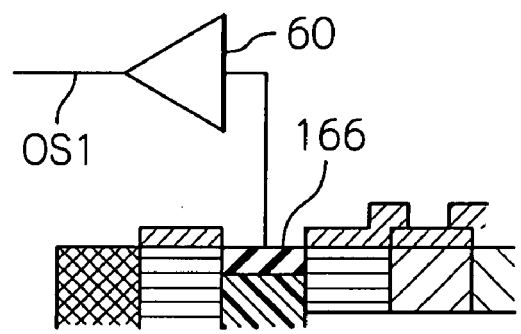
FIGS. 13A and 13B schematically show the presence and the absence of a film formed in the floating diffusion in the output amplifier of FIG. 1, respectively.
Figure 13B:
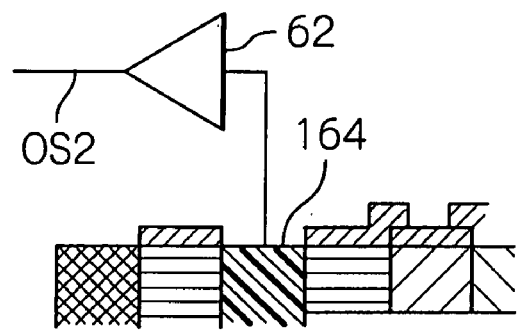

In addition, a fourth condition is provided as a special condition of the second condition in prescribing the junction capacitance between the nitride film 166 and the N+ layer 164. The fourth condition is the presence or absence of the nitride film. With the output amplifier 60, the sensitivity in charge detection is increased by forming the nitride film 166 for the floating diffusion section FD based on this condition as shown in FIG. 13A. With the output amplifier 62, the sensitivity in charge detection is decreased by not forming the nitride film 166 for the floating diffusion section FD, that is, by forming only the N+ layer 164 as shown in FIG. 13B.

The imaging device 44 of the present embodiment is of a so-called honeycomb array. More specifically with reference to FIG. 14, the photosensitive cells 46 are arrayed in the same row direction at a pitch PP and in the same column direction at the same pitch PP, while the photosensitive cells 46 of a row or a column neighboring to a given row and a given column of the photosensitive cells 46, respectively are arrayed with a shift of one-half pitch in both the row and column directions. A color filter formed on the incident light side of the photosensitive cells 46 is of three primary colors R, G and B, and constituted by plural color segments R, G and B. The color segments G are arrayed in a square pattern, while the color segments R and B are arrayed in a complete RB checkered pattern. That is, the filter array is a so-called G-square RB-checkered pattern. With the pixels or photosensitive cells 46 arrayed with offset as described above, a plural number of the vertical transfer paths 48 are formed meandering such as bypassing the pixels.

The signal charges as read out are transferred on the vertical transfer paths 48 towards the horizontal transfer path 50 not shown in FIG. 14, responsive to eight-phase drive signals φV1B, φV2, φV3B and φV4 to φV8. The signal charges are transferred towards the horizontal transfer path 50 by using line memory LM. Although not shown in FIG. 14, electrodes HS1, HS2, HS3, HS2, HS1, HS4, HS3 and HS4, . . . are provided on the horizontal transfer path 50, when looking from its left end. With the honeycomb array and the G-square RB checkered pattern, signal charge are re-arrayed or re-positioned in an output sequence by taking advantage of the line memory LM.

Figure 15:
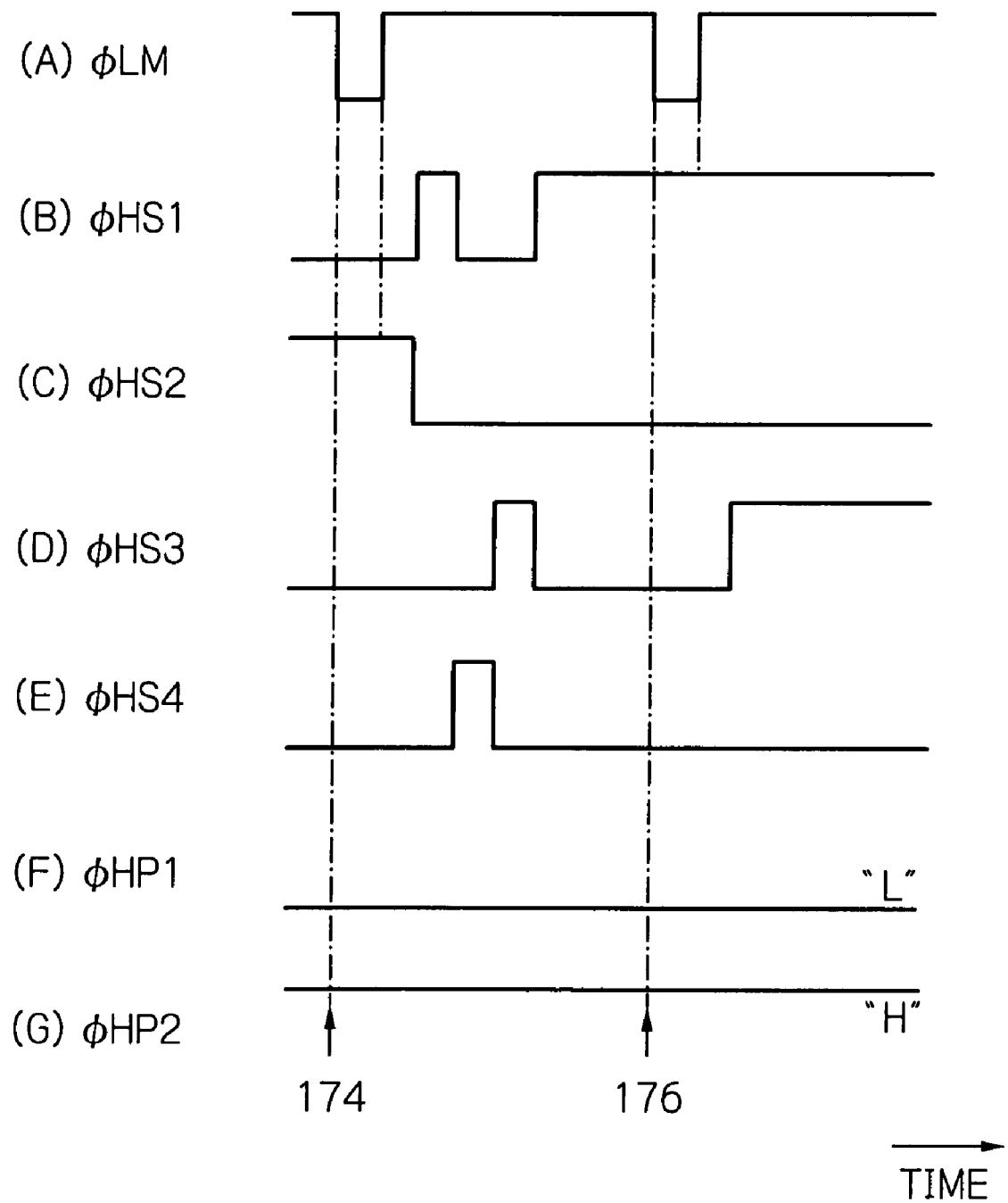
FIGS. 15 and 16 are timing charts showing re-arraying of signal charges of the first and second fields during the horizontal blanking period in connection with horizontal transfer of the device of FIG. 14, respectively.

This re-arraying may be achieved using a drive signal φLM in FIG. 15, part (A), supplied to the line memory LM and drive signals φHS1 to φHS4 in parts (B) to (E), supplied to the electrodes of the horizontal transfer path 50. For this re-arraying, the drive signals φHP1 and φHP2 not temporally changed in level, as shown in FIG. 15, parts (F) and (G), and FIG. 16, parts (F) and (G) are supplied to the horizontal transfer paths 56 and 58. This does not activate the horizontal transfer paths 56 and 58.

The timing chart of FIG. 15 shows re-arraying or re-positioning of the first field during the horizontal blanking (HBL) period. Initially, the drive signal φLM of FIG. 15, part (A), becomes "L" in level at time 174. At this time, only drive signal φHS2 of part (C) is at the level "H". Signal charges are transferred from the line memory LM to the packet generated directly underneath the electrode HS2 of the horizontal transfer path 50 supplied with the drive signal φHS2.

The drive signal φHS1 of FIG. 15, part (B), supplied to the electrode HS1, then goes "H" in level. This generates a packet directly underneath the electrode HS1 to cause movement of the signal charge. The drive signal φHS4 of part (E), supplied to the electrode HS4, then goes "H" in level. This generates a packet directly underneath the electrode HS4 to cause movement of the signal charge. The drive signal φHS3 of part (D), supplied to the electrode HS3, then goes "H" in level. This generates a packet directly underneath the electrode HS3 to cause movement of the signal charge. The drive signal φLM of part (A) goes "L" at time 176. Only the drive signal φHS1 of part (B) goes "H" in level. The signal charge are supplied to and retained in this manner in the packet.

Figure 16:
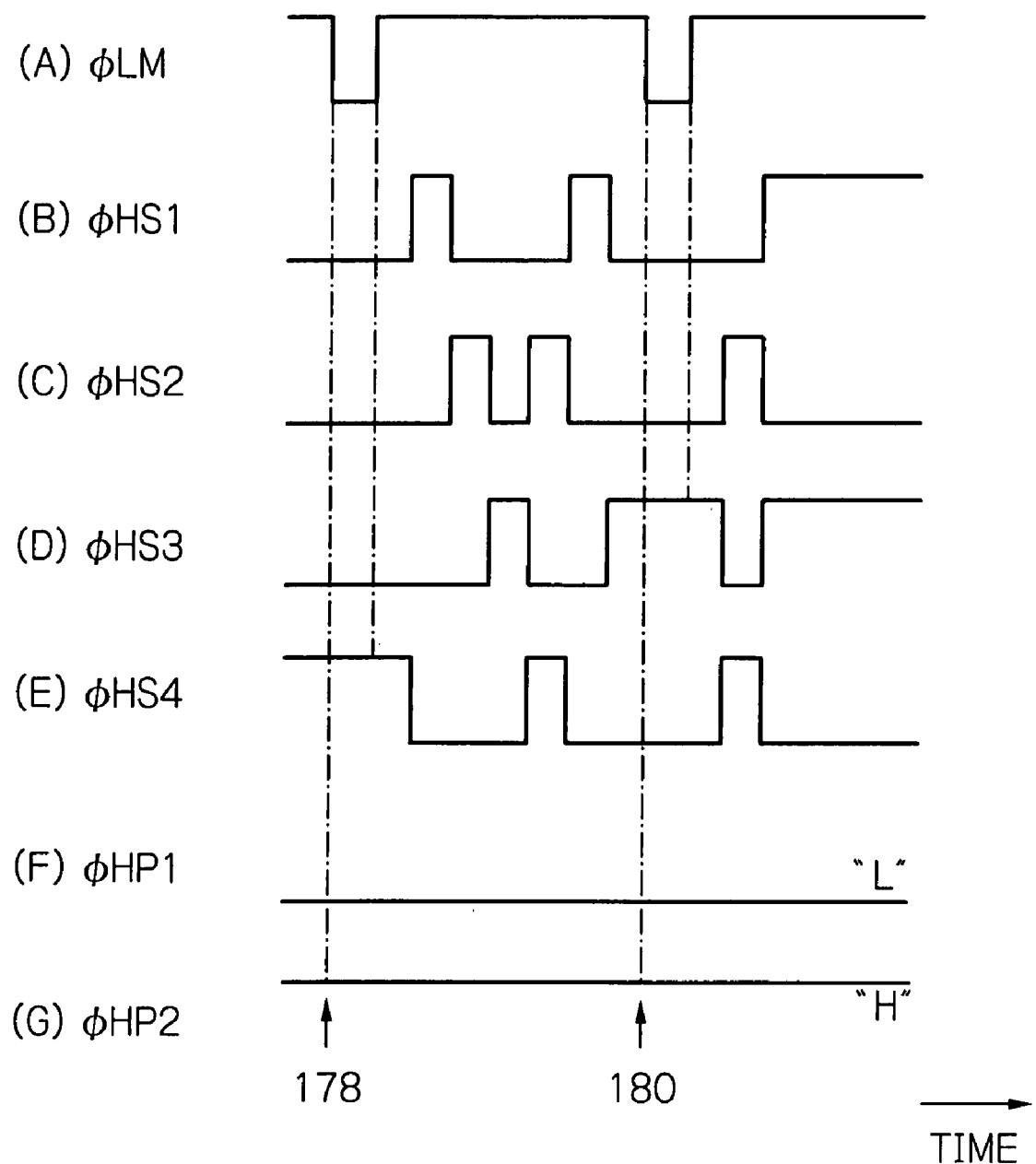

The timing chart of FIG. 16 shows re-arraying of the second field during the horizontal blanking (HBL) period. Initially, the drive signal φLM of FIG. 16(A) goes "L" at time 178. Only the drive signal φHS4 of FIG. 16, part (E) is "H" in level. The signal charges are supplied from the line memory LM to a packet generated directly underneath the electrode HS4 on the horizontal transfer path 50 supplied with the drive signal φHS4. The level "H" is then supplied in the sequence of parts (B), (C), (D), (C) and (B), depending on the electrode array. This causes movement of the signal charge with the movement of the packet generated. That is, the first signal charge is sequentially moved in the sequence of the electrodes HS4, HS1, HS2, HS3, HS2 and HS1. The first signal charge is transiently retained in the electrode HS1.

The drive signal φLM of FIG. 16, part (A), becomes "L" in level at time 180. At this time, only the drive signal φHS3 of part (E) is at a level "H". The second signal charge is transferred from the line memory LM to the packet generated directly underneath the electrode HS3 on the horizontal transfer path 50 supplied with the drive signal φHS3. The level "H" then is supplied in the order of parts (C) and (B) depending on the electrode array. In this time sequence, the packet of the second signal charge read out at time 180 is moved to the electrode HP2. Substantially simultaneously with this charge movement, the first signal charge retained in the second field is moved to the electrode HS4. The first signal charge thus retained by the electrode HS4 is then moved to the electrode HS3.

By this re-arraying, the two rows of signal charges RGB-GRGBG..., read out from the lowermost end in FIG. 14 are put into order as the first field. The two rows of signal charges BGRGBGRG..., read out from above the two bottom rows are put into order as the second field.

This re-arraying is a technique used for the G-square RB complete checkered pattern in a honeycomb array. Any other arraying pattern may give rise to unneeded re-arraying or differential timing. This re-arraying may be used for routine square pixels.

Figure 17:
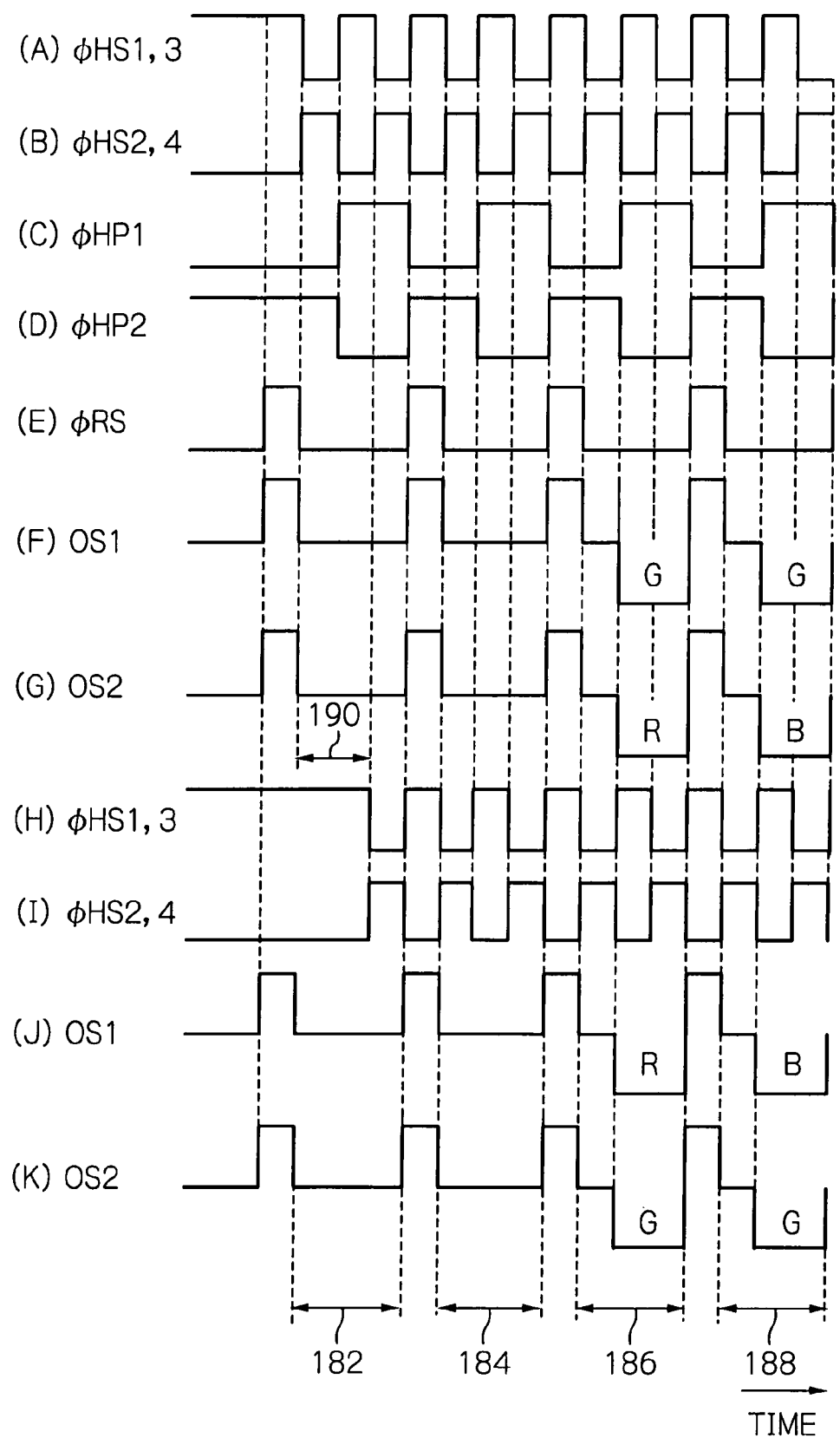
FIG. 17 is a timing chart showing the relationship of the drive signals supplied for the first field and the output signals in connection with horizontal transfer of the device.

After the re-arraying, the drive signals φHS1, φHS3 and φHS2, φHS4 shown in FIG. 17, parts (A) and (B) are supplied to transfer the signal charges retained on the horizontal transfer path 50 to the horizontal transfer paths 56 and 58. The drive signals φHP1, φHP2 shown in parts (C) and (D) are supplied to the horizontal transfer paths 56 and 58. The start position is the position at which the potential is initially changed from the horizontal blanking period. The start positions of the drive signals φHP1, φH2 are compared to those of the drive signals φHS1, φHS3, φHS2 and φHS4 and the drive signals φHP1, φHP2 are started within the period intervals of the drive signals φHS1, φHS3, φHS2 and φHS4 with a delay of one-half periods. Directly before outputting, the reset signal φRS shown in part (E) is applied, whereby output time domains 182 to 188 are obtained.

The horizontal transfer path 50 transfers, as signal charges, a dummy D1, a dummy D2, an optically black pixel OB1, an optically black pixel OB2, R, G, B, G, ..., in this order.

The solid imaging device 44 converts the signal charges into analog voltage signals to output the dummy D3, optically black pixel OB2, G, G, ..., in the output time domains 182 to 188, as output signals OS1 of FIG. 17, part (F). The device 44 also outputs the dummy D1, optically black pixel OB1, R, B, ..., in the output time domains 182 to 188, as output signals OS2 of part (G). By supplying the timings in this manner, the output signal OS1 on the horizontal transfer path 56 outputs the color G, while the output signal OS2 on the horizontal transfer path 58 outputs the color R/B.

If desired to switch the outputs, the drive signals φHS1 and φHS3 shown in FIG. 17, part (H), and the drive signals φHS2 and φHS4 shown in part (I) may be supplied with a delay of start positions corresponding to one period interval 190 of these drive signals. The device 44 outputs the dummy D1, optically black pixel OB1, R, B, ..., in the output time domains 182 to 188, as output signal OS1 of part (J). The device 44 also outputs the dummy D2, optically black pixel OB2, G, G, ..., in the output time domains 182 to 188, as output signal OS2 of part (K).

In the present embodiment, the technique of delaying the drive signal φHS is used. This technique is not to be interpreted as restrictive and the supply of the drive signal φHS may be started at a time earlier by one period interval.

By this operation, an output signal may readily be changed over without regard to prevailing driving modes.

With the device 44, the output amplifiers 60 and 62 are afforded with differential sensitivities in charge detection. Thus, during normal imaging, signal charges of the color G are supplied to and output from the output amplifier 60 of low detection sensitivity, while signal charges of the colors R/B are supplied to and output from the output amplifier 62 of high detection sensitivity. The device 44 thus prevents saturation of signal charges of the color G having the highest sensitivity, while amplifying output signals of the colors R/G with respect to the output signal for the color G. In this manner, it is possible with the device 44 to suppress the white balance gain to a smaller value to improve the S/N (signal to noise) ratio of the output signal.

In addition, the output signal of the color G is exploited in calculating for AE/AF control. In this case, the output signal for the color G may be switched so as to be output from the output amplifier 62 of high detection sensitivity. In this case, the device 44 is able to amplify the signal quantity of the color G and to output the so amplified signal for the color G. This may improve the accuracy in calculating AE/AF control.

The operational timing for low speed driving in the device 44 will now be described. With the low speed driving, the drive signals φHS1, φHS2, φHS3 and φHS4 shown in FIG. 18, parts (A) and (B) are of the same frequency as that of the drive signals φHP1 and φHP2 shown in parts (C) and (D). In case the drive signal φHS2 arriving at the last electrode HS2 of the horizontal transfer path 50 is at level "L", the drive signal φHP supplied to the electrode HP1 is at a level "H", while the drive signal φHP2 supplied to the electrode HP2 is at a level "L". Hence, the signal charges are transferred at all times via branching section (HSL) 54 towards the electrode HP1, that is, towards the horizontal transfer path 56.

Figure 18:
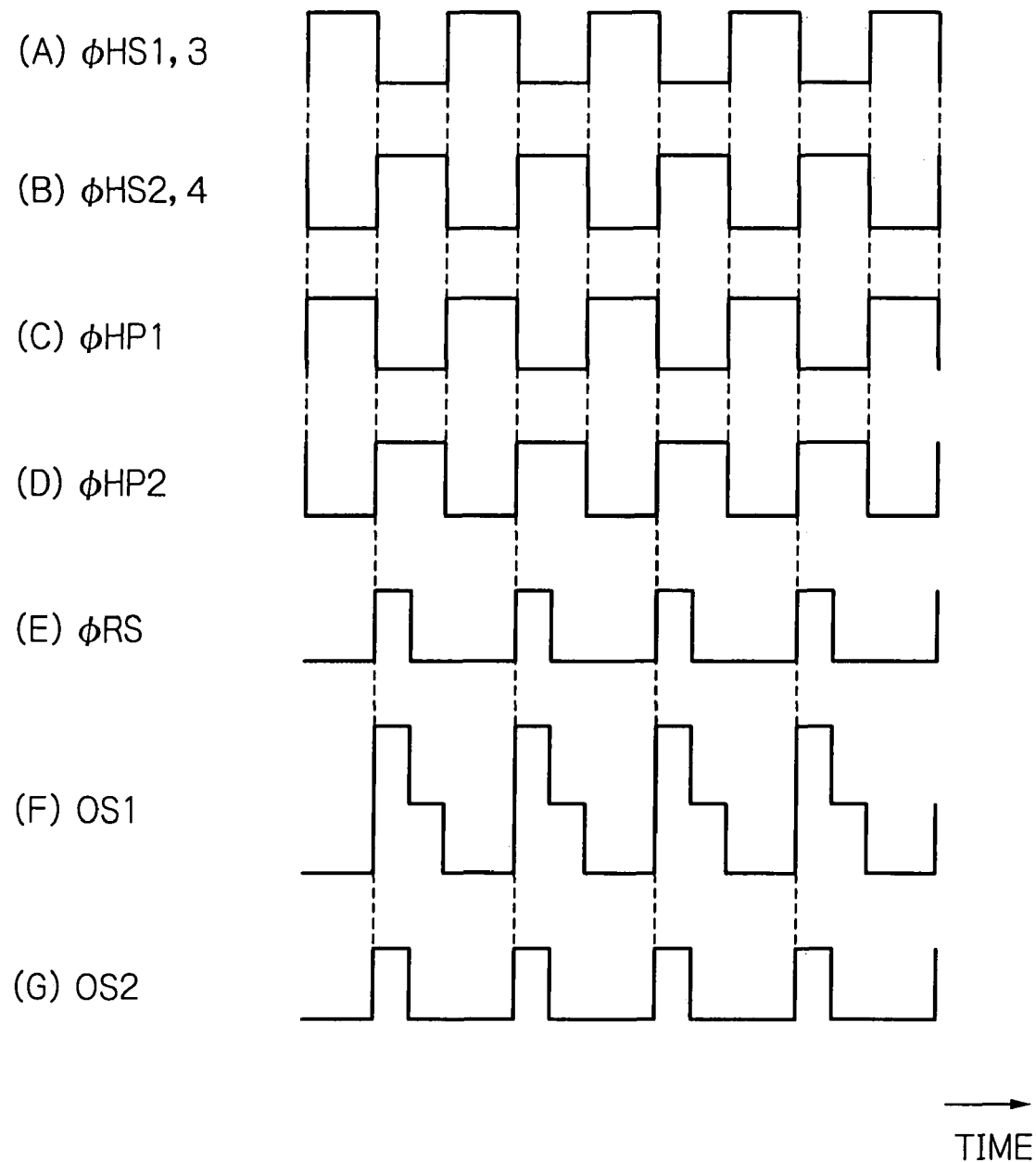
FIG. 18 is a timing chart showing the relationship of low-speed readout drive signals ad output signal in the horizontal transfer of the device.

After application of the reset signal φRS shown in FIG. 18, part (E), the output signal OS1 shown in part (F) is output. The output signal OS2 shown in part (G) is at "L" level, as a result of which the output signal OS1 is a single line output. Since the output signal OS2 is not used, the power supply for the output amplifier 62 may be turned off. In this case, supply of power for the amplifier power supply 16 is controlled depending on the control signal 86 from the power supply control 122. The power supply 66 is turned off.

The phases of the drive signal φHP1 and φHP2 may be reversed from those shown, or the phase of the set of the drive signals φHS1 and φHS3 and that of the set of the drive signals φHS2 and φHS4 may be reversed from those shown, so that, with the device 44, only the output amplifier 62 will be in operation. By so doing, only the horizontal transfer path 58 will be in operation (one-line outputting). It is possible in this fashion to switch between one-line outputting and two-line outputting to enable free selection of the outputs. With low sensitivity, if the dynamic range is prioritized, it may be preferred to select the output amplifier with low sensitivity. On the other hand, if the high sensitivity is prioritized, it may be preferred to select the output amplifier with high sensitivity.

Figure 19:
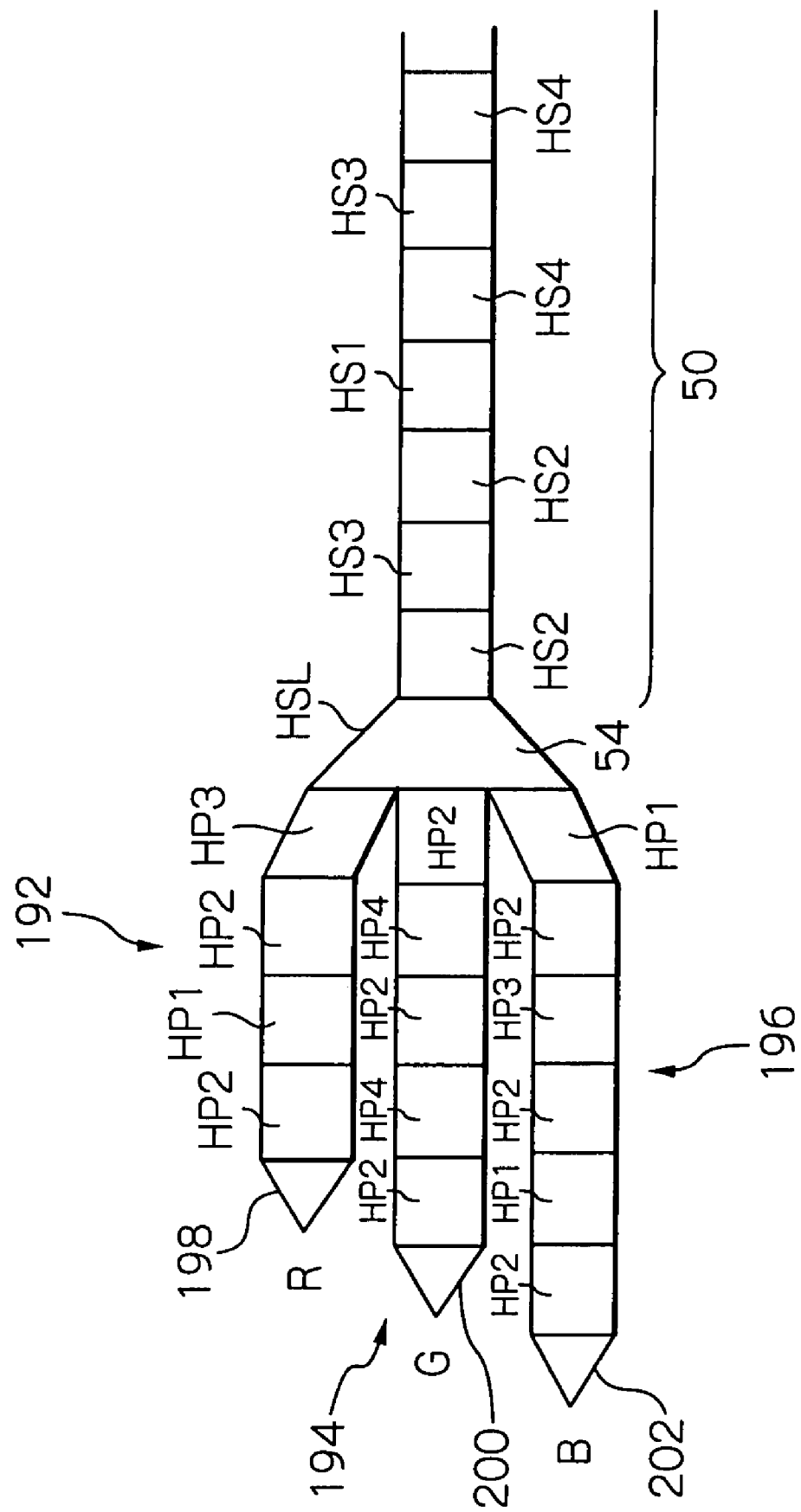
FIG. 19 is a schematic block diagram showing a three-line readout solid state imaging device applied to the imaging unit of FIG. 2.

Referring to FIG. 19, the device 44 includes trifurcated horizontal transfer paths 192, 194 and 196 for three line readout after a branching section (HSL) 54 provided from a horizontal transfer path 50. Output amplifiers 198, 200 and 202 are provided at output sides of the horizontal transfer paths 192, 194 and 196, respectively. The output amplifiers 198, 200 and 202 may exhibit differential sensitivities in charge detection. On the horizontal transfer path 192, electrodes HP3, HP2, HP1 and HP2 are provided adjacent to the branching section 54. On the horizontal transfer path 194, electrodes HP2, HP4, HP2, HP4 and HP2 are provided adjacent to the branching section 54. The number of the electrodes on the horizontal transfer path 194 is larger by one than that on the horizontal transfer path 192. On the horizontal transfer path 196, electrodes HP1, HP2, HP3, HP2, HP1 and HP2 are provided adjacent to the branching section 54. The number of the electrodes on the horizontal transfer path 196 is larger by one than that on the horizontal transfer path 194.

Figure 20:
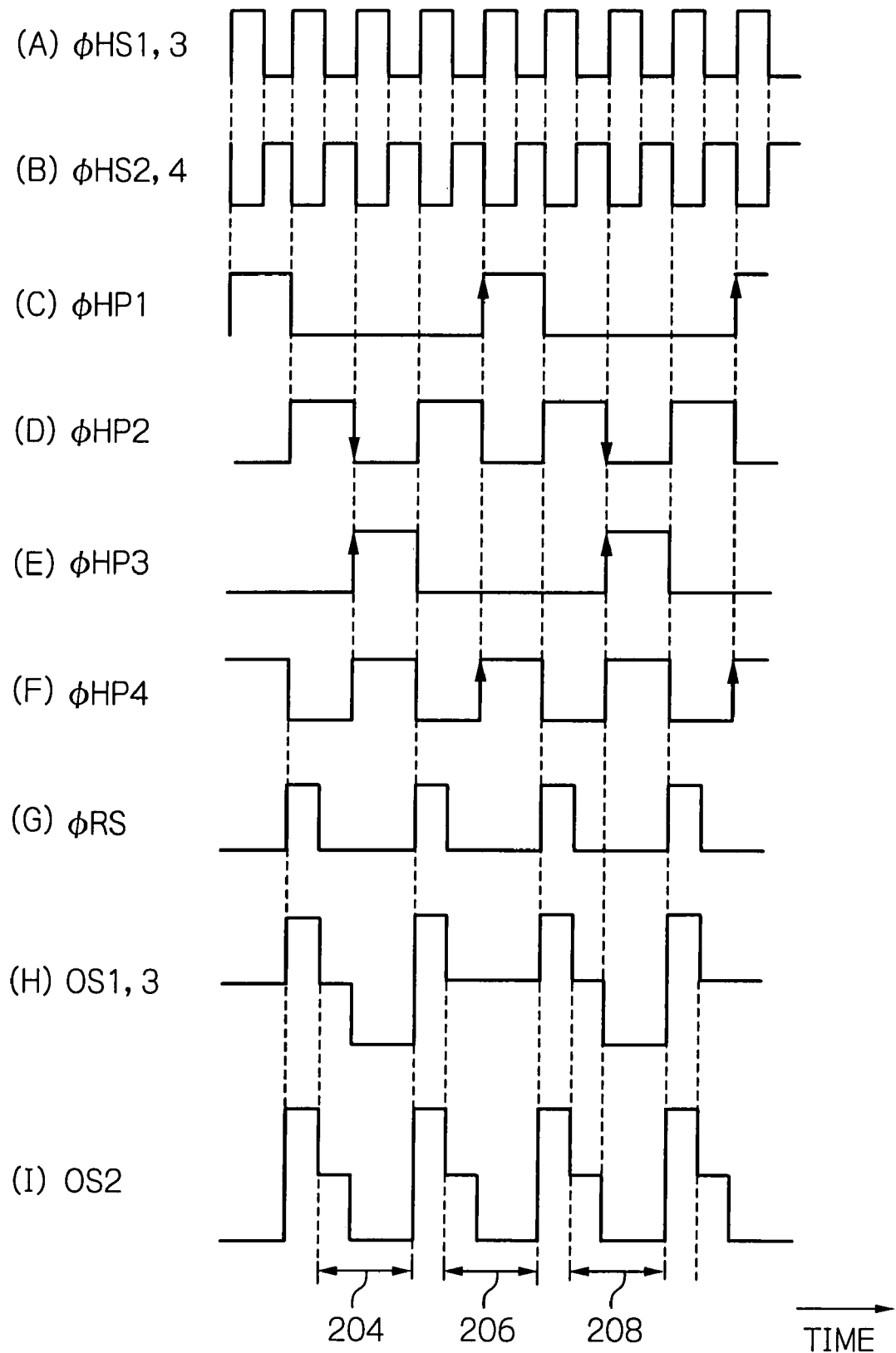
FIG. 20 is a timing chart showing the relationship between the drive signals and the output signals as applied to the horizontal transfer for the device of FIG. 19.

The driving timing in the horizontal transfer for three line output will now be described. On the horizontal transfer path 50, drive signals φHS1 to φHS4 are supplied in the same way as above, as shown in FIG. 20, parts (A) and (B). On the horizontal transfer paths 192, 194 and 196, there is supplied a drive signals φHP1 to φHP4. The drive signal φHP2 of part (D) is the same as the drive signal φHP2 of FIG. 5, part (D). The drive signal φHP4 of FIG. 20, part (F), of the present embodiment is the same as the drive signal φHP1 of FIG. 5, part (C). The frequency of the drive signals φHP1 and φHP3 of FIG. 20, parts (C) and (E) is one-half that of the drive signals φHP2 and φHP4. The rising edge of the drive signal φHP1 of FIG. 20, part (C), is synchronized with the rising edge of the drive signal φHP4. As for the timing relationship of FIG. 20(E), the rising edge of the drive signal φHP3 is synchronized with the falling edge of the drive signal φHP2.

On the horizontal transfer paths 192, 194 and 196, output signals are generated in the output time domains 204, 206, 208 responsive to the reset signal φRS of FIG. 20, part (G), supplied. The output signals OS1 and OS3 shown in part (H) are output at every second output time domains, that is, at output time domains 204, 208. The output signal OS1 is an output signal of the color R, while the output signal OS3 is an output signal for the color B. The output signal OS2 shown in part (I) is output in every output time domain, that is, at the output time domains 204, 206, 208. The output signal OS2 is an output signal for the color G.

By outputting from color to color in this fashion, it is possible to improve the degree of freedom in color designing.

Figure 21:
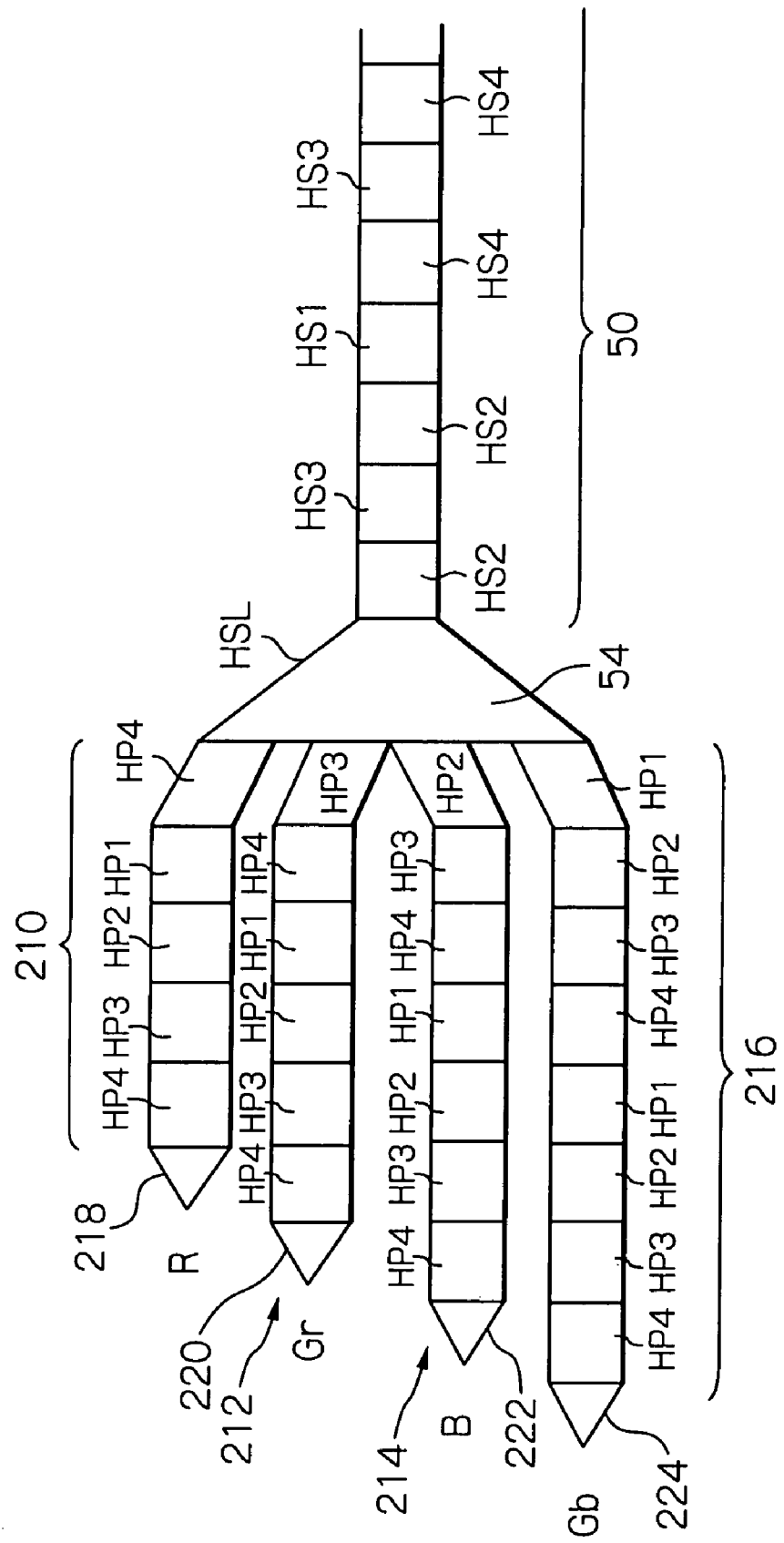
FIG. 21 is a schematic block diagram showing a four-line readout solid state imaging device applied to the imaging unit of FIG. 2.

A device 44 shown in FIG. 21 includes horizontal transfer paths 210, 212, 214 and 216 for four line readout connected to the horizontal transfer path 50 via branching section (HSL) 54. The horizontal transfer paths 210, 212, 214 and 216 are provided at output ends with output amplifiers 218, 220, 222 and 224, respectively. The output amplifiers 218 and 222 are afforded with differential sensitivities in charge detection. However, the output amplifiers 222 and 224 reading out the same colors $G_r$ and $G_b$ are desirably adjusted to the same sensitivity for charge detection. The colors $G_r$ and $G_b$ mean that the color attributes of the color filter segments of the photosensitive cells 46 neighboring to the color G are the colors R and B.

In the horizontal transfer path 210, electrodes HP4, HP1, HP2, HP3 and HP4 are provided next to the branching section 54. In the horizontal transfer path 212, electrodes HP3, HP4, HP1, HP2, HP3 and HP4 are provided next to the branching section 54. The number of the electrodes of the horizontal transfer path 212 is one more than that of the horizontal transfer path 210. In the horizontal transfer path 214, electrodes HP2, HP3, HP4, HP1, HP2, HP3 and HP4 are provided next to the branching section 54. The number of the electrodes of the horizontal transfer path 214 is one more than that of the horizontal transfer path 212. In the horizontal transfer path 216, electrodes HP1, HP2, HP3, HP4, HP1, HP2, HP3 and HP4 are provided next to the branching section 54. The number of the electrodes of the horizontal transfer path 216 is one more than that of the horizontal transfer path 214.

Figure 22:
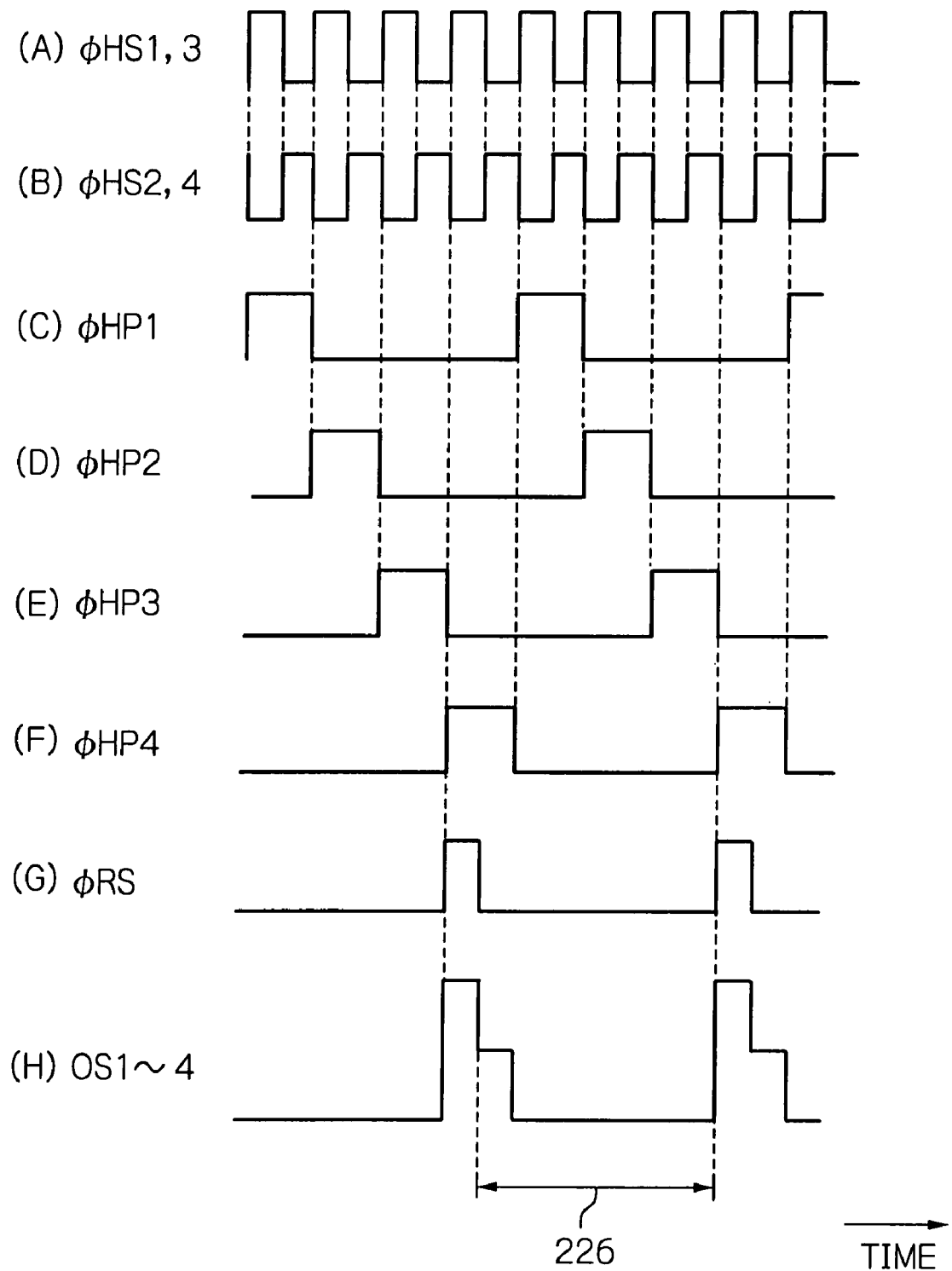
FIG. 22 is a timing chart showing the relationship between the drive signals and the output signals as applied to the horizontal transfer for the device of FIG. 21.

The driving timing in the horizontal transfer of the four-line output will now be described. To the horizontal transfer path 50 are supplied drive signals φHS1 to φHS4 which are the same as those described above, as shown in FIG. 22, parts (A) and (B). To the horizontal transfer paths 210, 212, 214 and 216 following the branching, drive signals φHP1 to φHP4 shown in parts (C) to (F) are supplied. The frequency of the drive signals φHP1 to φHP4 is one-fourth that of the drive signals φHS1 to φHS4. The drive signals φHP2 to φHP4 are phase-shifted 90°, 180° and 270° with respect to the rising edge of the drive signal φHP1. On the horizontal transfer paths 210 to 216, output signals OS1 to OS4 are obtained in the output time region 226 at the same time in keeping with the reset signal φRS of part (G).

It is noted that, even in the device 44 for horizontal transfer for three and four line readouts, it is possible to select two lines and to change the driving pattern responsive to signal charges of the color attributes to change over the output destinations. This suppresses the WB gain to improve the S/N ratio.

By this multi-line readout, it is possible to read out signal charges with a further lower driving frequency to improve the degree of freedom in color designing.

Figure 23:
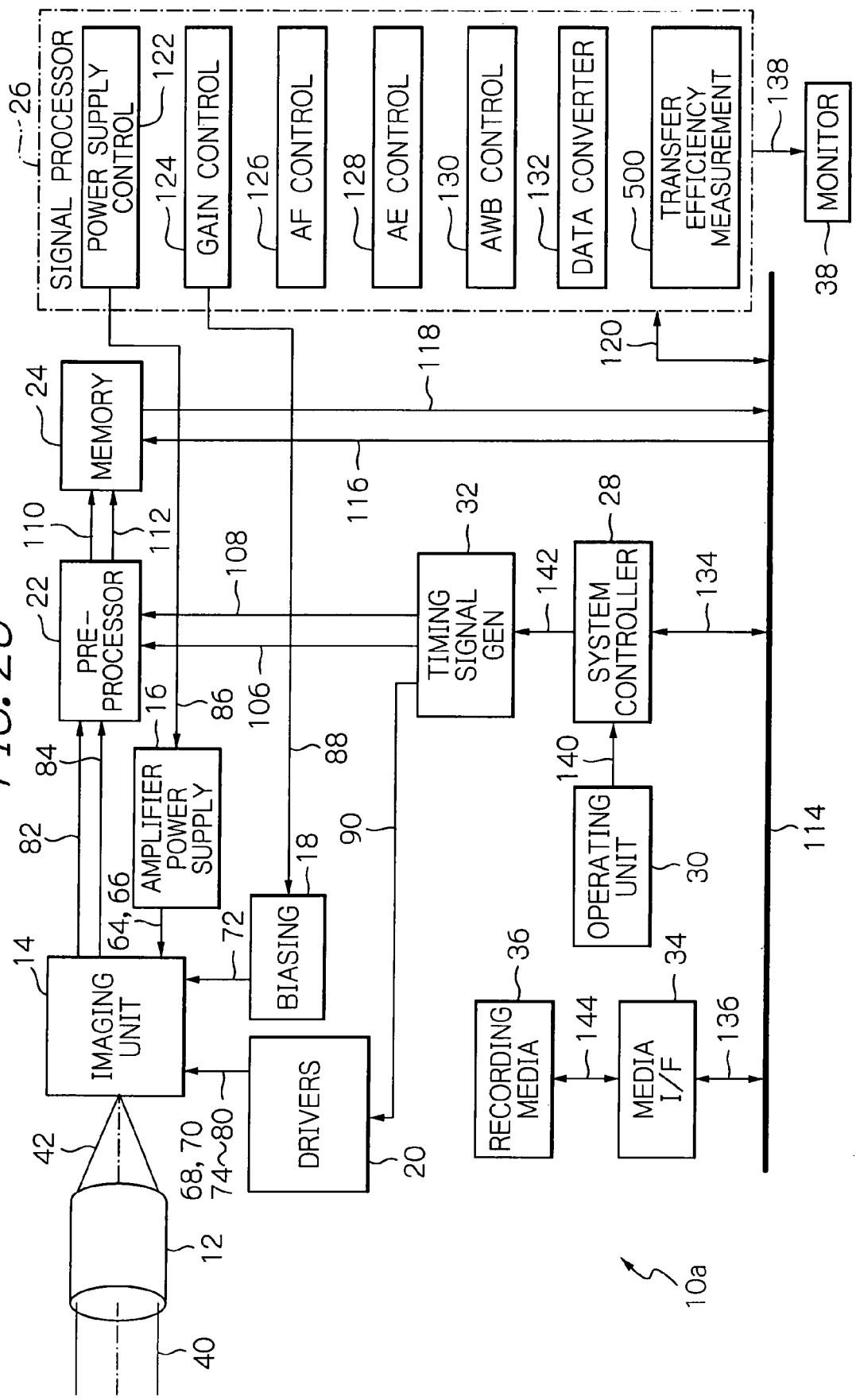
FIG. 23 is a schematic block diagram showing an alternative embodiment of a solid state imaging apparatus according to the present invention.

An alternative embodiment of the present invention will now be described with reference to the drawings. Referring now to FIG. 23 showing a solid state imaging apparatus 10a of the present modification, the timing signal generator 32 controls the transfer timing on the horizontal transfer path of the imaging unit 14, according to the measurement by a transfer efficiency measurement unit 500 of the signal processor 26. In the description, like components are designated with the same reference numerals and description thereon will not be repeated for simplicity.

In the present solid state imaging apparatus 10a, the speed of horizontal transfer of signal charges in the imaging unit 14 may be varied depending on an image shooting mode, such as a still image mode, a moving picture mode or a repeated shooting mode, or on the result of scene decision on an image being imaged. More specifically, with the instant alternative embodiment, signal charge transfer may be made at a high or a low speed. In the low-speed transfer, the imaging unit 14 outputs a sole shot image via a sole output circuit by way of one-line outputting. In the high-speed transfer, the imaging unit 14 outputs a sole shot image via two output circuits by way of two-line outputting.

The device 44 transmits the drive signal φHS2, supplied from the drivers 20, to respective electrodes of the transfer device HS2 on the horizontal transfer path 50 to transmit the drive signal φHSL supplied from the biasing circuit 18 to each electrode HSL of the branching section 54. The drive signal φHSL is a constant bias voltage. The device 44 routes the drive signals φHP1 and φHP2 to transfer elements HP1 and HP2 on the horizontal transfer elements 56 and 58, respectively. The device 44 also transmits drive signals φOG, φRS and φRD supplied from the drivers 20, to the electrodes OG and RS and to the reset drain RD, respectively. The electrode OG is supplied with a preset voltage by this drive signal ϕOG, while the reset drain RD is supplied with a preset power supply voltage by the drive signal ϕRD.

The signal processor 26 has the function of generating a control signal responsive to a digital signal 118. In the present alternative embodiment, the signal processor 26 includes, in addition to the transfer efficiency measurement unit 500, the power supply control 122, gain control 124, power supply control 122, AF control 126, AE control 128, AWB control 130 and data converter 132 like the embodiment shown in and described with reference to FIG. 2.

The transfer efficiency measurement unit 500 measures the transfer efficiency for signal charge proceeding from the branching section 54 through the horizontal transfer paths 56 and 58, that is, the transfer efficiency on the horizontal transfer paths 56 and 58, based on the digital image signal 118.

The transfer efficiency measurement unit 500 measures the horizontal transfer efficiency of the horizontal transfer paths 56 and 58 in advance, for example, at the time of shipment from the plant. Preferably, it is verified whether the horizontal transfer efficiency of one of the horizontal transfer paths is satisfactory, responsive to the results of the measurement, and the result of decision is stored in a memory circuit, not shown. The transfer efficiency measurement unit 500 may store the results of measurement, that is, the horizontal transfer efficiency itself in the memory, for having the system controller 28 check and verify the horizontal transfer efficiency.

The system controller 28 may also have the function of verifying, in case the transfer efficiency measurement unit 500 has stored the measured results in a memory, which of the horizontal transfer paths has the optimum transfer efficiency, based on the result. The system controller 28 sends a control signal representing the results of decision by the system controller 28 or by the transfer efficiency measurement unit 500 to the timing signal generator 32.

In the present alternative embodiment, the timing signal generator 32 may receive the result of decision indicating which of the horizontal transfer paths 56 and 58 has the optimum horizontal transfer efficiency, from the transfer efficiency measurement unit 500 or the system controller 28, and vary the driving conditions for the horizontal timing signal for the horizontal transfer path 50, based on the results of decision. For example, the timing signal generator 32 may shift the driving start time in the initial driving condition for the horizontal timing signal to make a relative shift from the driving start time in the initial driving condition of the horizontal timing signal for the horizontal transfer paths 56 and 58.

When a horizontal timing signal of the initial driving condition for high speed driving is supplied by the timing signal generator 32 to the drivers 20 to control the horizontal transfer path 50 and the branching section 54, green signal charges are transferred to the horizontal transfer path 56, while alternately red and blue signal charges are transferred to the horizontal transfer path 58. If the horizontal timing signal of the initial driving condition is supplied to the drivers 20, as the horizontal timing signal is relatively offset so as to be delayed or advanced by, for example, one period, such as to control the horizontal transfer path 50 and the branching section 54, the signal charges of the red and blue colors may be alternately transferred to the horizontal transfer path 56, while the green signal charges may be transferred to the horizontal transfer path 58.

With the timing signal generator 32 of the present alternative embodiment, it is possible to determine the driving condition for reversed branching, as the horizontal timing signal of the initial driving condition is offset as described above, in order to reverse signal charges transferred on the horizontal transfer paths 56 and 58 by invert electrical signals output to the output amplifiers 60 and 62.

The timing signal generator 32 may determine desired driving conditions for high speed driving, responsive to the results of decision of the horizontal transfer efficiency, to transfer desired signal charges, such as red and green signal charges, to one of the horizontal transfer paths 56 and 58 where the horizontal transfer efficiency is optimum.

Moreover, during low speed driving, the timing signal generator 32 transfers all signal charges only to one of the horizontal transfer paths 56 and 58. It is therefore possible to determine desired driving conditions for low speed driving, responsive to the result of decision of the horizontal transfer efficiency, and to transfer all signal charges to the horizontal transfer efficiency 56 or 58 having the optimum horizontal transfer efficiency. The horizontal transfer in the initial driving conditions is carried out as described above with reference to FIGS. 4 to 9E.

The operation of horizontal transfer under an initial driving condition during high speed transfer in the solid state imaging apparatus 10a will now be described with reference to the timing chart of FIG. 24.

Figure 24:
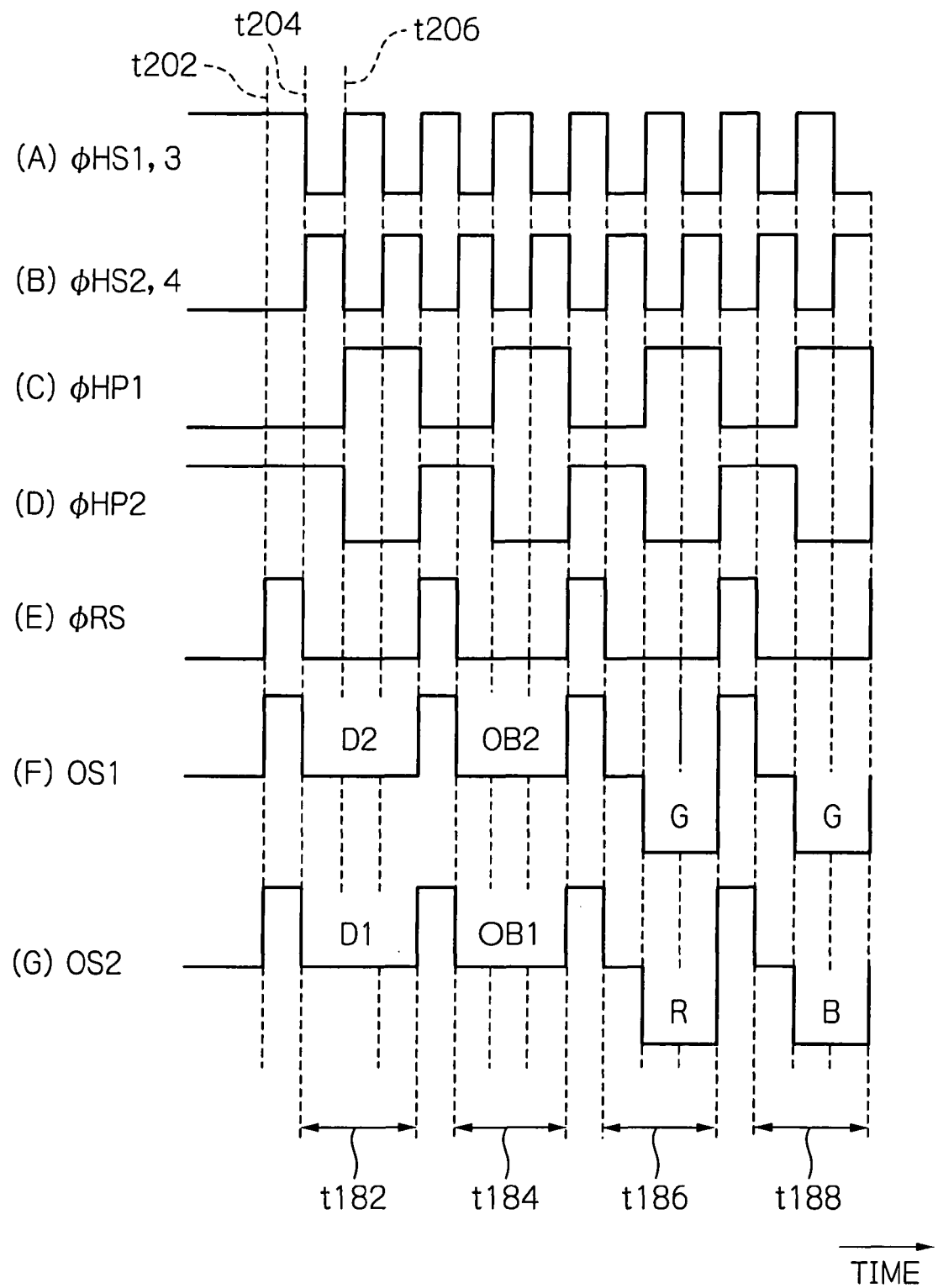
FIG. 24 is a timing chart useful for understanding an operational sequence of horizontal transfer consistent with horizontal timing signals of the initial driving condition at the time of high speed driving in the solid state imaging device of FIG. 1.

FIG. 24, parts (A) to (G) illustrate the operation in which the timing signal generator 32 transmits the horizontal timing signal of the initial driving condition to the drivers 20. In the figure, parts (A) and (B) show drive signals ϕHS1 and ϕHS3, and drive signals ϕHS2 and ϕHS4, which the HS driver 96 outputs to the horizontal transfer path 50, respectively. Parts (C) and (D) show drive signals ϕHP1 and ϕHP2, the HS driver 98 outputs to the horizontal transfer paths 56 and 58, respectively. Part (E) show the reset signal ϕRS, the RS driver 100 outputs to the output amplifiers 60 and 62, while parts (F) and (G) show output signals OS1, OS2, output from the output amplifiers 60 and 62, respectively.

It is now assumed that, on the horizontal transfer path 50 of the present alternative embodiment, the signal charges transferred from each vertical transfer path 48 are re-arrayed in the output sequence, during the horizontal blanking period. It is also assumed that, at a time t202, the dummy pixels D1, D2, optically black pixels OB1, OB2, R pixel, G pixel, B pixel, G pixel, . . . are stored in this order, in the respective transfer elements transferred, beginning from the end neighboring to the branching section 54 to the opposite end.

In the alternative embodiment, the horizontal drive signals 74 actuated at time t204 is generated by the HS driver 96 in the drivers 20 as shown in FIG. 3, responsive to the horizontal timing signal of the initial driving condition. As this drive signal 74, the drive signals ϕHS1 and ϕHS3 and the drive signals ϕHS2 and ϕHS4 are transmitted to the horizontal transfer path 50. There is also generated the horizontal parallel drive signal 76 actuated at time t206 in the HP driver 98 in the drivers 20. As the drive signal 74, the drive signals ϕHP1 and ϕHP2 are supplied to the horizontal transfer paths 56 and 58, respectively.

First, on the horizontal transfer path 50, the signal charges are transferred horizontally towards the branching section 54. In the alternative embodiment, the signal charges are transferred in the sequence of the dummy pixels D1, D2, optically black pixels OB1, OB2, R pixel, G pixel, B pixel, G pixel, . . . .

The signal charges are alternately transferred at this time from the branching section 54 to the horizontal transfer paths 56 and 58, in a branched fashion. The branched transfer will be described subsequently. The signal charges are initially sent to the horizontal transfer path 58 supplied with a horizontal parallel drive signal φHP2 which is at level "H" at time t204. The signal charges are then sent to the horizontal transfer path 56 supplied with the horizontal parallel drive signal φHP1 which is at level "H" at time t206. Thus, in the alternative embodiment, the dummy pixel D1, the optically black pixel OB1, R pixel and the B pixel are transferred in this order towards the horizontal transfer path 58, while the dummy pixel D2, the optically black pixel OB2, G pixel and the G pixel are transferred in this order towards the horizontal transfer path 56.

The signal charges sent to the horizontal transfer paths 56 and 58 are transferred to the output amplifiers 60 and 62, respectively, where they are converted into analog electrical signals which are then output. The output a amplifier 60 of the instant alternative embodiment sequentially outputs the dummy pixel D2, the optically black pixel OB2, G pixel and the G pixel, as output signal OS1, that is, as analog electrical signal 82, during the output periods t182, t184, t186 and t188, respectively, as shown in FIG. 24, part (F).

On the other hand, the output amplifier 62 sequentially outputs the dummy pixel D2, dummy pixel D1, optically black pixel OB1, R pixel and the B pixel, as output signal OS2, that is, as analog electrical signal 84, during the output periods t182, t184, t186 and t188.

Thus, if the imaging unit 14 executes horizontal transfer under the initial condition, the output signal OS1 indicating the color signal of the G pixel is output from the horizontal transfer path 56 and the output amplifier 60, while the output signal OS2 indicating the color signal of the R and B pixels is output from the horizontal transfer path 58 and the output amplifier 62.

The operation of shifting the horizontal timing signal from the initial driving condition for high-speed transfer in the solid state imaging apparatus 10a of the present alternative embodiment will now be described with reference to the timing chart shown in FIG. 25.

Figure 25:
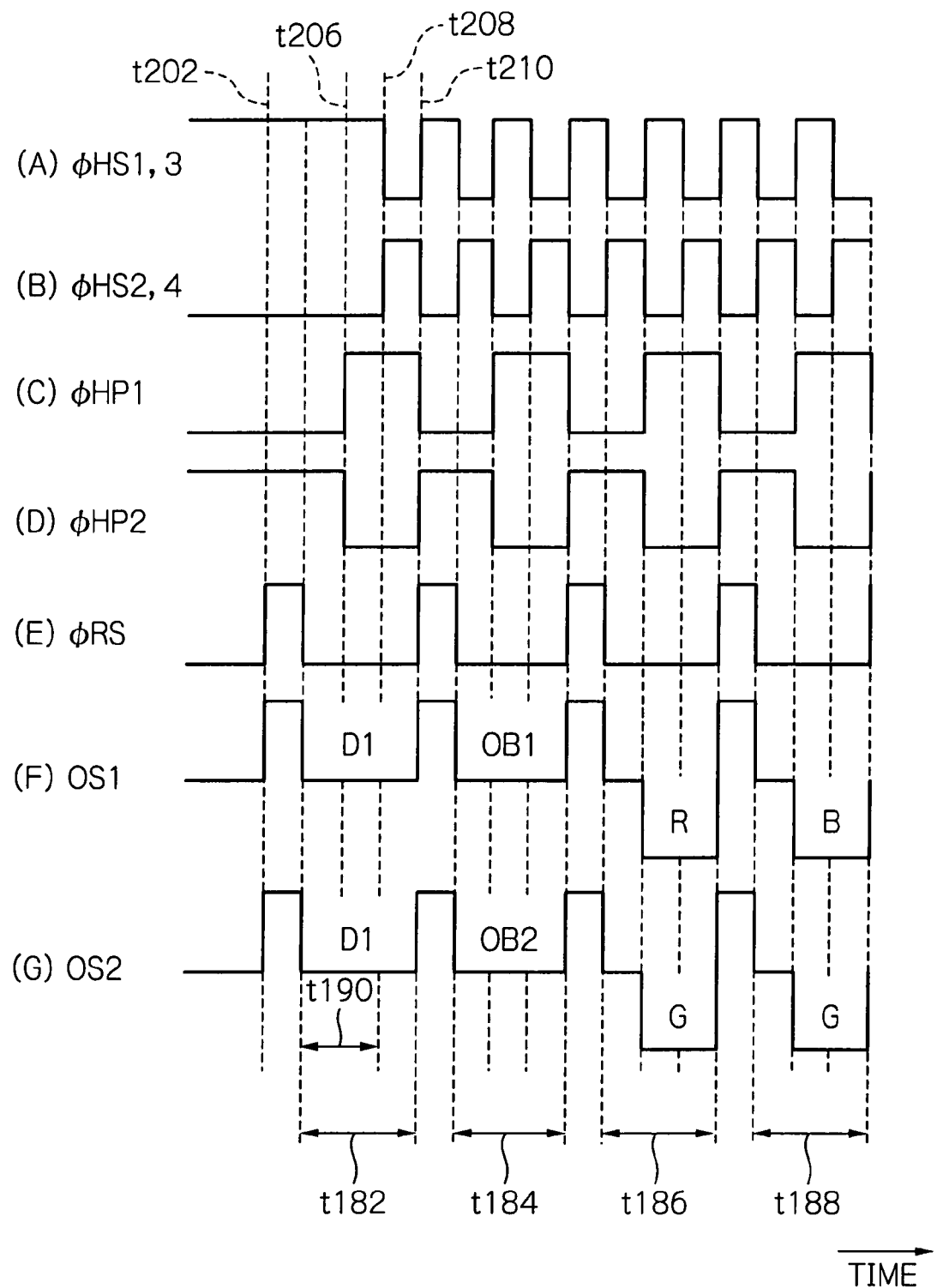
FIG. 25 is a timing chart useful for understanding an operational sequence of horizontal transfer consistent with horizontal timing signals of the inverted-branching driving condition at the time of high speed driving in the device of FIG. 1.

In FIG. 25, parts (A) to (G), there is shown the operation in which the timing signal generator 32 sends to the drivers 20 a horizontal timing signal of the driving condition of inverted branching, having a delay of one period, e.g. a period t190 from the initial driving condition. In the figure, parts (A) and (B) show the drive signals φHS1 and φHS3, and the drive signal φHS2 and φHS4 which the HS driver 96 outputs to the horizontal transfer path 50, respectively. Parts (F) and (G) show output signals OS1 and OS2 output by the output amplifiers 60 and 62, respectively. It is noted that the drive signals φHP1 and φHP2 and the reset signal φRS may be the same signals as those shown in FIG. 24, parts (C), (D) and (E).

In the present alternative embodiment, it is again assumed that the dummy pixels D1 and D2, optically black pixels OB1 and OB2, R pixel, G pixel, B pixel and the G pixel, . . . , are stored at time t202 in the respective transfer elements in the horizontal transfer path 50 in the same manner as above.

In the instant alternative embodiment, the horizontal parallel drive signal 76 actuated at time t206 is generated by the HP driver 98 in the same manner as above. As this drive signal 76, the drive signals φHP1 and φHP2 are supplied to the horizontal transfer paths 56 and 58, respectively. Moreover, the HS driver 96 generates the horizontal parallel drive signal 74 actuated at time t208 responsive to the horizontal timing signal of the driving condition for inverted branching. As this drive signal 74, the drive signals φHS1 and φHS3 and the drive signals φHS2 and φHS4 are supplied to the horizontal transfer path 50.

Next, on the horizontal transfer path 50, the signal charges are horizontally transferred towards the branching section 54. In the present alternative embodiment, the signal charges in the order of the dummy pixels D1, D2, optically black pixels OB1, OB2, R pixel, G pixel, B pixel, C pixel, . . . .

At this time, the signal charges are alternately transferred from the branching section 54 to the horizontal transfer paths 56 and 58 in the sequence reversed from that of the horizontal transfer of the initial driving condition. The signal charges are initially sent to the horizontal transfer path 56 supplied with the horizontal parallel drive signal φHP1 which is at level "H" at time t208, and are then sent to the horizontal transfer path 58 supplied with the horizontal parallel drive signal φHP2 which is at level "H" at time t210. Thus, in the present alternative embodiment, the dummy pixel D1, optically black pixel OB1, R pixel and the B pixel are sent in this sequence to the horizontal transfer path 56, while the dummy pixel D2, optically black pixel OB2, G pixel and the G pixel are sent in this sequence to the horizontal transfer path 58.

The signal charges on the horizontal transfer paths 56 and 58 are then sent to the output amplifiers 60 and 62, respectively. The output amplifier 60 outputs, as the output signal OS1, the dummy pixel D1, optically black pixel OB1, R pixel and the B pixel during the output periods t182, t184, t186 and t188, respectively, as shown in FIG. 25, part (F). On the other hand, the output amplifier 62 outputs, as the output signal OS2, the dummy pixel D2, optically black pixel OB2, G pixel and the G pixel, during the output periods t182, t184, t186 and t188, respectively, as shown in part (G).

Thus, in case the imaging unit 14 executes horizontal transfer under the driving condition of inverted branching, the horizontal transfer path 56 and the output amplifier 60 output the output signal OS1 indicating the color signals of the R and B pixels, while the horizontal transfer path 58 and the output amplifier 62 output the output signal OS2 indicating the color signals of the G pixels.

The operation of low-speed horizontal transfer by the solid state imaging apparatus 10a of the present alternative embodiment will now be described with reference to the timing chart of FIG. 26.

Figure 26:
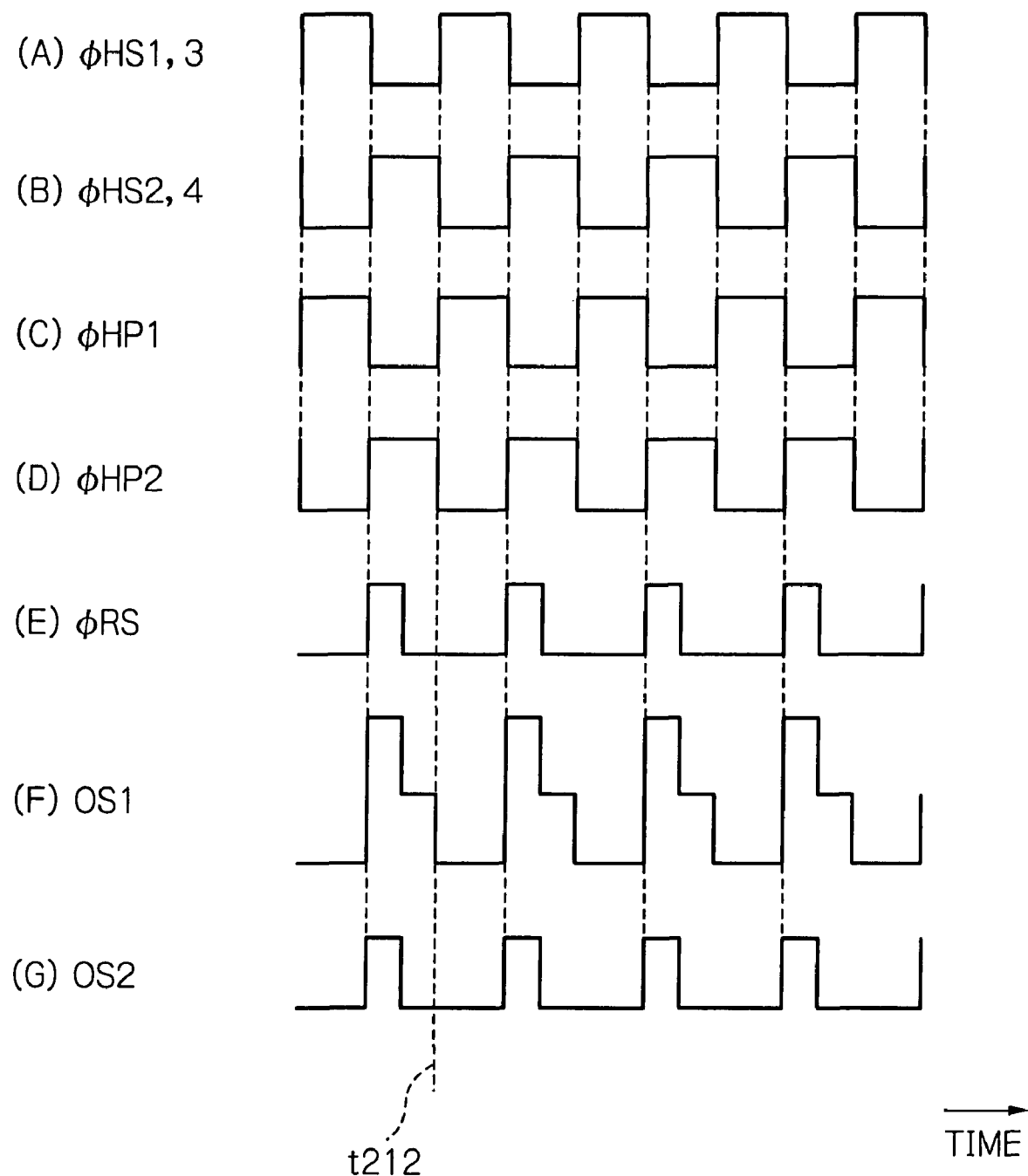
FIG. 26 is a timing chart also useful for understanding an operational sequence of horizontal transfer at the time of low-speed driving in the device of FIG. 1.
Figure 27:
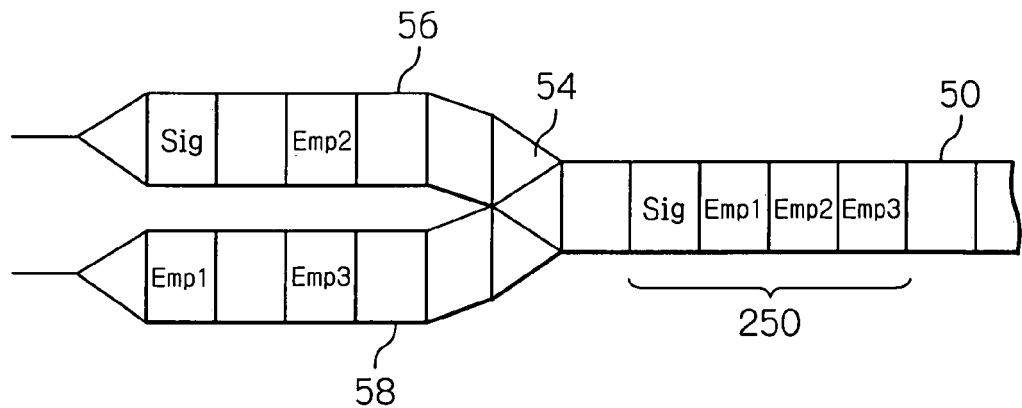
FIG. 27 schematically shows signal charges being transferred responsive to the horizontal timing signals of the initial driving condition at the time of transfer efficiency measurement on the horizontal transfer path in the device of FIG. 1.
Figure 28:
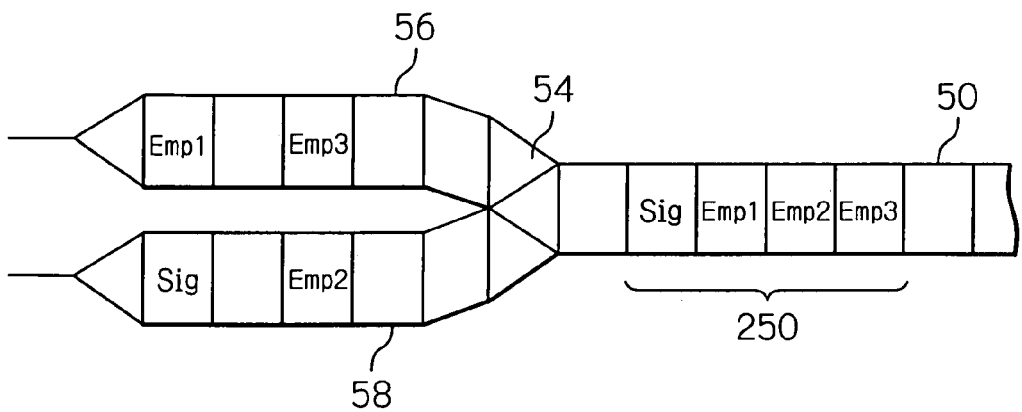
FIG. 28 schematically shows signal charges being transferred responsive to the horizontal timing signals of the inverted-branching driving condition at the time of transfer efficiency measurement on the horizontal transfer path in the device of FIG. 1.

FIG. 26, parts (A) to (G), show the operation in case the timing signal generator 32 sends a horizontal timing signal of the initial driving condition to the drivers 20. Specifically, in the figure, parts (A) and (B) show horizontal serial drive signals φHS1, φHS3 and φHS2, φHS4 which the HS driver 96 outputs to the horizontal transfer path 50. Parts (C) and (D) show the horizontal parallel drive signals φHP1 and φHP2, output by the HP driver 98 to the horizontal transfer paths 56, 58, respectively. Part (E) shows the reset signal φRS the RS deriver 100 outputs to the output amplifiers 60 and 62, and parts (F) and (G) show output signals OS1 and OS2 output from the output amplifiers 60 and 62, respectively.

In the present alternative embodiment, the horizontal serial drive signals φHS1, φHS3 and φHS2, φHS4 are output at the same frequency as that of the horizontal parallel drive signals φHP1 and φHP2. Referring to FIG. 26, when the drive signal φHS2 supplied to the last electrode HS2 of the horizontal transfer path 50 becomes "L" in level at time t212, while the drive signal φHP1 supplied to the electrode HP1 becomes "L" in level. The signal charges at the trailing end electrode HS2 are transferred at all times via branching section (HSL) 54 to the electrode HP1, that is, towards the horizontal transfer path 56.

With the device 44, the output amplifier 60 supplies an output signal OS1 indicating the color signal as shown in FIG. 26, part (F), while the output amplifier 60 supplies an output signal OS2 indicating the level "L" as shown in part (G).

Thus, during low speed driving, the device 44 supplies only the output signal OS1 on a single line without using the output signal OS2. Hence, the power supply of the output amplifier 62 may be turned off. It is preferred in this case to control the supply of the supply power of the amplifier power supply 16, responsive to the control signal 86 from the power supply control 122, to turn off the power supply 66.

During low-speed horizontal transfer, the system controller 28 and the timing signal generator 32 may control the drivers 20 to reverse the phase of the drive signals φHP1 and φHP2 or to reverse the phase of the drive signals φHS1, φHS3 and the phase of the drive signals φHS2, φHS4. By so doing, the device 44 may actuate only the horizontal transfer path 58 and the output amplifier 62 to output the output signal OS2 by sole line output.

By so doing, it is possible to switch between the one-line outputting and the two-line outputting extremely readily to make free output selection. If dynamic range preference is selected in case of low sensitivity, it is preferred to select the output amplifier with low sensitivity in charge detection, whereas, if sensitivity preference is selected in case of high sensitivity, it is preferred to select the output amplifier with high sensitivity in charge detection.

A further alternative embodiment of the operation of measuring the transfer efficiency in the solid state imaging apparatus 10a will now be described.

In the present apparatus 10a, signal charges are mixed on the horizontal transfer path 50 by horizontal pixel mixing, for measuring the transfer efficiency on the branching section 54 and on the horizontal transfer paths 56 and 58. The drivers 20 control the driving of the imaging unit 14 in order to provide for two-channel outputting on the branching section 54 and on the horizontal transfer paths 56 and 58.

By this horizontal pixel mixing, the horizontal transfer path 50 accumulates a pixel of a reference signal, obtained on mixing plural signal charges, and void pixels, deprived of signal charges by this mixing. The horizontal transfer path 50 repeatedly generates pixel groups 250, each composed of plural pixels, more specifically, each composed of the pixel of the reference signal Sig followed by two or more void pixels Emp1 and Emp2. The horizontal transfer path 50 horizontally transfers the pixel groups 250, each made up of the pixel Sig, Emp1 and Emp2, towards the branching section 54.

In case the branching section 54 and the horizontal transfer paths 56 and 58 are driving-controlled, responsive, e.g. to the horizontal timing signal of the initial driving condition, the branching section 54 sends the pixel Sig and the second void pixel Emp2 to the horizontal transfer path 56, while sending the first void pixel Emp1 to the horizontal transfer path 58.

In this case, the signal charge left over at the time of transfer of the pixel Sig of the reference signal in the course of horizontal transfer on the horizontal transfer path 56 is intruded into the second void pixel Emp2, while the signal charge left over at the time of transfer of the pixel Sig of the reference signal in the course of horizontal transfer from the branching section 54 onto the horizontal transfer path 58 is intruded into the first void pixel Emp1.

The amount of signal charges combined from the first void pixel Emp1 and the second void pixel Emp2, that is, the amount of the residual charges 232, left over on the horizontal transfer path 56 until the pixel Sig gets to the output amplifier 60, as it travels from the branching section 54 through the horizontal transfer path 56, is varied with the pixel Sig of the reference signal, that is, with the quantity of the reference signal charges.

The output amplifier 60 then outputs the output signal 82 including the pixel Sig of the reference signal and the second void pixel Emp2. The pre-processor 22 generates a digital signal 110 by processing this output 82 to store the digital signal in the memory 24. In similar manner, the horizontal transfer path 58 and the output amplifier 62 output the output signal 84 including the first void pixel Emp1, and the pre-processor 22 generates a digital signal 112 by processing this output 84 to store the digital signal 112 in the memory 24.

The signal processor 26 reads out the pixel of the reference signal Sig and the first and second void pixels Emp1 and Emp2 from the memory 24, as digital signal 118, over bus 114 and signal line 120.

Figure 30:
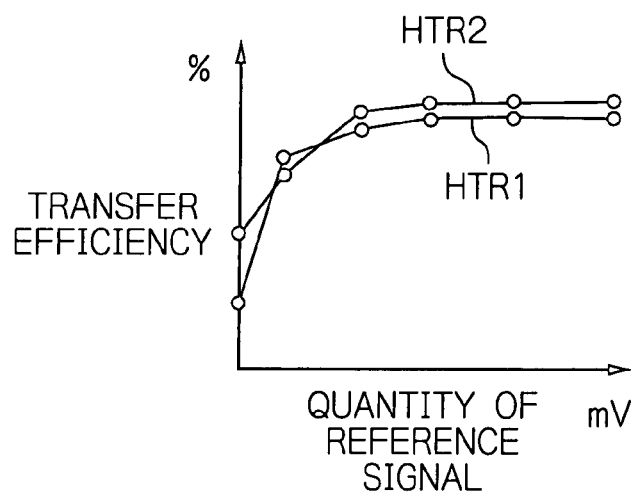
FIG. 30 is a graph showing the relationship between the transfer efficiency and the quantity of the reference signals.

In the signal processor 26, the transfer efficiency measurement unit 500 may acquire a residual transfer charge quantity 232 on the horizontal transfer path 56, based on the first void pixel Emp1 and the second vacant pixel Emp2. The transfer efficiency measurement unit may then calculate the horizontal transfer efficiency HTR11 pertinent to transfer from the branching section 54 to the horizontal transfer path 56, of the horizontal transfer efficiency (HTR) on the horizontal transfer path 56, based on the charge of the reference signal Sig and the residual transfer charge Emp1. The transfer efficiency measurement unit also may calculate the horizontal transfer efficiency HTR12 pertinent to the transfer on the horizontal transfer path 56 up to the electrode OG and the section FD, based on the quantity of the charge of the reference signal Sig and that of the residual transfer charge Emp2. The transfer efficiency measurement unit 500 may calculate the horizontal transfer efficiency HTR11, using an expression: HTR11= (Sig−Emp1)/Sig×100, while it may calculate the horizontal transfer efficiency HTR12, using an expression: HTR12= (Sig−Emp2)/Sig×100. The horizontal transfer efficiencies HTR11 and HTR12 are varied responsive to the charge quantity of the reference signal Sig as shown in FIG. 30.

In case the branching section 54 and the horizontal transfer paths 56 and 58 are driving-controlled under the driving condition of reversed branching, with the horizontal timing signal being offset from that of the initial driving condition, the branching section 54 sends the first void pixel Emp1 to the horizontal transfer path 58, while sending the pixel of the reference signal Sig and the second void pixel Emp2 to the horizontal transfer path 56.

Figure 29:
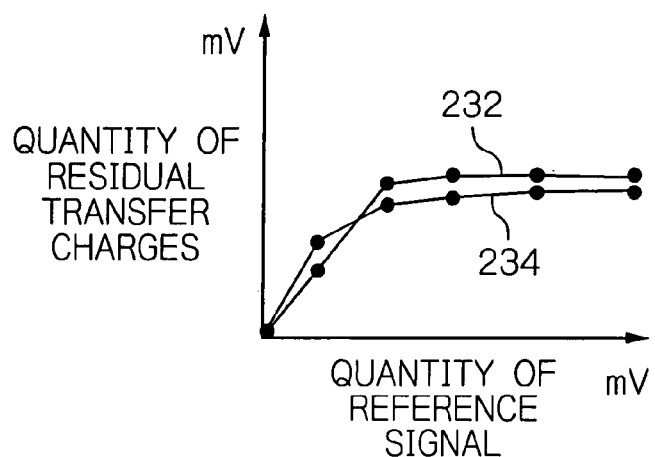
FIG. 29 is a graph showing the relationship between the quantity of residual transfer charges and the quantity of reference signals on two branching transfer paths in the device of FIG. 1.

The signal charge left over at the time of transfer of the pixel Sig of the reference signal, in the course of horizontal transfer on the horizontal transfer path 58 from the branching section 54 is intruded into the first void pixel Emp1, while the signal charge left over at the time of transfer of the pixel Sig of the reference signal in the course of horizontal transfer from the branching section 54 onto the horizontal transfer path 58 is intruded into the second void pixel Emp2. The amount of signal charges combined from the void pixels Emp1 and Emp2, that is, the amount of the residual charge 232 left over on the horizontal transfer path 58 until the pixel Sig gets to the output amplifier 62, as it travels from the branching section 54 through the horizontal transfer path 58 is varied with the quantity of the reference signal charges as shown in FIG. 29.

The output amplifiers 60, 62 then output the output signal 82 including the first void pixel Emp1, and the output signal 84 including the pixel of the reference signal Sig and the second void pixel Emp2. The pre-processor 22 stores digital signals 110, 112, derived from the output signals 82 and 84, respectively, in the memory 24.

The signal processor 26 reads out the first void pixel Emp1, pixel of the reference signal Sig and the second void pixel Emp2 from the memory 24 as digital signal 118, over a bus 114 and a signal line 120.

In the signal processor 26, the transfer efficiency measurement unit 500 may acquire a residual transfer charge quantity 234 on the horizontal transfer path 58, based on the first vacant pixel Emp1 and the second vacant pixel Emp2. The transfer efficiency measurement unit may then calculate the horizontal transfer efficiency HTR21 pertinent to transfer from the branching section 54 to the horizontal transfer path 58, out of the horizontal transfer efficiency (HTR) on the horizontal transfer path 58, based on the charge of the reference signal Sig and the residual transfer charge Emp1. The transfer efficiency measurement unit also may calculate the horizontal transfer efficiency HTR12 pertinent to transfer on the horizontal transfer path 58 up to the electrode OG and the section FD, based on the charge of the reference signal Sig and the residual transfer charge Emp2. The transfer efficiency measurement unit 500 may calculate the horizontal transfer efficiency HTR21, using an expression: HTR21=(Sig−Emp1)/Sig×100, while it may calculate the horizontal transfer efficiency HTR22, using an expression: HTR22=(Sig−Emp2)/Sig×100. The horizontal transfer efficiency HTR21 and the horizontal transfer efficiency HTR22 are varied responsive to the charge of the reference signal Sig as plotted in FIG. 30.

The transfer efficiency measurement unit 500 may measure one or both of the horizontal transfer efficiencies HTR11 and HTR12, while it may also calculate one or both of the horizontal transfer efficiencies HTR21 and HTR22, and use the measured results for determining the horizontal transfer efficiencies of the horizontal transfer paths 56 and 58. In the present alternative embodiment, it is particularly preferred to decide on the horizontal transfer efficiency based on the amount of residual charges left over from R and B pixels to the G pixel at the branching section 54, and to measure only the residual transfer charge attributable to the branching section 54, that is, the horizontal transfer efficiencies HTR11 and HTR22, for use in determining the horizontal transfer efficiency.

The transfer efficiency measurement unit 500 may compare the horizontal transfer efficiencies HTR11 and HTR21 to verify which of the horizontal transfer paths 56 and 58 is better in the transfer efficiency. It is noted that the transfer efficiency measurement unit 500 may compare the horizontal transfer efficiencies HTR11 and HTR21 based on the quantity of the charges at a sole point, or may calculate evaluation values of the horizontal transfer efficiencies HTR11 and HTR21 based on the quantities of the charges at plural points.

The present apparatus 10a captures a preset subject in advance to measure the transfer efficiency. In the present alternative embodiment, the apparatus may capture plural different subjects to obtain reference signal charge quantities and residual charges at plural points. The transfer efficiency measurement unit 500 may then calculate the horizontal transfer efficiencies HTR11 and HTR21 at plural points for comparison and verification.

In the present alternative embodiment, a plural number of groups 250, each made up of a pixel of a reference signal Sig followed by two or more void pixels Emp1 and Emp2, may be generated in succession by horizontal pixel mixing on the horizontal transfer path 50. To this end, the horizontal transfer path 50 may be driven in a horizontal eight pixel mixing system to formulate the pixel group 250 each made up of a pixel of a reference signal Sig followed by three void pixels Emp1, Emp2 and Emp3.

The operation of driving the horizontal transfer path 50 in accordance with the horizontal eight pixel mixing system, in the solid state imaging apparatus 10a of the present alternative embodiment, will now be described with reference to the timing chart of FIG. 30 and potential transition diagrams of FIGS. 32A through 32I.

In the potential transition diagrams of FIG. 32A through 32I, there are shown the potential levels and signal charges retained on the horizontal transfer path 50. Transfer elements HS4, HS1, HS2, HS3, HS2, HS1, HS4, HS3 and HS4 are formed in the transfer path 50 in this sequence from its end neighboring to the branching section 54 towards its opposite end. The signal charge of each transfer element is transferred towards left, that is, towards the forward side transfer element.

Figure 31:
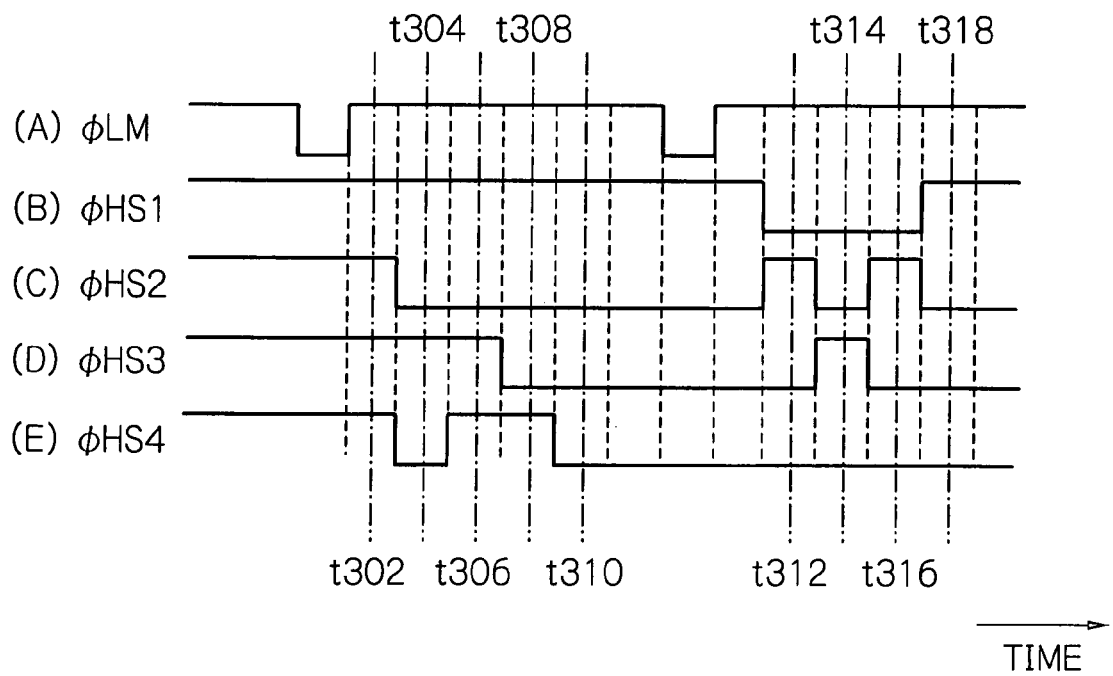
FIG. 31 is a timing chart useful for understanding the operational sequence of mixing of horizontal pixels on a horizontal transfer path before branching in the device of FIG. 1.

On the horizontal transfer path 50 of the present alternative embodiment, horizontal eight pixel mixing is carried out during the horizontal blanking period such that signal charges of the group 250 composed of the transfer elements HS1, HS2, HS3, HS2, HS1, HS4, HS3 and HS4 are mixed together. Referring to FIG. 31, part (A), signal charges are transferred to the horizontal transfer path 50, responsive to the drive signal φLM supplied to the line memory LM. The signal charges are mixed together on the horizontal transfer path 50, under driving control by the horizontal serial drive signals 74, such as drive signals φHS1, φHS2 and φHS3, φHS4, supplied from the HS driver 96, as shown in FIG. 31, parts (B) to (E).

When the drive signal φLM shown in FIG. 31, part (A), becomes "H" in level at time t302, signal charges are transferred from the line memory LM to the packets generated directly underneath the electrodes of the transfer elements HS1 to HS4 on the horizontal transfer path 50, because the drive signals φLM and the signals φHS1 to φHS4 shown in FIG. 31, parts (B) to (E) are all at level "H". Referring to FIG. 32A, the potential level of each of the transfer elements HS1 to HS4 in the state of time t302 is reference level 300.

If the level "L" drive signals φHS2, φHS4 are then supplied at time t304 to the transfer elements HS2 and HS4, the potential level becomes higher at the transfer elements HS2 and HS4 as shown in FIG. 32B, so that the signal charges are transferred to the forward side transfer elements HS1 and HS3.

At time t306, the drive signal φHS4 at level "H" is supplied to the transfer element HS4, so that the potential level reverts to the reference level 300.

Figure 32D:
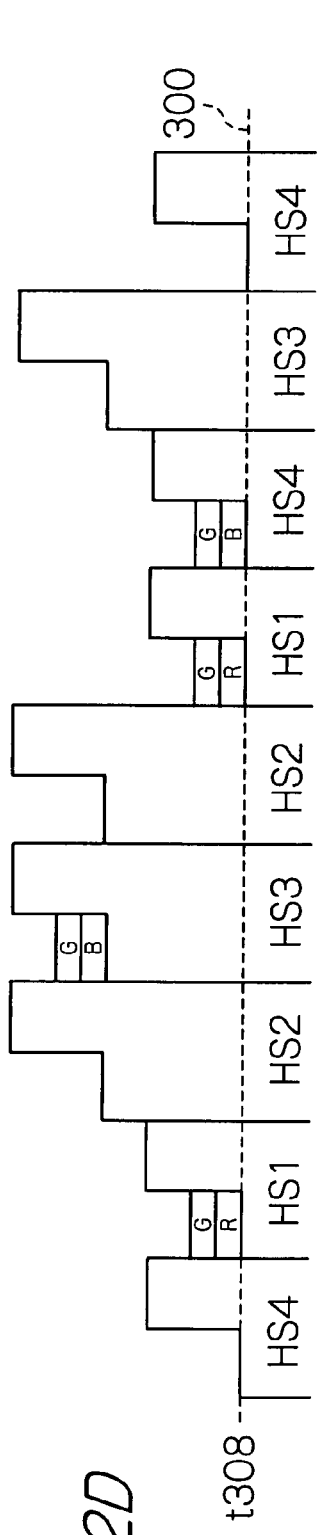

If the level "L" drive signal φHS3 is then supplied at time t308 to the transfer element HS3 as shown in FIG. 32D, the potential level becomes higher at the transfer element HS3. Thus, if the forward side transfer element is HS2, which is of the same potential level, the signal charge is maintained at the transfer element HS3. However, if the forward side transfer element is HS4, which is low in potential level, the signal charge at the transfer element HS3 is transferred.

Figure 32E:
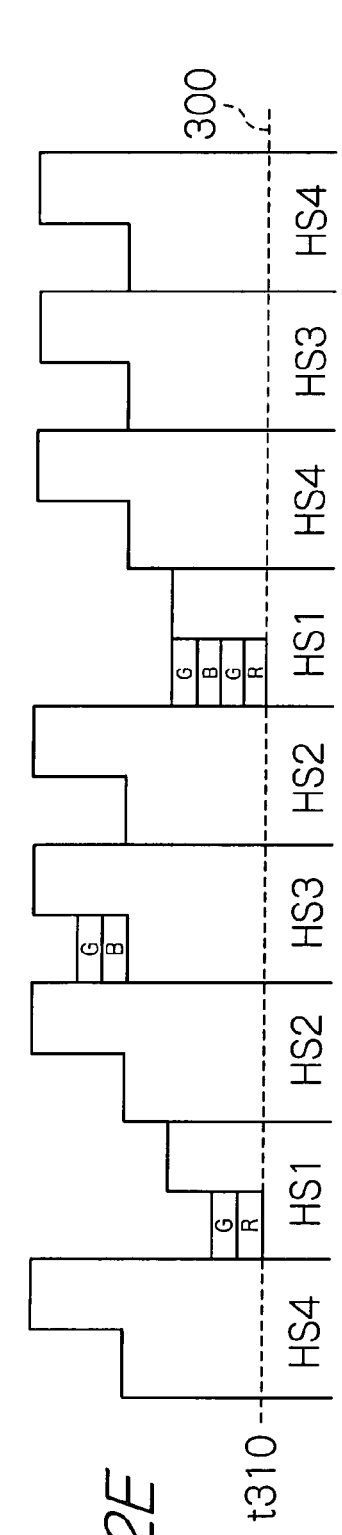

At time t310, the drive signal φHS4 at level "L" is supplied to the transfer element HS4 to raise the potential level as shown in FIG. 32E, so that the retained signal charges are transferred to the forward side transfer element HS1.

Figure 32F:
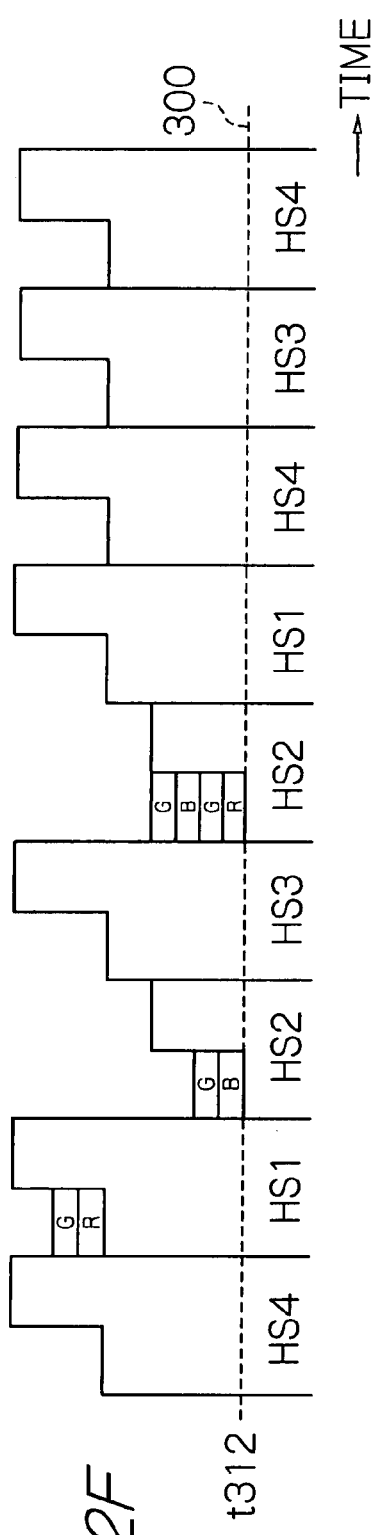
Figure 33:
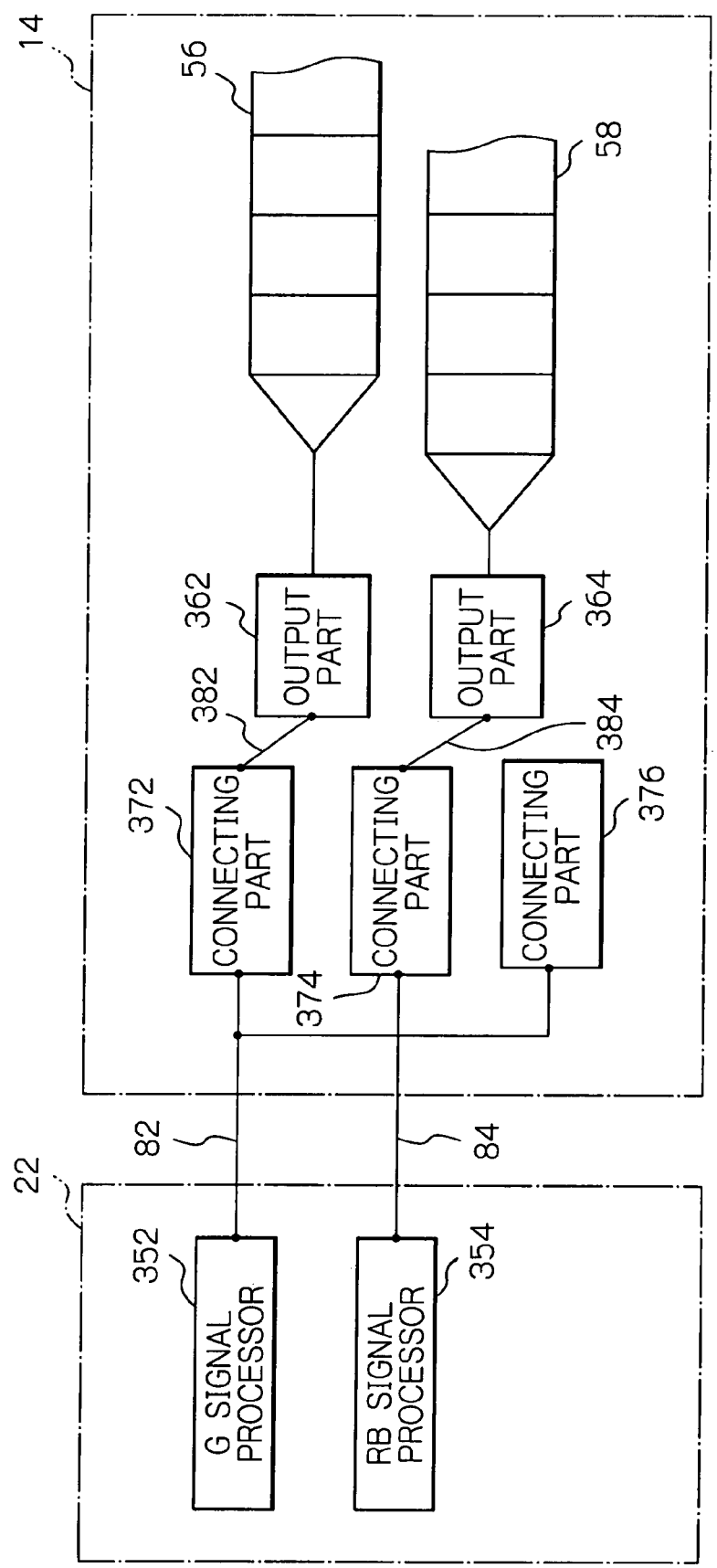
FIGS. 33 and 34 are block diagrams schematically showing changes in the output destination, consistent with the transfer efficiency on the branching horizontal transfer paths in the device of FIG. 1.
Figure 34:
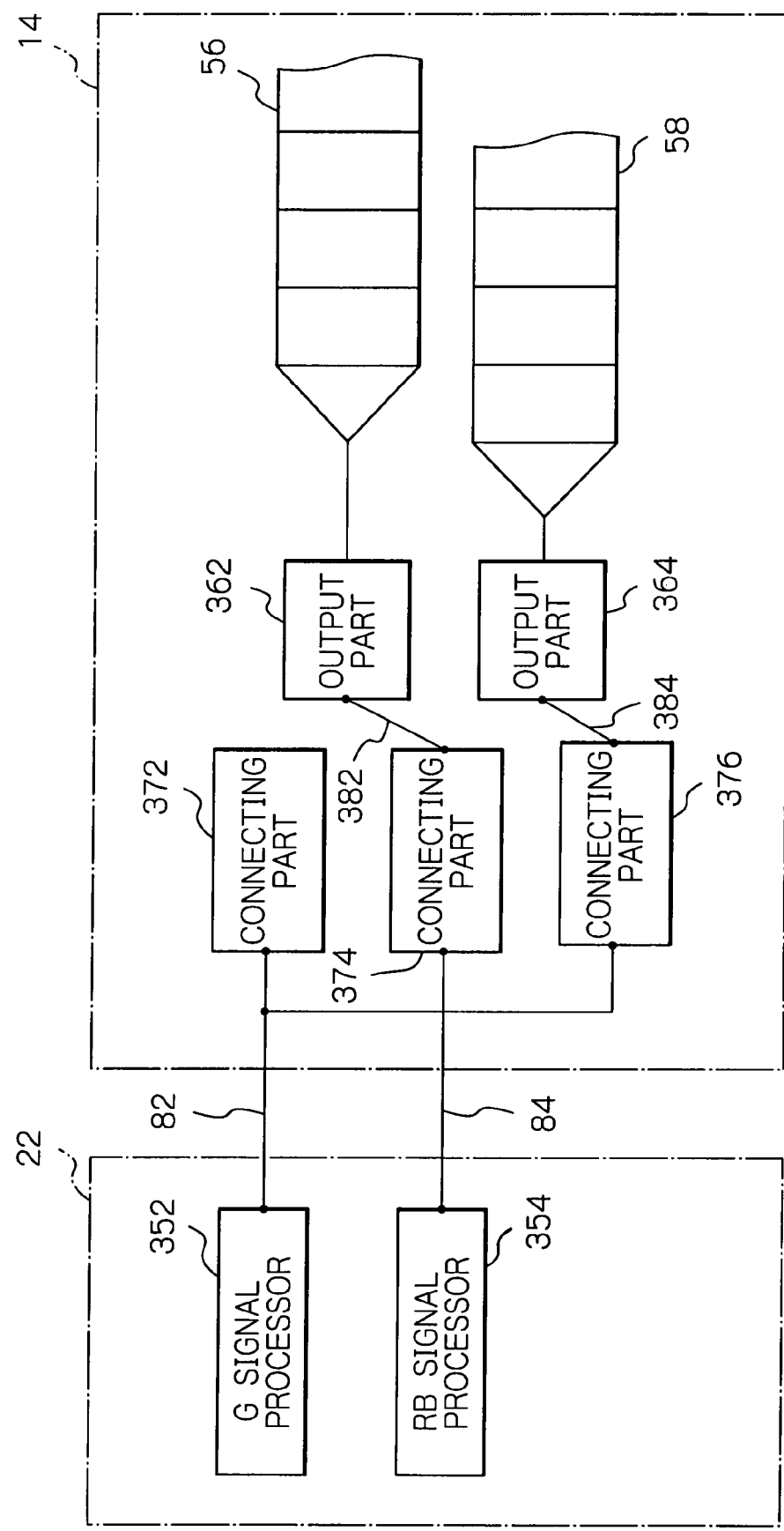

At time t312, the level "L" drive signal φHS1 is supplied to the transfer element HS1 to raise the potential level as shown in FIG. 32F. The level "H" drive signal φHS2 is supplied to the transfer element HS2 so that the potential level reverts to the reference level 300. The signal charge is transferred from the high potential level transfer element HS1 to the forward side low potential level transfer element HS2. A signal charge is also transferred from the rearward high potential level transfer element HS3 to the transfer element HS2 which has become lower in potential level.

At time t314, the level "L" drive signal φHS2 is supplied to the transfer element HS2 to raise the potential level as shown in FIG. 32G. The level "H" drive signal φHS3 is supplied to the transfer element HS3 so that the potential level reverts to the reference level 300. The signal charge is transferred from the high potential level transfer element HS2 to the forward side low potential level transfer element HS3.

At time t316, the level "H" drive signal φHS2 is supplied to the transfer element HS2, so that the potential level reverts to the reference level 300 as shown in FIG. 32H. The level "L" drive signal φHS3 is supplied to the transfer element HS3 to raise the potential level. The signal charge is transferred from the high potential level transfer element HS3 to the forward side low potential level transfer element HS2.

At time t318, the level "H" drive signal φHS1 is supplied to the transfer element HS1, so that the potential level reverts to the reference level 300 as shown in FIG. 32I. The level "L" drive signal φHS2 is supplied to the transfer element HS2 to raise the potential level. The signal charge is transferred from the high potential level transfer element HS2 to the forward side low potential level transfer element HS1.

In this manner, the signal charges of the group 250 composed of the transfer elements HS1, HS2, HS3, HS2, HS1, HS4, HS3 and HS4, are transferred to the foremost transfer element HS1, as the signal charges undergo the horizontal eight pixel mixing process.

Figure 35:
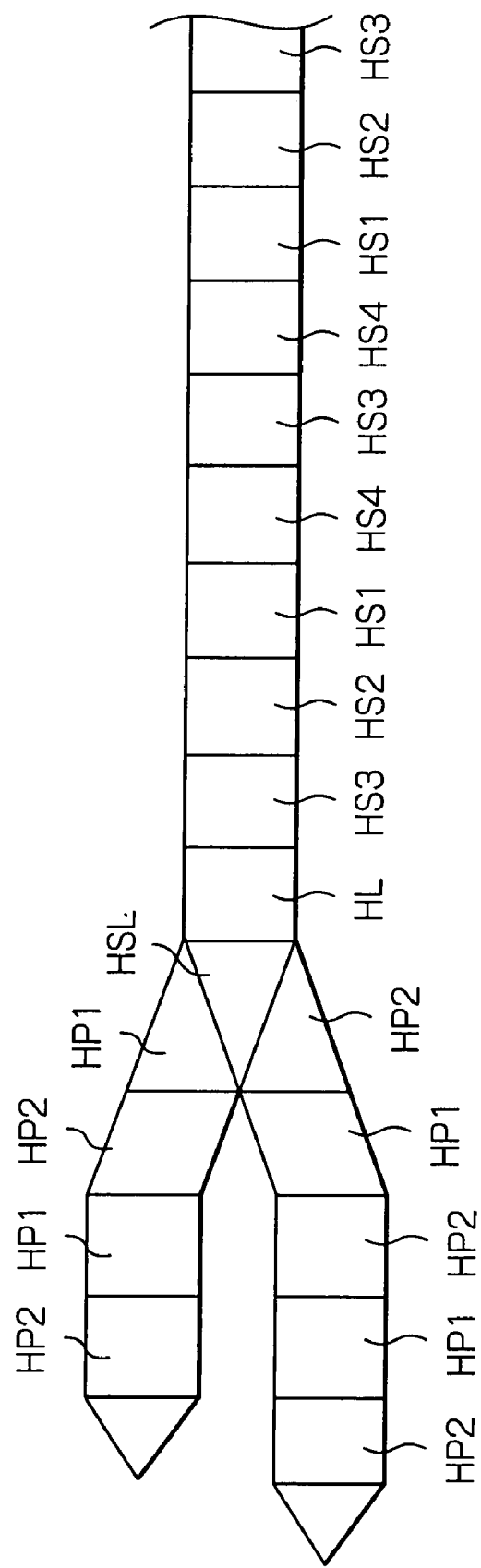
FIG. 35 schematically shows horizontal transfer paths in the device of FIG. 1, looked from above.

The pre-processor 22 may be composed of a G pixel processor 352 suited for processing G pixels, and an RB pixel processor 354 suited for processing R and B pixels as shown in FIG. 35. It is necessary in this case to supply an electrical signal of the G pixel and an electrical signal of the R and B pixels, out of the electrical signals 82 and 84 supplied from the imaging unit 14, to the G pixel processor 352 and to the RB pixel processor 354, respectively.

In the present alternative embodiment, output units 362, 364 are connected to the output amplifiers 60 and 62 of the imaging unit 14. A connection unit 372 and another connection unit 374 are connected to the connection line 82 outputting the aforementioned electrical signal, and a connection unit 376 is connected to the connection line 84 outputting the aforementioned electrical signal. The electrical connection between the connection units and the output amplifiers is changed responsive to measured results by the transfer efficiency measurement unit 500.

Figure 36:
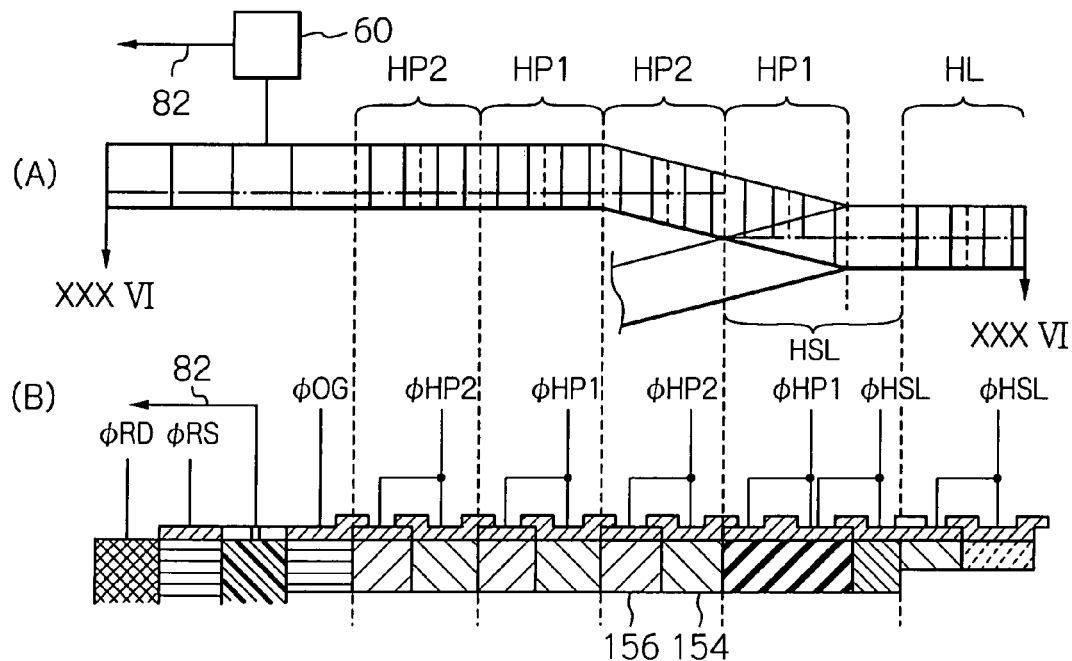
FIG. 36, parts (A) and (B) are a schematic plan view and a schematic cross-sectional view of one of the horizontal transfer paths shown in FIG. 35, respectively.

The transfer efficiency of the imaging unit 14 is measured by, e.g. a test on a silicon wafer (probe test). Based on the results of measurement of the transfer efficiency, it is verified which of the horizontal transfer paths 56 and 58 has a better transfer efficiency. If it is the horizontal transfer path 58 that has a better transfer efficiency, the output unit 362 may be connected to the connection unit 372, while the output unit 364 may be connected to the connection unit 374 as shown in FIG. 35. If conversely the horizontal transfer path 56 has the better transfer efficiency, the output unit 362 may be connected to the connection unit 374, while the output unit 364 may be connected to the connection unit 376 as shown in FIG. 36.

By so doing, when the present apparatus 10a is operated with high-speed driving, the output signal 82 of the imaging unit 14 is at all times for the G pixel, which is processed by the G pixel processor 352, while the output signal 84 is at all times for the R pixel and the B pixel, which are processed by the RB pixel processor 354. It is therefore possible to avoid switching of the processing or the electrical connection outside the imaging unit 14.

In the imaging unit 14, the output units 362 and 364 and the connection units 372, 374 and 376 may be formed by bonding pads, while connection lines 382, 384 interconnecting the connection and output units may be formed by wires the connections of which may be changed as desired. It is necessary for these wires 382, 384 to be connected without physical contact or intersection in order to avoid cross-talk in the transmitted signals.

In case the present apparatus 10a is used for capturing a subject with low color temperature, for example, the signal charge obtained at the R pixel photosensitive cell is great and that at the B pixel photosensitive cell is small. If the signal charges are transferred in the order of the R pixel, G1 pixel, B pixel and the G2 pixel on the horizontal transfer path 50 towards the branching section 54, the amount of the charge left over by the forward side R pixel and intruded into the rear side G1 pixel is greater than the amount of charge mixing that occurs between the forward side B pixel and the rear side G2 pixel. This is because the amount of charge mixing, that is, the amount of residual transfer charges, is increased with increase in the signal quantity as shown in FIG. 29. Hence, there is produced the difference between the signal quantity of the G1 pixel and that of the G2 pixel, even though the pixels are of the same color, this difference in the signal quantity affecting the ultimate image as a fixed pattern noise.

With the solid state imaging apparatus 10a of the present invention, in which, when the signal charges are sent from the branching section 54 via horizontal transfer paths 56 or 58 and output from the output amplifier 60 or 62, the R and B pixels, in particular, are output on the horizontal transfer path with higher transfer efficiency, it is possible to prevent charges from being left over from the R and B pixels to prevent charge mixing into the G pixel.

A further modification of the present invention will now be described. In this modification, deterioration in the transfer efficiency in the branching electrode is to be precluded. In the present alternative embodiment, two horizontal transfer paths 56 and 58 are connected to the branching section 54, which branching section divides signal charges into two parts which are to be supplied to the horizontal transfer paths 56 and 58. The present invention is, however, not limited to this configuration. That is, the number of the horizontal transfer paths provided in the branching section may be optionally set, and branching may optionally be made in keeping with the number of the horizontal transfer paths.

Figure 37:
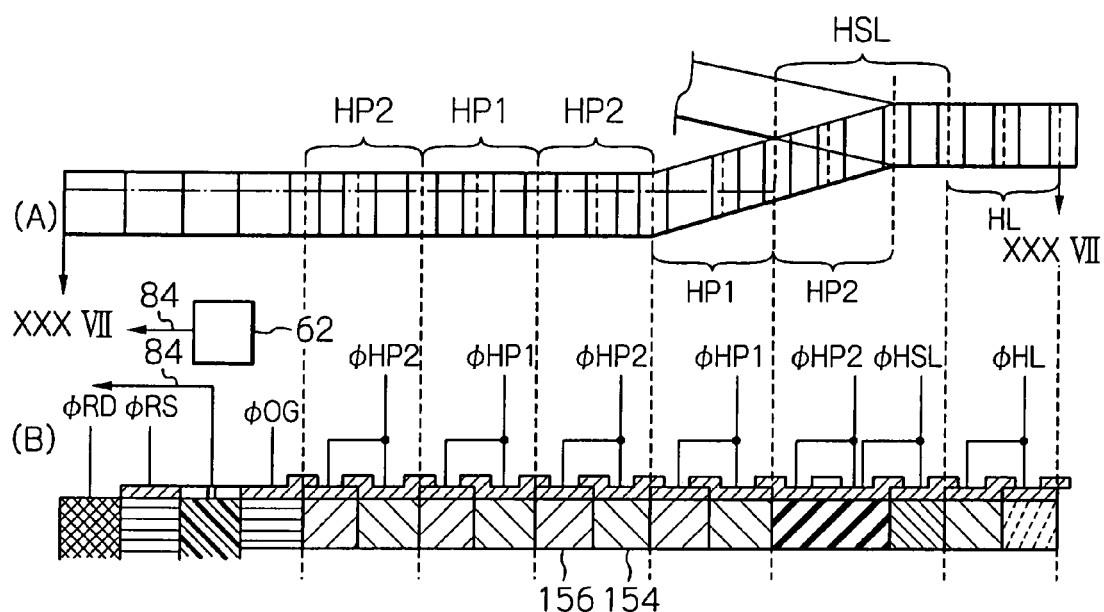
FIG. 37, parts (A) and (B) are a schematic plan view and a schematic cross-sectional view of the other of the horizontal transfer paths shown in FIG. 35, respectively.

In the solid state imaging device 44 including the branching section 54, analog electrical signals are read out, for example, in the following manner. FIG. 35 schematically shows the horizontal transfer paths of the device in a plane view. FIG. 36, part (A), schematically shows the horizontal transfer paths 50 and 56 shown in FIG. 35, to an enlarged scale. FIG. 36, part (B), schematically shows, in cross-section, taken along a chain-dotted line XXXVI-XXXVI in part (A). FIG. 37, part (A), schematically shows the horizontal transfer paths 50 and 58 shown in FIG. 35, to an enlarged scale. FIG. 37, part (B), schematically shows, in cross-section, the horizontal transfer paths 50 and 58, taken along a chain-dotted line XXXVII-XXXVII in part (A).

In the present alternative embodiment, signal charges are transferred on the horizontal transfer path 50 in the order of the G, R, G, B in terms of the color attributes. In the branching section 54, the signal charges with the color attributes of R and B are branched to the horizontal transfer path 56, while the signal charges with the color attributes of G are branched to the horizontal transfer path 58. A plural number of the transfer elements are formed on the horizontal transfer paths 50, 56 and 58. Each transfer element is made up of two electrodes of polycrystalline silicon (polysilicon) and two impurity layers in the vicinity of the surface of the silicon substrate. The two impurity layers lying underneath the two electrodes differ from each other in constitution. Thus, when the equi-potential drive signals are applied, stepped potential levels are generated. The branching section 54 is similarly a transfer element including two electrodes. In the following, the transfer element and the two electrodes included in the element are denoted by the same reference numeral. For example, the branching section 54 denotes the transfer element, while the electrode 54 denotes two electrodes of the branching section 54.

On the horizontal transfer path 50, there are formed polysilicon electrodes HS2, HS1, HS4, HS3, HS4, HS1, HS2 and HS3 in this order from the right side towards the electrode HSL of the branching section 54 lying on the left side as shown in FIG. 35. This set of the polysilicon electrodes constitutes a repetitive unit. An electrode HL is provided adjacent to the right side of the electrode HSL, that is, adjacent to the left side of the electrode HS3 on the output end of the horizontal transfer path 50 in FIG. 35. The electrode HL is equivalent to the electrode HS2 on the right side of the electrode HLS in FIGS. 4 and 6 to 8. The electrode HL will be described in detail subsequently.

Figure 38:
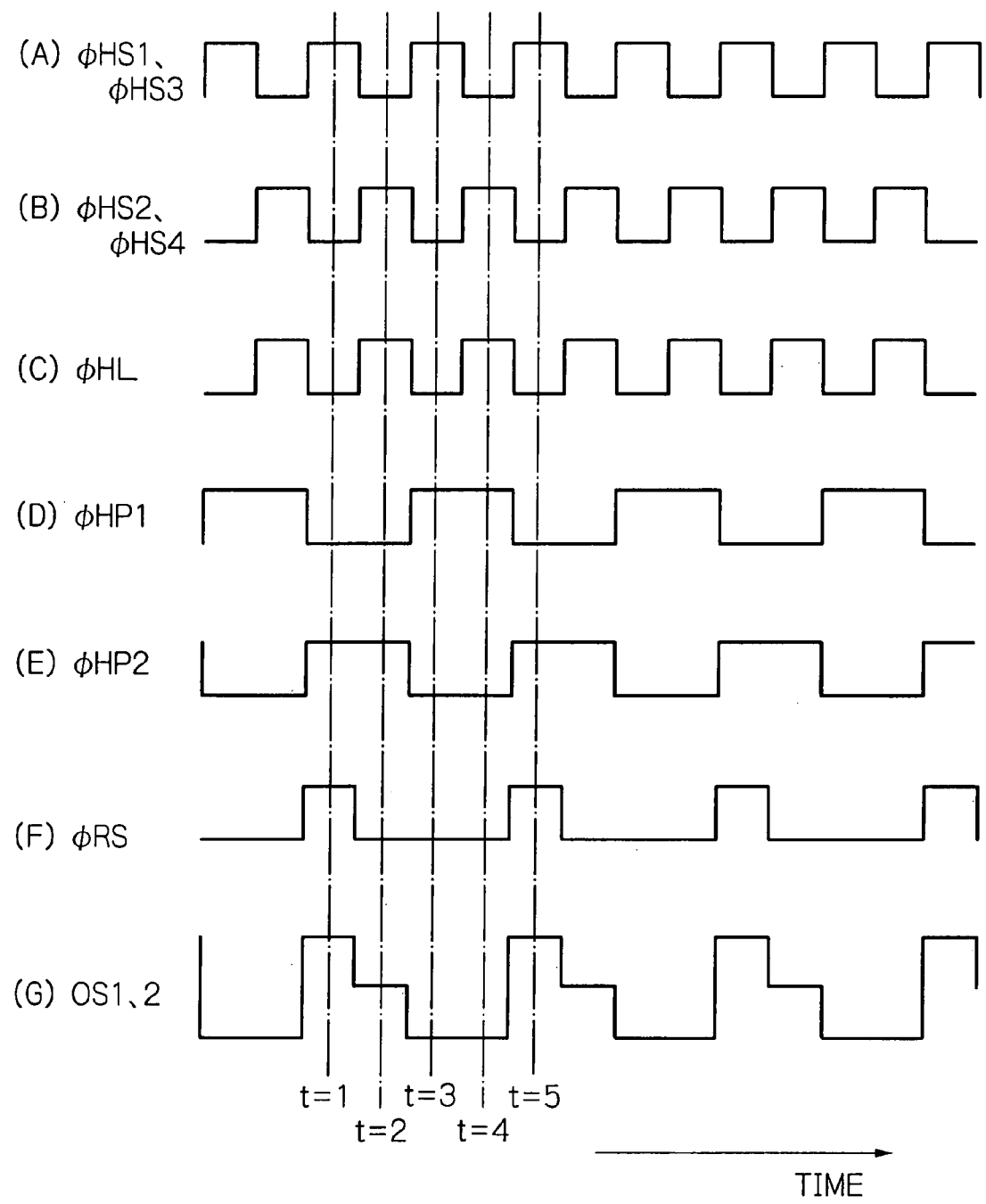
FIG. 38 is a timing chart showing the timing of drive signals supplied to the respective electrodes shown in FIG. 35.

On the horizontal transfer path 56, there are sequentially formed four polysilicon electrodes HP1, HP2, HP1, HP2 and an OG (output gate) electrode, from the electrode HSL of the branching section 54 towards the output amplifier 60, as shown in FIGS. 37 and 38.

Figure 39:
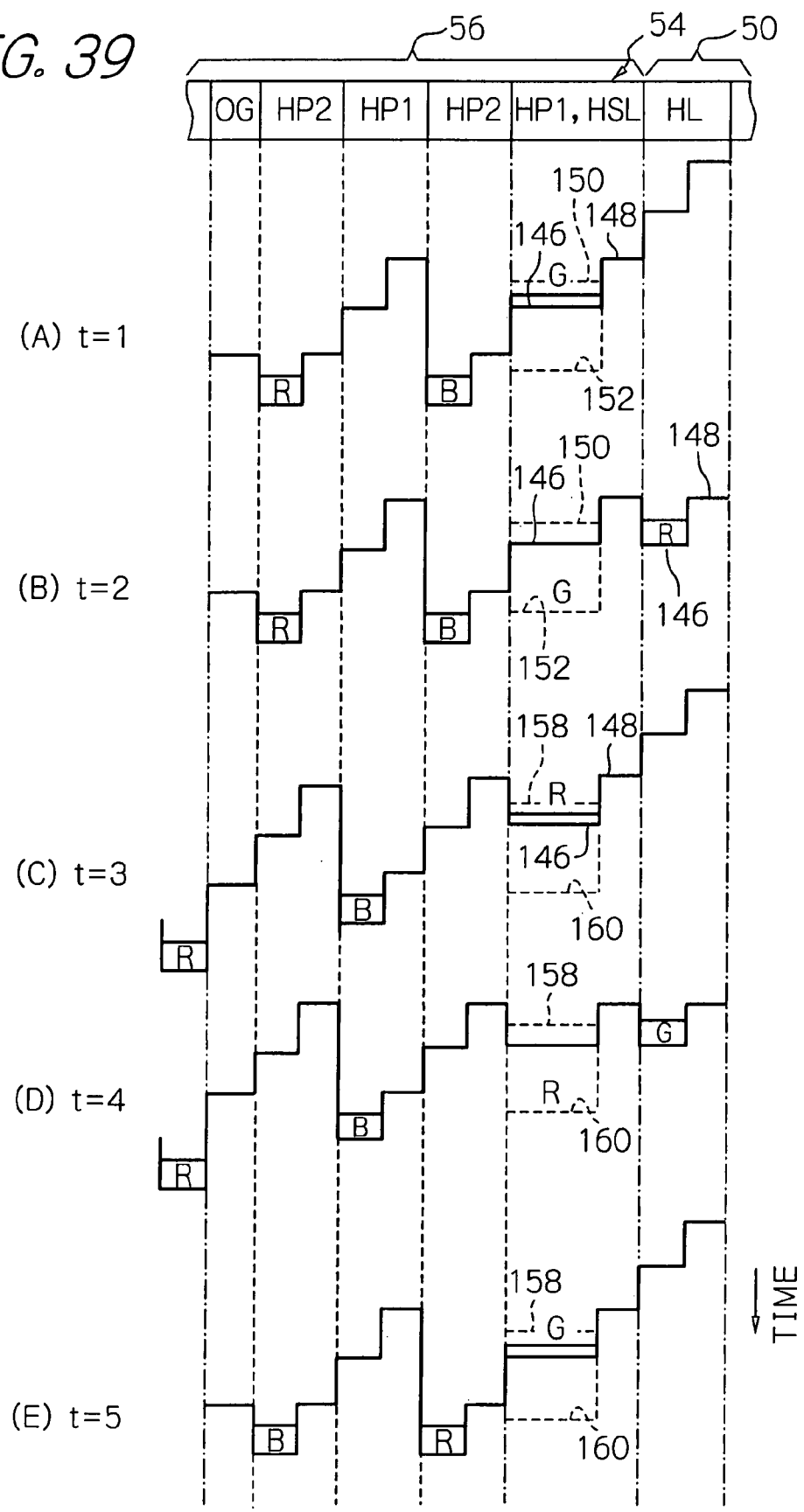
FIG. 39 is a schematic potential diagram showing the state of transfer of signal charges on the horizontal transfer path in FIG. 36.

On the horizontal transfer path 58, there are sequentially arranged five polysilicon electrodes HP2, HP1, HP2, HP1, HP2 and an OG (output gate) electrode, from the electrode HSL of the branching section 54 towards the output amplifier 62, as shown in FIGS. 37 and 39.

Directly below the electrodes within the P-type silicon substrate not shown, there are formed impurity layers, as shown from imaginary cross-sectional surfaces of the left end reset drain RD to the electrode HP1 of the horizontal transfer path 56 and thence further to the electrode HL of the horizontal transfer path 56, as indicated from a chain-dotted line XXXVI-XXXVI of FIG. 36.

Turning to the drive signal supplied to the respective electrodes, drive signals $\phi$HS1, $\phi$HS2 and $\phi$HS3 and $\phi$HS4 are supplied to the electrodes HS1, HS2, HS3 and HS4, respectively. The drive signal $\phi$HSL is supplied to the electrode HSL, in a manner not shown, and is a constant bias voltage. The drive signal $\phi$HL is supplied to the electrode HL. The timing for these drive signals is shown in FIG. 38.

The flow of signal charges transferred horizontally by those drive signals will now be described. FIGS. 41A through 41E and 42 show the potential levels generated on the horizontal transfer paths 50, 56 and 58 when the drive signals are applied thereto. FIG. 43 shows the state of signal charge transfer at this time, as seen from above the horizontal transfer paths. The timings shown in FIGS. 41A through 41E, 42 and 43 correspond to those shown in FIG. 38. For example, the timing of FIG. 41A, FIG. 42, part (A) and 43A corresponds to time t=1 in FIG. 38. The same applies for the other timings as well.

Figure 40:
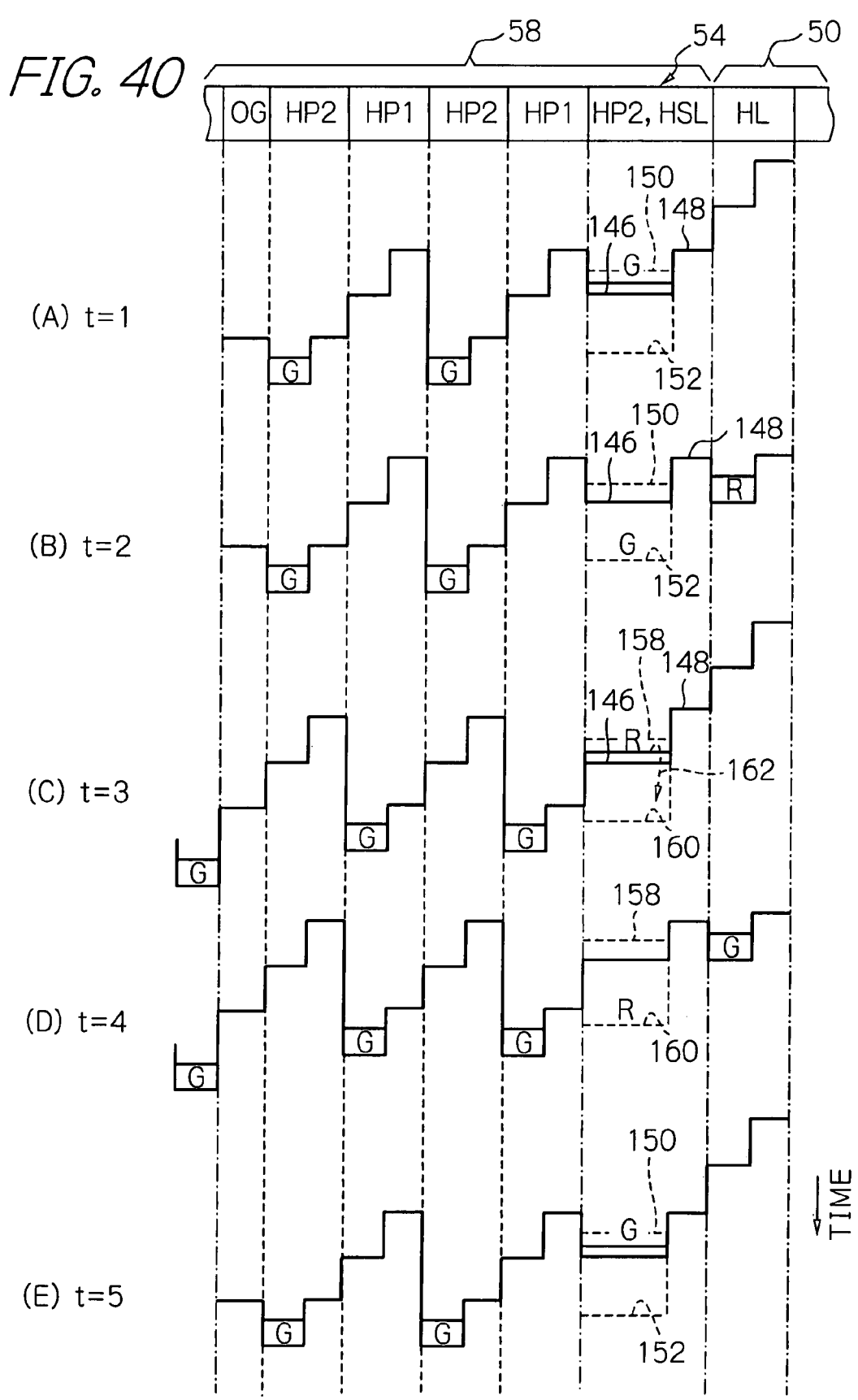
FIG. 40 is a schematic potential diagram showing the state of transfer of signal charges on the horizontal transfer path in FIG. 37.

FIG. 39 shows the potential for the horizontal transfer paths 50 and 56. A simplified diagram of FIG. 36, part (B), is also shown in FIG. 39 for showing the potential level positions. Similarly, FIG. 40 shows the potential for the horizontal transfer paths 50 and 58. A simplified diagram of FIG. 37, part (B), is also shown in FIG. 40 for showing the potential level positions. FIGS. 41A through 41E, 42 and 43 are substantially the same as FIGS. 4 and 6 through 9E and hence the description therefor is dispensed with.

Heretofore, the solid state imaging unit 44 suffers from the problem that, if the transfer efficiency is deteriorated in the branching section 54, the signal charges left over affect signal charges of the remaining pixels, with the signal charges thus left over becoming a fixed pattern noise in the image formed.

Specifically, assuming a case in which signal charges transferred in the sequence of color attributes G, R, G, B, are branched at the branching section 54, and the signal charges R and B are transferred on the horizontal transfer path 50, while the signal charge G is transferred on the horizontal transfer path 58, as shown in FIGS. 41A through 41E, 42 and 43. When the deterioration in the transfer efficiency, that is, transfer deterioration, has occurred on the branching section 54, part of the signal charge R left over is mixed into the next signal charge, that is, the signal charge G. In particular, if the signal charges are those obtained on shooting a subject having a low color temperature, the signal charge R mixed in the signal charge G is increased, while the signal charge B mixed in the signal charge G is decreased. Hence, a difference in the amounts of signal charges G transferred on the horizontal transfer path 58 is produced and represented as a fixed pattern noise on the image.

Thus, in the present example, an electrode HL is provided directly in front of the branching section, and adapted for being driven independently. The duty cycle and/or the cycle of the drive signal $\phi$HL supplied to the electrode HL is changed by the timing signal generator 32 in order to provide for longer transfer time of the signal charges from this electrode to the branching section. Moreover, in the present example, the duty cycle and/or the cycle of one or both of the horizontal drive signals 76a and 76b driving the horizontal transfer paths 56 and 58, respectively is varied in the timing signal generator 32 in order to provide for a longer signal charge transfer time from the branching section to one of the horizontal transfer paths longer than the usual transfer time.

The usual transfer time is the transfer time prior to changing of the duty cycle and/or the cycle of the drive signal, and means the transfer time in case no transfer efficiency deterioration has occurred, that is, in case the transfer efficiency is maintained. In terms of the duty cycle, for example, the usual transfer time in the present example means the transfer time in case the duty cycle is 50%, that is, in case the high level time is about equal to the low level time. It is noted that the usual transfer time is not limited to that for the duty cycle of 50%, insofar as the transfer efficiency is maintained.

Figure 7:
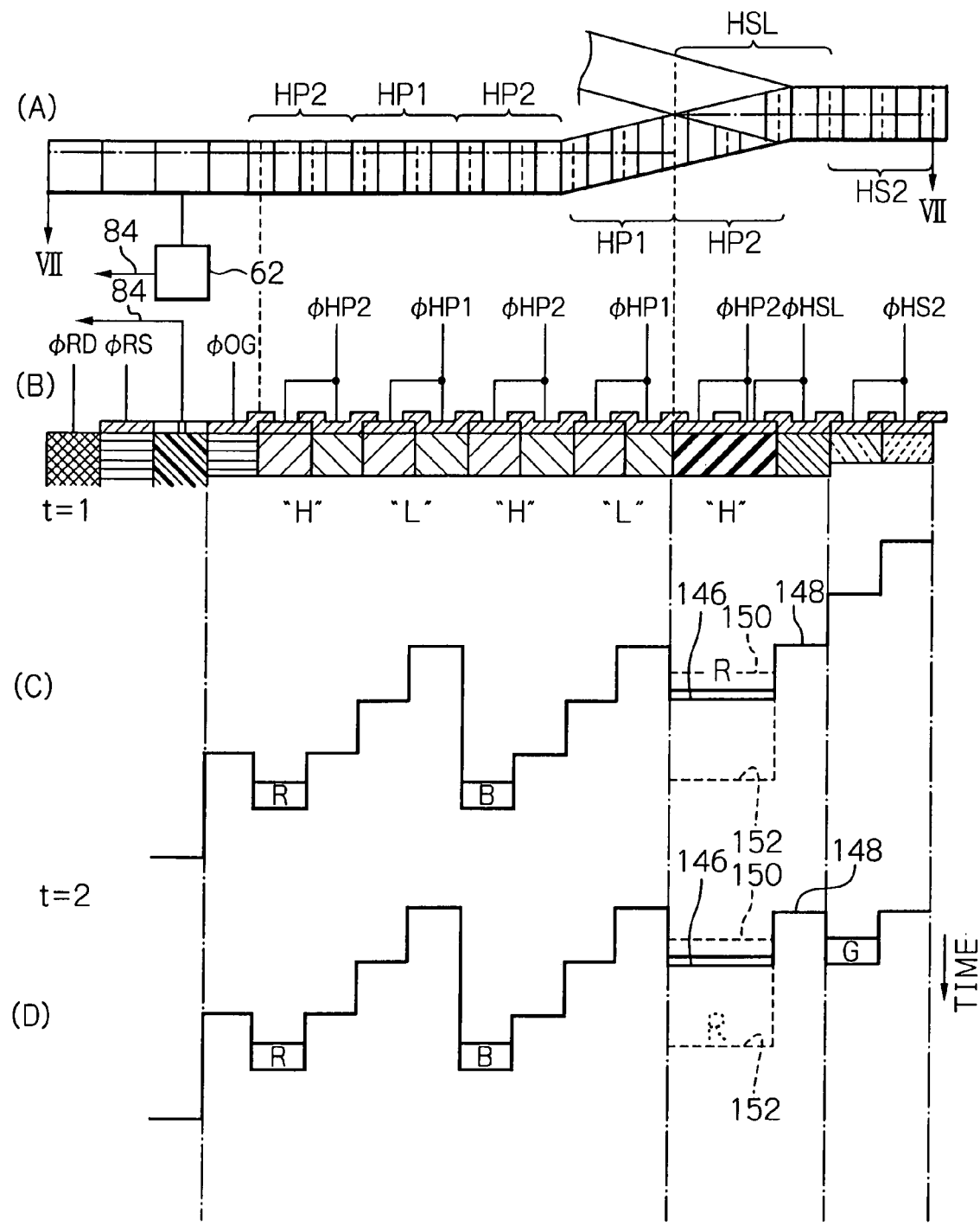
FIG. 7, part (A) is a partial plan view, looking from above, showing the schematic constitution of the horizontal transfer path in the device of FIG. 1, part (B) is a cross-sectional view of the transfer path, taken along a section line VII-VII, and parts (C) and (D) show how the potential changes in various parts of the horizontal transfer path.

In FIG. 36, the electrode HL is a transfer element, provided one in front of the electrode HSL of the branching section, and transfers the signal charge received from the electrode HS3, to the electrode HSL. In the present example, the electrode HL is a pair of polysilicon electrodes arranged as a set, as are the other electrodes. In addition, the electrode HL may be actuated independently. In the present example, a drive signal $\phi$HL is supplied to the electrode HL as shown in FIG. 7.

The drive signal $\phi$HL shown in FIG. 38 is the drive signal $\phi$HL supplied to the electrode HL during the usual driving time. In the present example, the drive signal $\phi$HL during the usual driving is of the same signal waveform as the drive signals $\phi$HS2, $\phi$HS4. The reason is that, since the electrode of the right side neighbor of the electrode HL is the electrode HS3, it is necessary to provide for the same potential as that of the electrodes HS2 and HS4 during usual driving. However, the present invention is not limited to this and the drive signal to be supplied to the electrode HL may be optionally set depending on the horizontal transfer path 50. For example, the drive signal $\phi$HL during the usual driving may be the signal of the same waveform as the drive signals $\phi$HS1 and $\phi$HS3.

Figure 42:
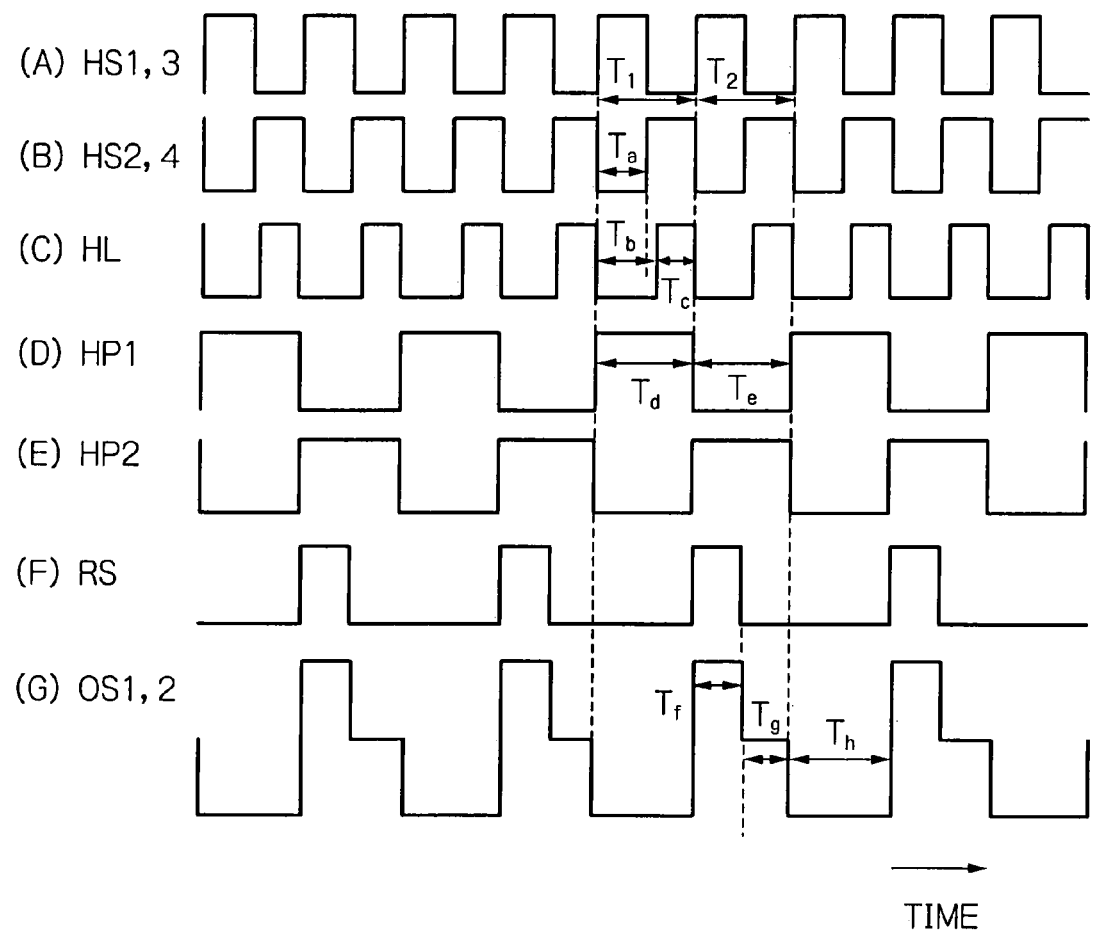
FIG. 42 is a schematic timing chart showing an example of the timing of drive signals supplied to the respective electrodes shown in FIG. 35.
Figure 43:
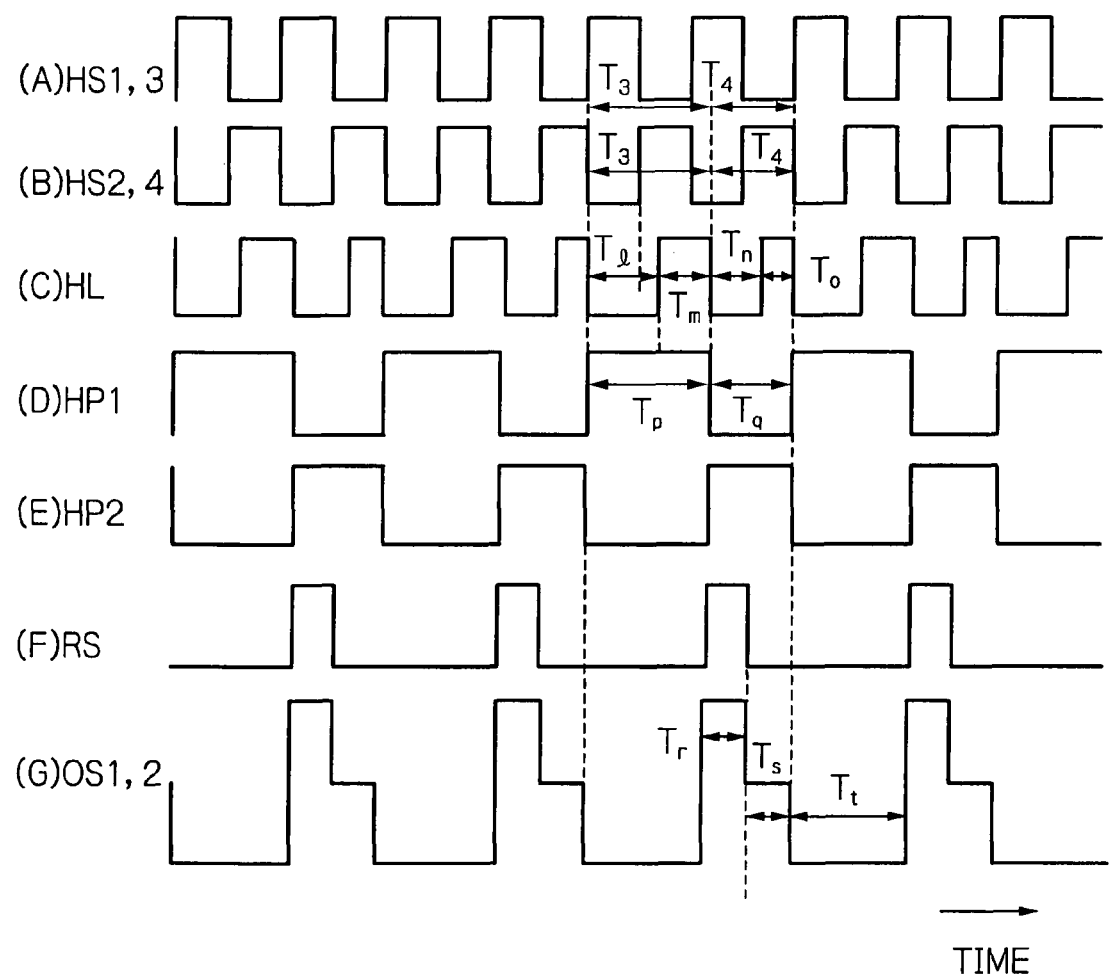
FIG. 43 is a schematic timing chart showing another example of the timing of drive signals supplied to the respective electrodes shown in FIG. 35.

If, in the present example, there is fear of transfer deterioration, as in the case of a low color temperature of the subject, the timing signal generator 32 changes the duty cycle of the drive signal $\phi$HL as shown in FIG. 42. By so doing, the signal charge transfer time from the electrode HL to the electrode HSL may be made longer than the transfer time for the usual transfer time, that is, the transfer time for the case of not changing the duty cycle.

FIG. 42 depicts a timing chart schematically showing the timing of the drive signals to be supplied to the respective electrodes shown in FIG. 35. Specifically, FIG. 42 schematically shows the processing in which the duty cycle of the drive signal supplied to the electrode HL on the occasion of deterioration in the transfer efficiency is changed so that the signal charge transfer time from the electrode HL to the electrode HSL is made longer than that prior to duty cycle change, such as to prohibit deterioration in the transfer efficiency.

In FIG. 42, the drive signal φHL has a low level time longer than the high level time. Referring more specifically to FIG. 42, the high level time and the low level time of the drive signal φHL are both time Ta, that is, one-half period, in the previous example. In the present example, the low level time is the time Tb, while the high level time is the time Tc. Since the time Ta is the one-half period, the relationship, time Tb>time Ta>time Tc, is established.

In the example shown in FIG. 42, the period is not modulated. The drive signals φHS1 to φHS4 also are not modulated. It is because the transfer efficiency on the horizontal transfer path 50 is to be maintained. However, the present invention is not limited to this and, for example, the drive signals φHS1 to φHS4 may be modulated. This drive signal modulation becomes possible by the system controller 28 controlling the timing signal generator 32, as an example.

The signal charges are transferred from the electrode HL to the electrode HSL when the drive signal φHL is low in level and the drive signal φHP1 is high in level. Thus, if the duty cycle of the drive signal φHL is varied as described above to provide for the high level time Tb of the drive signal φHL longer than its low level time Tc, it becomes possible to set the signal charge transfer time from the electrode HL to the electrode HSL from time Ta to time Tb which is longer than time Ta. The result is that the signal charge transfer from the electrode HS to the electrode HSL may be better and the amount of charges left over untransferred may be decreased to eliminate the problem of deterioration in the transfer efficiency.

By changing the duty cycle of the drive signal φHL in this manner, the high level time in the drive signal φHL may be shorter, so that the transfer time to the electrode HL from the electrode as the left side neighbor of the electrode HL may be shorter. For example, in the example of FIG. 35, the signal charge transfer time from the electrode HS3 to the electrode HL becomes shorter. However, there is sufficient allowance in frequency characteristics in transferring signal charges from the electrode HS3 to the electrode HS, so that there is sufficient margin in decreasing the transfer time. Hence, transfer may be achieved unobjectionably by applying this margin to the transfer time from the electrode HS to the electrode HSL.

It is noted that the present invention is not limited to changing the duty cycle of the drive signal φHL. More specifically, the duty cycle and the period of each of the drive signal φHL, horizontal drive signal φHP1 and the horizontal drive signal φHP2 may be changed by the timing signal generator 32, as shown for example in FIG. 43, in order to provide for a longer signal charge transfer time from the branching section to one of the horizontal transfer paths.

FIG. 43 is a timing chart schematically showing another timing of the drive signals supplied to the electrodes shown in FIG. 35 in case of transfer efficiency deterioration. Specifically, FIG. 43 schematically shows the processing for eliminating the transfer efficiency deterioration, according to which the duty cycle and the period of the drive signal φHL, horizontal drive signals φHP1 and φHP2 are changed so that the transfer time of signal charges from the electrode HSL to the horizontal transfer path 56 in case of transfer efficiency deterioration will be longer than that before such change, such as to eliminate the transfer efficiency deterioration. In FIG. 43, the same reference numerals as those used in FIG. 42 denote the same or equivalent component parts.

In the example shown in FIG. 43, not only the duty cycle of the drive signal φHL but also that of each of the drive signals φHP1 and φHP2 is changed. More specifically, the duty cycle of the drive signals φHP1 and φHP2 is changed in FIG. 43 so that, in the drive signal φHP1, the high level time is changed from time Td to time Tp and the low level time is changed from time Te to time Tq. On the other hand, since the drive signal φHP2 is reverse-phased from the drive signal φHP1, its low level time and high level time are set to time Tp and Tq, respectively. Meanwhile, since the pre-change time Td is about equal in length as pre-change time Te, and is equal to one-half the period of each of the drive signals φHP1 and φHP2, the time Td, Te, Tp and Tg are related to one another by Tp>Td, Te>Tq.

In keeping with such changes in the drive signals φHP1 and φHP2, the period of the drive signal φHL is changed, so that the signal part with the period equal to Tp and that with the period equal to Tq will appear alternately. In the example shown in FIG. 43, the duty cycle of the drive signal φHL is set so that the low level period is loner than the high level period as in FIG. 42. For example, in the present example, in a signal part with one period equal to time Tp, the low level time is time Tl, while the high level time is time Tm, with Tl>Tm, whereas, in a signal part with one period equal to time Tq, the low level time is time Tn, while the high level time is time To, with Tn>To.

In the present example, even though the period of the drive signal φHL differs from one signal part to the next, the duty cycle of the signal part with the period equal to time Tp is made equal to that of the signal part with the period equal to time Tq. In more detail, if, in the signal part where the period is equal to Tp, the low-level time Tl is 60% of time Tp and the high-level time Tm is 40% of time Tp, the low-level time Tn is 60% of time Tq and the high-level time To is 40% of time Tq. However, the present invention is not limited to this and may be modified optionally. For example, the duty cycle may be changed for the signal part with the period equal to Tp and for the signal part with the period equal to Tq. Alternatively, the duty cycle may be set to 50% for both of the signal parts and the lengths of both the low level time and the high level time may be equal to one half period, only by way of illustration.

The period of each of the drive signals φHS1 to φHS4 is also changed with change in the drive signal φHL. Specifically, one period of each of the drive signals φHS1 to φHS4 in register with the signal part of the drive signal φHL with the period of Tp is set to time T3 which is about equal to time Tp. In similar manner, one period of each of the drive signals φHS1 to φHS4 in register with the signal part of the drive signal φHL with the period of Tq is set to time T4 which is about equal to time Tq. It is noted that, in each cycle, the low and high levels are each of one-half cycle, without the duty cycle being changed.

Suppose that the duty cycle of the drive signals φHP1 and φHP2 is changed in this manner, so that the high level time of the drive signal φHP1 is made longer. The signal charge transfer time from the electrode HSL to the horizontal transfer path 56 may then be made longer, since the signal charge is transferred from the electrode HL to the horizontal transfer path 56 during the high level time of the drive signal φHP1.

Moreover, if the period of the drive signal φHP is changed to a longer period, the time during which the drive signal φHL is low in level and the drive signal φHP1 is high in level may be made longer, even in case the duty cycle is 50%, whereby it is possible to provide for longer signal charge transfer time from the electrode HL to the electrode HSL.

In particular, if the duty cycle of the drive signal φHL is also changed, as in the present alternative embodiment, the time during which the drive signal φHL is low in level and the drive signal φHP1 is high in level may be made longer, whereby it is possible to provide for longer signal charge transfer time from the electrode HL to the electrode HSL. Meanwhile, whether or not the duty cycle is to be changed when the period of the drive signal φHL is changed may optionally be determined depending on the state of transfer then prevailing in the transfer section.

When the duty cycle of the drive signals φHP1 and φHP2 is changed, the transfer time from the electrode HSL to the horizontal transfer path 58 becomes shorter from Te to Tq (time Te>time tq). It is noted that, in case the signal charges of the pixels R and B are being transferred to the horizontal transfer path 56 and the signal charges of the pixel G are being transferred to the horizontal transfer path 58, as in the present alternative embodiment, the signal charge of the pixel G tends to be mixed into those of the pixels R and B, since the transfer time from the branching section to the horizontal transfer path 58 becomes shorter. However, since the signal quantities of the pixels R and B differ from each other, the adverse effect of mixing of signal charges, if any, is only small.

In case the duty cycle of the drive signals φHP1 and φHP2 is changed as shown in FIG. 43, the reset level Tr and the feed-through level Ts of the output waveforms OS1, OS2 become shorter, and the data level Tt becomes longer. Thus, in case the noise is removed in the rear side pre-processor 22 in accordance with the correlated double sampling, it becomes necessary to change the phase of the sampling pulse in keeping with the change in the drive signals φHP1 and φHP2.

Figure 44:
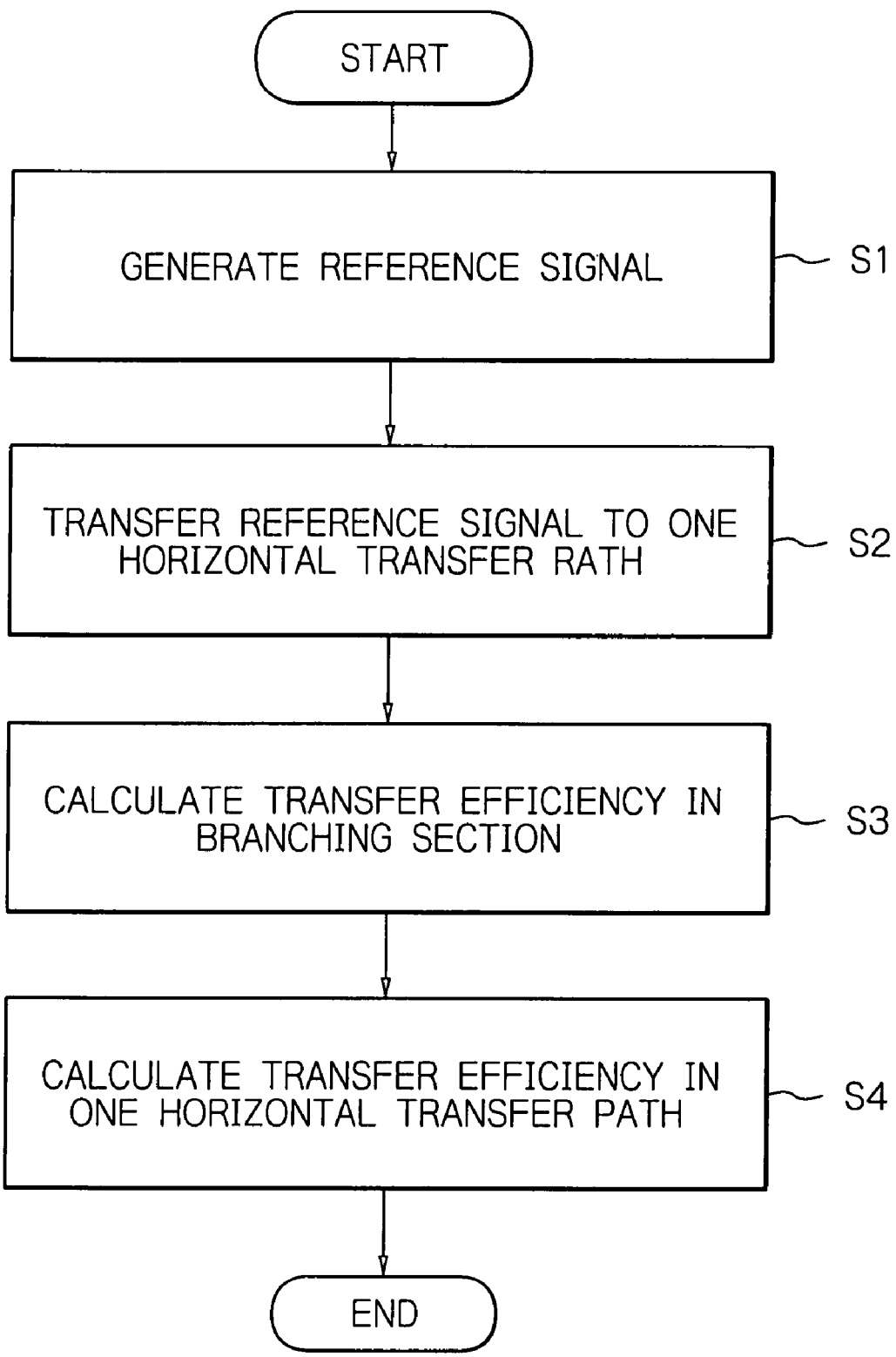
FIG. 44 is a flowchart useful for understanding illustrative processing for calculating the transfer efficiency.
Figure 45:
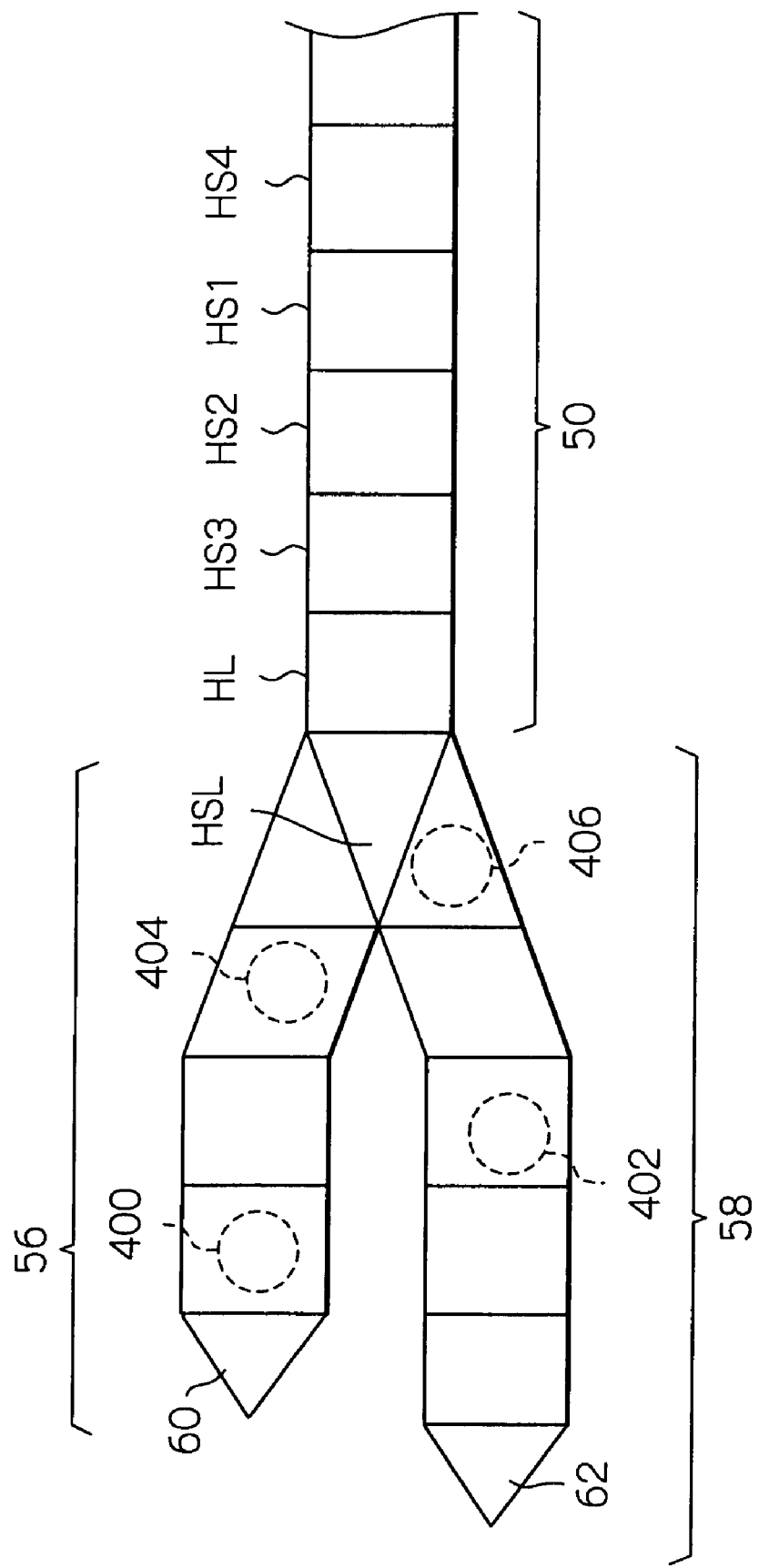
FIGS. 45 and 46 schematically show illustrative processing for calculating the transfer efficiency on one and the other of the horizontal transfer paths, respectively.

In the present alternative embodiment described above, the duty cycle or the period of the drive signals φHL, φHP1 and φHP2 is changed to provide for longer transfer time from the electrode HL towards the electrode HSL or longer transfer time from the electrode HSL towards the horizontal transfer path 56 to provide for transfer of a sufficient quantity of signal charges, as shown in FIGS. 44 and 45. Consequently, the transfer efficiency may be prevented from being deteriorated in the electrode HSL. In addition, since the duty cycle or the period may be changed by changing the timing signal generated by the timing signal generator 32 shown for example in FIG. 2, it is possible to prevent deterioration of the transfer efficiency without requiring redundant elements.

The above-described driving with variable duty cycle or period of the drive signals φHL, φHP1 and φHP2 for eliminating the deterioration of transfer deterioration may be effected depending on, for example, the temperature of the device 44, color temperature of the subject, ISO (International Organization for Standardization) sensitivity or the driving speed. For example, the transfer efficiency tends to be deteriorated under low temperature in the device 44. This deterioration may be coped with by driving with variable duty cycle or period.

Meanwhile, the temperature of the device 44 may be measured by known temperature measurement means, such as a thermometer or a sensor, as mounted in an optional location of the solid state imaging apparatus, such as in the imaging unit 14 or in the system controller 28. If the measured temperature is lower than a preset value, the timing signal generator 32 may be controlled by, for example, the system controller 28, in order to change the duty cycle or the period of each drive signal, whereby it becomes possible to prevent deterioration of the transfer efficiency under low temperatures, only by way of example.

Meanwhile, if the detected temperature is higher than a preset value, the transfer efficiency becomes higher. Hence, usual driving is preferably used. Specifically, with a high detected temperature, the timing signal generator 32 routes to the drivers a usual timing signal in which the duty cycle is 50%, with the low level time and the high level time each being one-half period.

In case the color temperature is drastically high or low, an ill effect caused by mixing of the signal charges of the pixel R and the pixel B into those of the pixel G is increased. The duty cycle or the period may then be changed to eliminate transfer deterioration to combat the ill effect caused by mixing.

The color temperature may be said to be drastically high in case it is higher than 6000 Kelvin, as an example. The color temperature may be said to be drastically low in case it is lower than 3000 Kelvin, as an example. The present invention is not limited to these numerical values. The color temperature may be detected using known techniques.

In driving at high ISO sensitivity, that is, in case the imaging optical sensitivity is higher than the usual imaging sensitivity, the subject is low in luminance and hence the quantity of signals generated may be low. Hence, the ill effect caused by mixing tends to be increased, the duty cycle or the period may then be changed to eliminate transfer deterioration to combat the ill effect caused by mixing.

During high speed driving, the transfer time becomes shorter than during usual driving. Hence, it is feared that the quantity of signal charges leftover is increased. Thus, by varying the duty cycle or the period for driving, it becomes possible to prevent mixing to generate an optimum image. Meanwhile, during the low speed driving, it is preferred to revert to usual driving, because sufficient transfer time may then be secured. However, the present invention is not limited to these cases. The duty cycle or the period may be changed in an optional case where there is fear of deterioration in the transfer efficiency in the branching section 54, in order to eliminate deterioration.

In the processing shown in FIGS. 44 and 45, it is possible to freely set how much the duty cycle is to be changed. That is, the range of variations of the duty cycle may be set freely. This setting may be made by measuring, in a situation where deterioration in the transfer efficiency is likely to be produced, the quantity of signal charges which may be left over to the rear side, and by calculating the transfer efficiency using the so measured quantity of signal charges left over to the rear side.

FIG. 44 is a flow chart showing typical processing of calculating the transfer efficiency, by measuring the residual transfer quantity, for setting the magnitude of variation of the duty cycle. In FIG. 44, the system controller 28 captures a light source of a predetermined light volume in the imaging unit 14 to generate a reference signal (step S1). Under such control, the imaging unit 14 shoots the light source of a predetermined light volume and, as shown in FIGS. 31 to 34, mixes eight pixels in the horizontal direction on the horizontal transfer path 50 to generate a reference signal pixel 400 and at least three void pixels 402 to 406 consecutive to the reference signal pixel on its rear side. Meanwhile, it is sufficient that there are at least two pixels on the rear side of the pixel 400, so that the present alternative embodiment is merely an illustration and is not restrictive.

In case the reference signal pixel 400 and three consecutive void pixels are generated in this manner in rear of the reference signal pixel 400, the branching section 54 of the device 44 bifurcates the reference signal pixel 400 and the void pixels, so that the reference signal pixel 400 and one of the three void pixels are supplied to one of the horizontal transfer paths, and the remaining two void pixels are supplied to the other horizontal transfer path (step S2).

FIG. 45 schematically shows how the reference signal pixel 400 and the three consecutive void pixels in rear of the reference signal pixel 400, generated by the processing shown in FIGS. 31 to 34, are being transferred from the branching section 54 to the horizontal transfer paths 56 and 58. Specifically, FIG. 45 schematically shows the exemplary processing for calculating the transfer efficiency. In FIG. 45, the same reference numerals as those of FIG. 35 denote the same component parts. In FIG. 45, the reference signal pixel 400 and void pixels 402, 404, 406 are supplied from the horizontal transfer path 50 to the branching section 54. As a result of bifurcation at the branching section 54, the reference signal pixel 400 and the void pixel 404 are sequentially supplied to the horizontal transfer path 56. To the horizontal transfer path 58, the void pixel 402 directly in rear of the reference signal pixel 400 on the horizontal transfer path 50, and the void pixel 406 are sequentially supplied.

The reference signal pixel 400 and the void signal 404 are sequentially transferred on the horizontal transfer path 56, to the output amplifier 60 which then outputs the signal 82 composed of the reference signal pixel 400 and the void signal 404. In similar manner, the void pixels 402, 406 are sequentially transferred on the horizontal transfer path 58 to the output amplifier 62 which then outputs the signal 84 composed of the void pixels 402, 406. The signals 82, 84 are then processed by the pre-processor 22 to generate digital signals 110, 112, which are then stored in the memory 24.

At the time of branching to the horizontal transfer path 56 from the branching section 54, if there are left-over signal charges, these left-over signal charges are admitted into the branched void pixel 402. The signal processor 26 reads out the reference signal pixel 400 and the void pixel 402 from the memory 24, as digital signal 118, over bus 114 and signal line 120, and calculates the transfer efficiency $HTR_{HSL1}$ at the time of transfer from the branching section 54 to the horizontal transfer path 56, in accordance with the expression (1) (step S3):

$$\frac{(S-T) \times 100}{S} \quad (1)$$

where S denotes the signal quantity of the pixel 400, T the quantity of left-over signal charges detected from the void pixel 402, that is, the quantity of residual signal charges. Meanwhile, the present invention is not limited to this processing. The invention can deal with any pixel.

After branching, signal charges left over to the rear side on the horizontal transfer path 56 are admitted into the void pixel 404. Thus, in the present alternative embodiment, the signal processor 26 detects the quantity of residual signal charges present in the void pixel 404 to calculate the transfer efficiency $HTR_{OS1}$ (step S4). It is similarly possible to calculate the transfer efficiency $HTR_{OS1}$ by setting the quantity of residual signal charges detected from the void pixel 404, as the variable T in the above expression (1). In particular, the residual charges left over in the ultimate stage on the horizontal transfer path 56, that is, between the output gate and the floating diffusion amplifier shown in FIG. 36 are admitted into the void pixel 404. It is therefore useful in improving the ill effect, such as image deterioration, to maintain the transfer efficiency calculated with the use of the void pixel 404.

Figure 46:
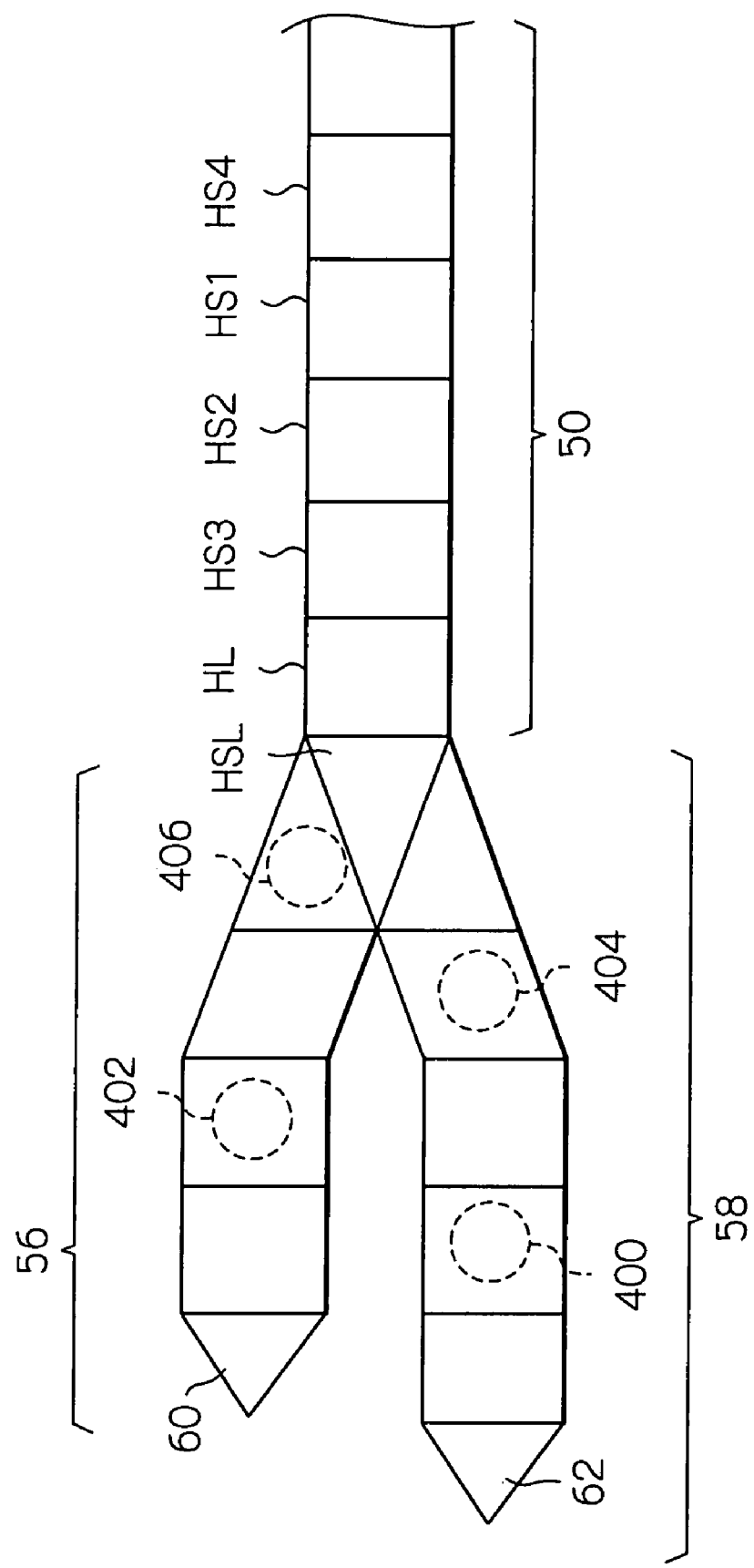

In this manner, the transfer efficiency in branching from the branching section 54 to the horizontal transfer path 56 and the transfer efficiency on the horizontal transfer path 56 are calculated. The transfer efficiency $HTR_{HSL2}$ and the transfer efficiency $HTR_{OS2}$ on the horizontal transfer path 58 may similarly be calculated as shown in FIG. 46. Specifically, the transfer efficiency $HTR_{OS2}$ on the horizontal transfer path 58 may be calculated by supplying the reference signal pixel 400, prepared by the processing of FIGS. 31 through 32I, to the horizontal transfer path 58, and by subsequently detecting signal charges present in the void pixel 404, as shown in FIG. 46. The transfer efficiency $HTR_{HSL2}$ in branching signal charges from the branching section 54 to the horizontal transfer path 58 may also be calculated by detecting the signal charges present in the void pixel 404.

Figure 47:
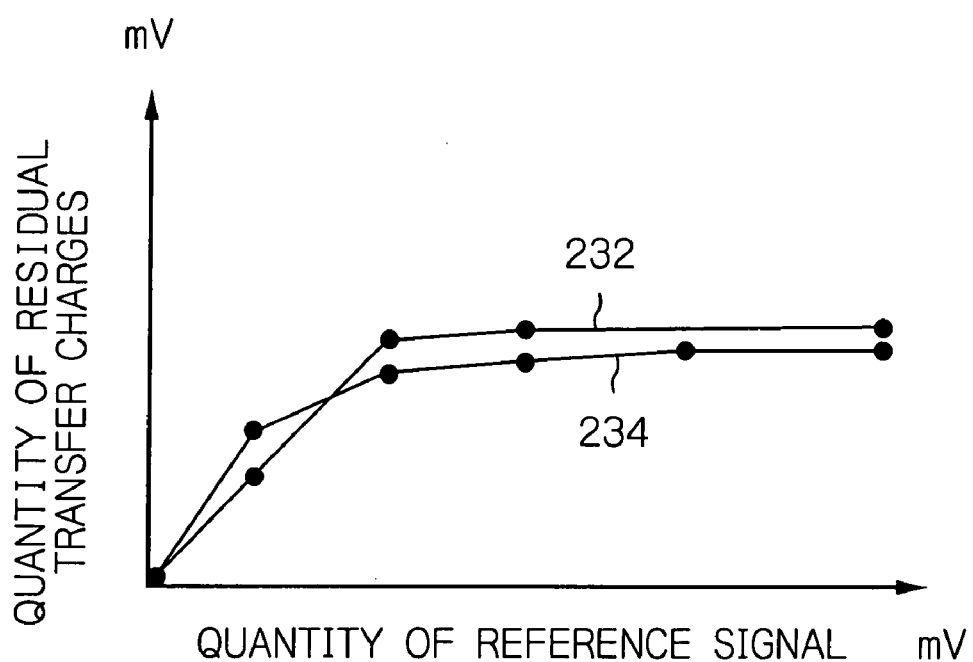
FIG. 47 is a graph schematically showing the residual charge quantities detected from one reference signal to another.
Figure 48:
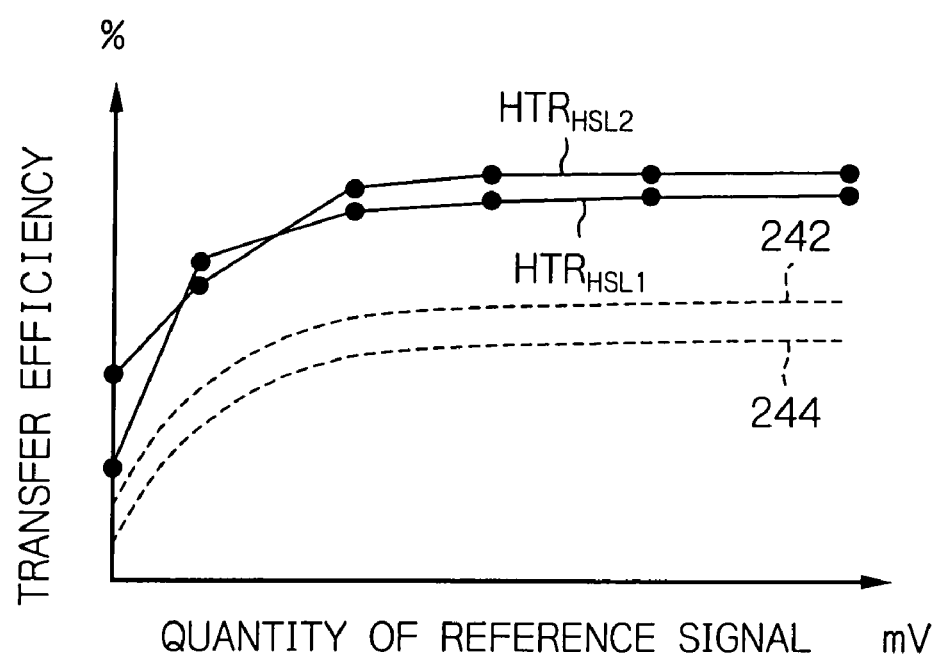
FIG. 48 is a graph schematically showing the transfer efficiency calculated from the residual signal quantities shown in FIG. 47.

The transfer efficiency calculated may be that for the reference signal pixel 400 of a preset signal quantity, as an example. However, since the residual charge quantity is varied with the signal quantity of the reference signal pixel 400 as shown in FIGS. 47 and 48, it is also possible to provide several reference signal pixels 400 of different signal quantities and to calculate the transfer efficiency from one signal quantity to another. It is noted that the present invention is not limited to calculating the transfer efficiency by the technique shown in FIGS. 46 to 48 and any suitable known technique may also be used.

FIG. 47 schematically shows measured results of the residual charge quantity for different signal quantities of the reference signal pixel 400. FIG. 48 schematically shows a transfer efficiency calculated from the residual charge quantity as shown in FIG. 47. In FIG. 47, the abscissa and the ordinate represent the signal quantity (mV) of the reference signal pixel 400 and the residual charge quantity (mV), respectively. FIG. 47 shows the results of detection of the residual signal charges in the branching section 54. In this figure, a curve 232 stands for residual charges on bifurcating signal charges from the branching section 54 to the horizontal transfer path 56, that is, the signal quantity detected from the void pixel 402 of FIG. 45. Another curve 234 stands for residual charges on bifurcating signal charges from the branching section 54 to the horizontal transfer path 58, that is, the signal quantity detected from the void pixel 402 of FIG. 46. On the other hand, there are shown in FIG. 48 the transfer efficiency $HTR_{HSL1}$ and the transfer efficiency $HTR_{HSL2}$ as calculated from the respective values shown in FIG. 47. The present invention is not limited to calculating the transfer efficiency at the branching section 54. That is, the transfer efficiencies in the horizontal transfer paths 56 and 58 may similarly be calculated from one signal quantity of the reference signal pixel 400 to another.

Figure 49:
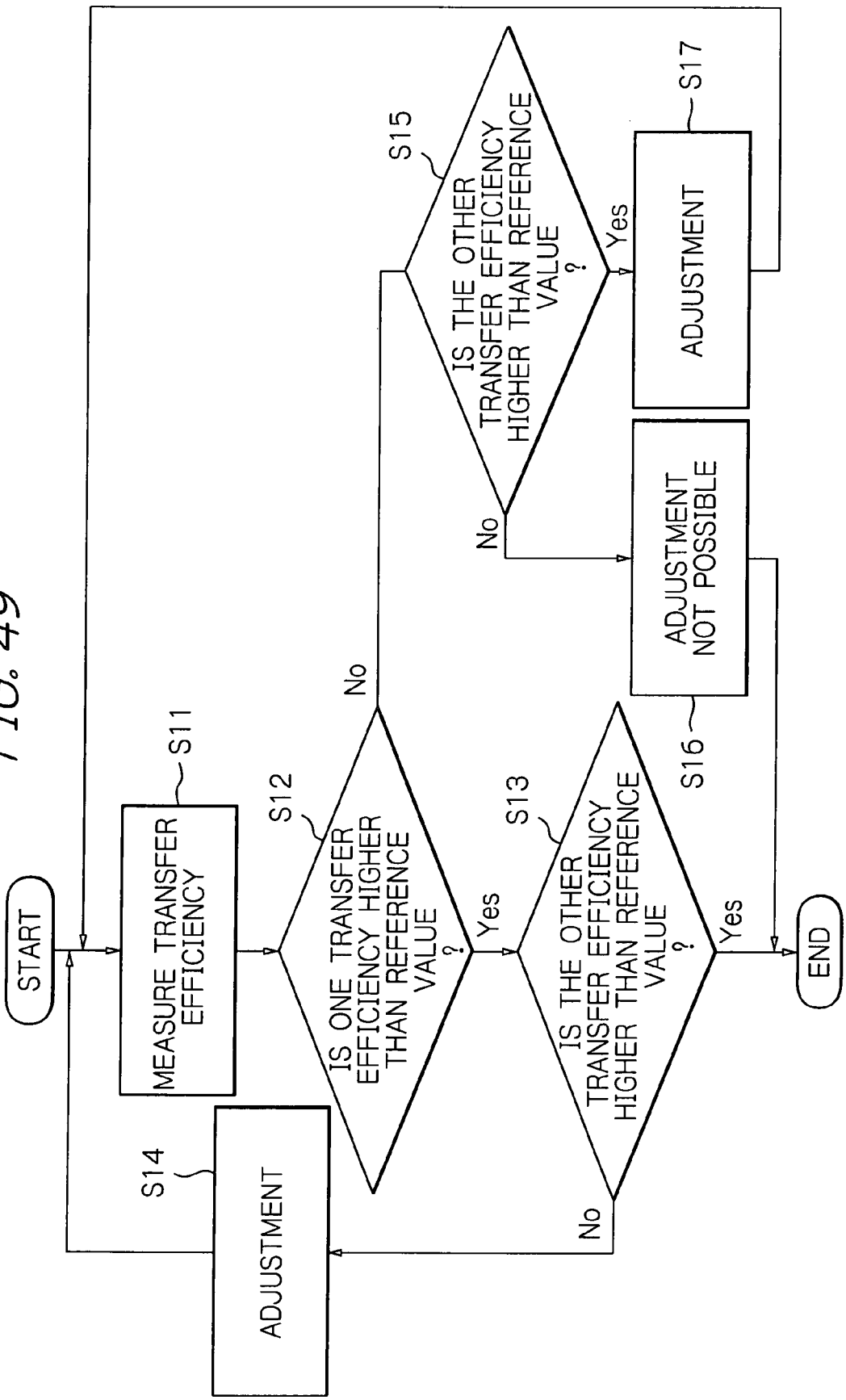
FIG. 49 is a flowchart showing illustrative processing of calculating the transfer efficiency by the processing sequence shown in FIG. 44 and for setting a variable value of the duty cycle using the transfer efficiency calculated.

FIG. 49 is a flowchart showing exemplary processing for calculating the transfer efficiency by the solid state imaging apparatus 10 in accordance with the sequence shown in FIG. 44 and for setting variable values of the duty cycle with the use of the so calculated transfer efficiency. In FIG. 49, the transfer efficiency of a section, for which are set the variable values of the duty cycle or the period, is calculated in accordance with the sequence shown in FIG. 44 for setting the variable values (step S11). For example, in determining the variable values used in increasing the transfer time from the branching section 54 to the horizontal transfer path 56, in the present alternative embodiment, a reference signal pixel 400 of a certain signal quantity is generated, and the transfer efficiency $HTR_{HSL1}$ and the transfer efficiency $HTR_{HSL2}$ are calculated as shown in FIG. 48.

Meanwhile, the transfer efficiency calculated at this time is used as a reference in setting the variable values. Thus, in calculating the transfer efficiency at the step S11, it is preferred to set the duty cycle of each of the drive signals φHL, φHP1 and φHP2 to 50% and to set a constant period, for usual driving. However, this is not meant for restricting the present invention.

Once the transfer efficiencies in bifurcating the signal charges from the branching section 54 to the horizontal transfer paths 56 and 58 are obtained, it is verified whether or not one of the transfer efficiencies exceeds a reference value (step S12). For example, in the present, alternative embodiment, it is verified whether or not the transfer efficiency $HTR_{HSL1}$ of the horizontal transfer path 56 exceeds the reference value.

For the reference value, an optionally set value may be used. For example, it may be set based on the transfer efficiencies $HTR_{HSL1}$ or $HTR_{HSL2}$, as calculated in the step S11, or may be empirically set. However, this is not meant to restrict the present invention. For example, in the present alternative embodiment, the reference values are set as indicated by dotted lines 242, 244 in FIG. 48. In this figure, the dotted line 242 is a reference value of the transfer efficiency in branching from the branching section 54 to the horizontal transfer path 56, while the dotted line 244 is a reference value of the transfer efficiency in branching from the branching section 54 to the horizontal transfer path 58.

It is noted that an image generated is affected severely by transfer deterioration that should occur in branching from the branching section 54 to the horizontal transfer path 56. Thus, in the present alternative embodiment, the reference value of the transfer efficiency in branching from the branching section 54 to the horizontal transfer path 56 is set more severely than that in branching from the branching section 54 to the horizontal transfer path 58. The present invention is not limited to this and the same reference value may be set for branching from the branching section 54 to the horizontal transfer path 56 and for branching from the branching section 54 to the horizontal transfer path 58.

As a result of decision in the step S12, if the transfer efficiency $HTR_{HSL1}$ is higher than the reference value, processing transfers to a step S13 in order to verify whether or not the other transfer efficiency, specifically the transfer efficiency $HTR_{HLS2}$, for branching from the branching section 54 to the horizontal transfer path 58 exceeds the transfer efficiency (step S13).

As a result of decision in the step S13, if the transfer efficiency $HTR_{HSL2}$ also exceeds the reference value, the processing for setting the variable value is finished. If the result of decision in the step S13 indicates that the transfer efficiency $HTR_{HSL2}$ is lower than the reference value, the duty cycle or the period of each drive signal is adjusted (step S14). Specifically, the duty cycle or the period of each drive signal is adjusted. It may optionally be set how much the duty cycle or the period is to be changed. For example, the duty cycle or the period may be set depending on how much the transfer efficiency $HTR_{HSL1}$ exceeds the reference value, or on how much the transfer efficiency $HTR_{HSL2}$ falls below the reference value. The duty cycle or the period may also be set as the amount of change for each adjustment event, for example, the value of increase of the duty cycle, such as 5%, is set and the adjustment is then made based on this change amount. However, this is not meant for restricting the present invention.

After the adjustment in the step S14, processing reverts to the step S11 to calculate the transfer efficiencies $HTR_{HSL1}$, $HTR_{HSL2}$ again. It is then verified whether or not the transfer efficiencies $HTR_{HSL1}$, $HTR_{HSL2}$ exceed the reference values. If the transfer efficiencies $HTR_{HSL1}$, $HTR_{HSL2}$ exceed the reference values, processing is terminated. Why the processing reverts to the step S11 is to verify whether or not the transfer efficiency $HTR_{HSL2}$ in switching from the branching section 54 to the horizontal transfer path 58 has been improved, and also is to verify whether or not the transfer efficiency $HTR_{HSL1}$ in switching from the branching section 54 to the horizontal transfer path 56 has become lower than the reference value as a result of change in the duty cycle or the period in the step S14.

As a result of decision in the step S12, if the transfer efficiencies $HTR_{HSL1}$ has become lower than the reference value, processing transfers to a step S15 to verify whether or not the other transfer efficiency $HTR_{HSL2}$ has exceeded the reference value (step S15). If the result of decision indicates that the other transfer efficiency $HTR_{HSL2}$ has also become lower than the reference value, it is determined that the variable value cannot be set (step S16) to terminate the processing.

If the transfer efficiency $HTR_{HSL2}$ has exceeded the reference value, the duty cycle or the period of each drive signal is adjusted so that the transfer efficiency $HTR_{HSL1}$ will become higher (step S17). How much the duty cycle or the period is to be changed may optionally be set, as in the step S14. After the change, processing reverts to the step S11 to verify how much the transfer efficiency $HTR_{HSL1}$ has been improved by the change in the step S17, and whether or not the other transfer efficiency $HTR_{HSL2}$ has become lower than the reference value.

The variable value is set as the transfer efficiencies $HTR_{HSL1}$, $HTR_{HSL2}$ are measured, as described above. It is therefore possible in this manner to avoid the problem that, while the transfer efficiency on one of the horizontal transfer paths may be improved as a result of changes in the duty cycle or the period, the transfer efficiency on the opposite side horizontal transfer path is deteriorated, so that it is possible to obtain the variable value which may be optimum case by case. Although it is the variable value in branching from the branching section 54 to the horizontal transfer paths 56, 58 that is set in the present alternative embodiment, it is possible to set the variable value in changing the transfer time from the electrode HL before branching to the electrode HSL of the branching section 54 in similar manner.

The variable values may preferably be set under a condition which may aggravate the transfer efficiency, such as at elevated temperatures, higher sensitivity, high speed readout or at an extremely high or extremely low color temperature, since it is then possible to obtain the variable value which will improve transfer deterioration more effectively. It is also preferred to calculate the transfer efficiency or set the variable values at the time of shipment of the device 44 or the solid state imaging apparatus 10 since then it is possible to take up individual differences of the solid state imaging apparatus 10 from one solid state imaging apparatus to another. Of course, the present invention is not limited to this and the variable values may be set under optional conditions and at optional stages.

Figure 50:
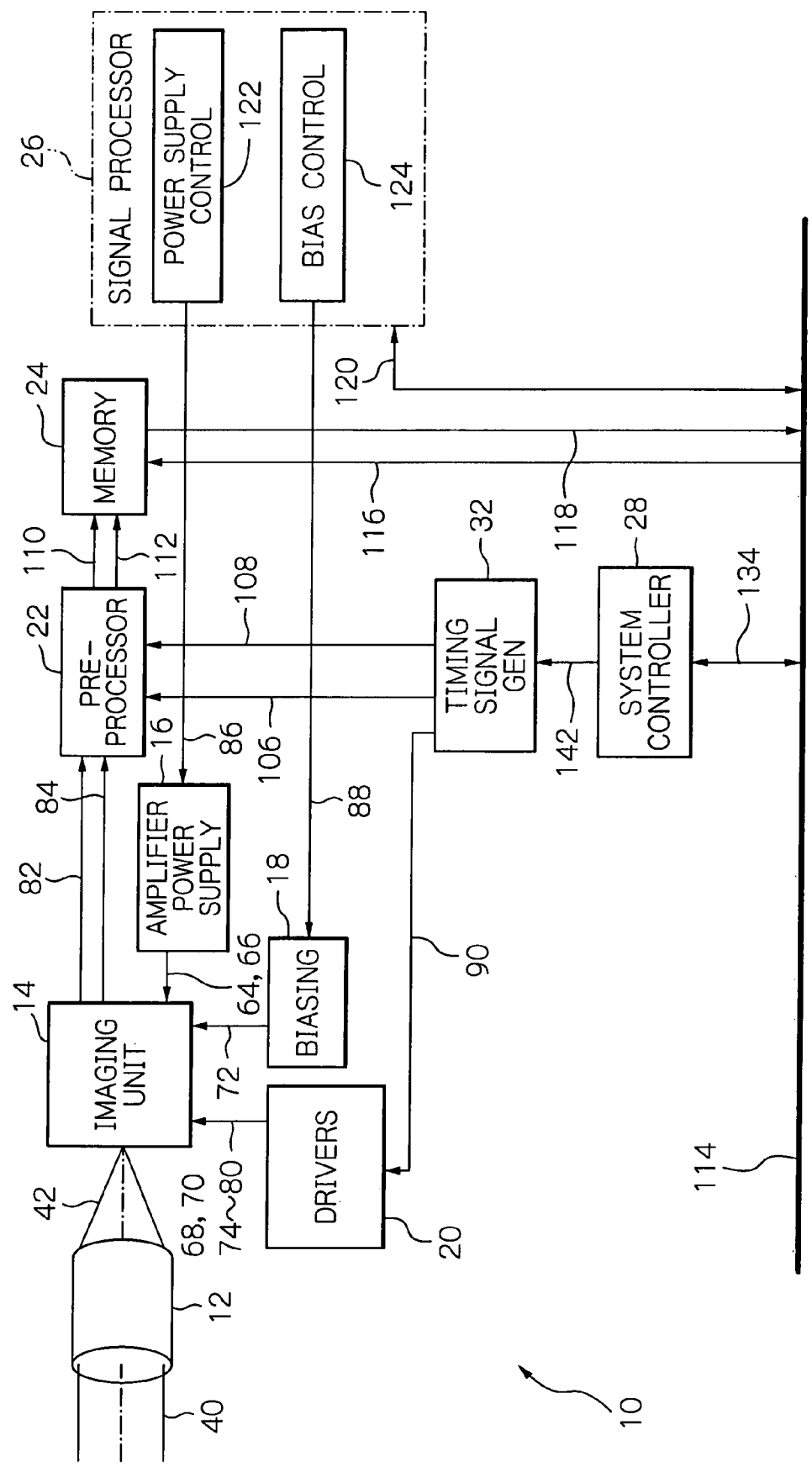
FIG. 50 is a block diagram schematically showing a further alternative embodiment of a digital camera employing the device of FIG. 1.

A further alternative embodiment of the present invention will now be described. FIG. 50 shows an alternative embodiment of the device 44 according to the present invention. In case signal charges for plural colors are transferred on the horizontal transfer path 50, the signal charges are bifurcated by the branching section 54 from color to color, to each of the plural horizontal transfer paths 56 and 58, and analog voltage signals 82, 84 converted from the signal charges are output simultaneously. In case signal charges for one color are transferred on the horizontal transfer path 50, the analog voltage signal 82 converted from the signal charges are output from the selected horizontal transfer path 56, as an example.

In the present alternative embodiment, the color filter separates the incident light into three colors of red, green and blue. The three colors are divided into a group consisting of red and blue, and another group consisting of green. Of the three colors of red, green and blue constituting a line, green is read out separately from the red and blue. Then, of the three colors of red, green and blue constituting the next line, green is read out separately from the red and blue. This operation is repeated for all lines making up the entire pixels (one frame). That is, the readout system is progressive.

The signal charges for green color read out from the photosensitive cells are transferred by using only the horizontal transfer path 56. The signal charges for red and blue colors read out from the photosensitive cells are transferred by using the horizontal transfer paths 56 and 58. The red color and the blue color are transferred over the horizontal transfer paths 56 and 58, respectively.

The digital camera 10 includes the optical system 12, the imaging unit 14, amplifier power supply 16, biasing circuit 18, drivers 20, pre-processor 22, memory 24, signal processor 26, system controller 28 and timing signal generator 32 as shown in FIG. 50.

The branching section 54 is supplied from the biasing circuit 18 with a bias signal 72 as a fixed voltage. The branching section 54 causes signal charges from the horizontal transfer path 50 to be branched to one of the horizontal transfer paths 56 and 58, depending on the colors, in a manner which will be described later.

The HS driver 96 outputs the horizontal drive signal 74 to the device 44. The HP driver 98 outputs the horizontal drive signal 76 to the device 44. The horizontal drive signal 76 has a period equal to or twice the period of the horizontal drive signal 74, depending on which color is being transferred. In the present alternative embodiment, the period of the horizontal drive signal 76 is constant, and the period of the horizontal drive signal 74 is equal to or half the period of the horizontal drive signal 76, depending on the colors. The RS driver 100 outputs the reset signal 68 and 70 to the device 44.

The signal processor 26 has the function of performing signal processing on the digital signal 118 supplied to generate a control signal. The signal processor 26 includes the power supply control 122 and the bias control 124. The signal processor 26 shown in FIG. 50, of course, includes those components corresponding to the AF control 126, AE control 128, AWB control 130 and data converter 132 shown in and described with reference to FIGS. 2 and 23, which are not shown merely for the purpose of simplicity. The power supply control 122 has the function of generating the control signal 86 responsive to high speed readout or low speed readout. The power supply control 122 outputs the control signal 86 generated to the amplifier power supply 16.

The bias control 124 outputs the control signal 88 to the biasing circuit 18. The biasing circuit 18 applies the bias signal 72 to the branching section 54.

The constitution of the horizontal transfer path 50, the branching section 54 and the horizontal transfer paths 56 and 58, and the method for horizontal transfer of signal charges will now be described. The following description will be made separately for transfer on the branching section 54 and the horizontal transfer path 56 and for transfer on the branching section 54 and the horizontal transfer path 58. There are provided plural transfer elements as described above, on each of the horizontal transfer paths 50, 56 and 58. In the following, the sole transfer element and the two electrodes contained therein are denoted by the same reference numeral. For example, the 'branching section 54' denotes a transfer element, and the 'electrode 54' denotes two electrodes of the branching section 54.

Figure 51:
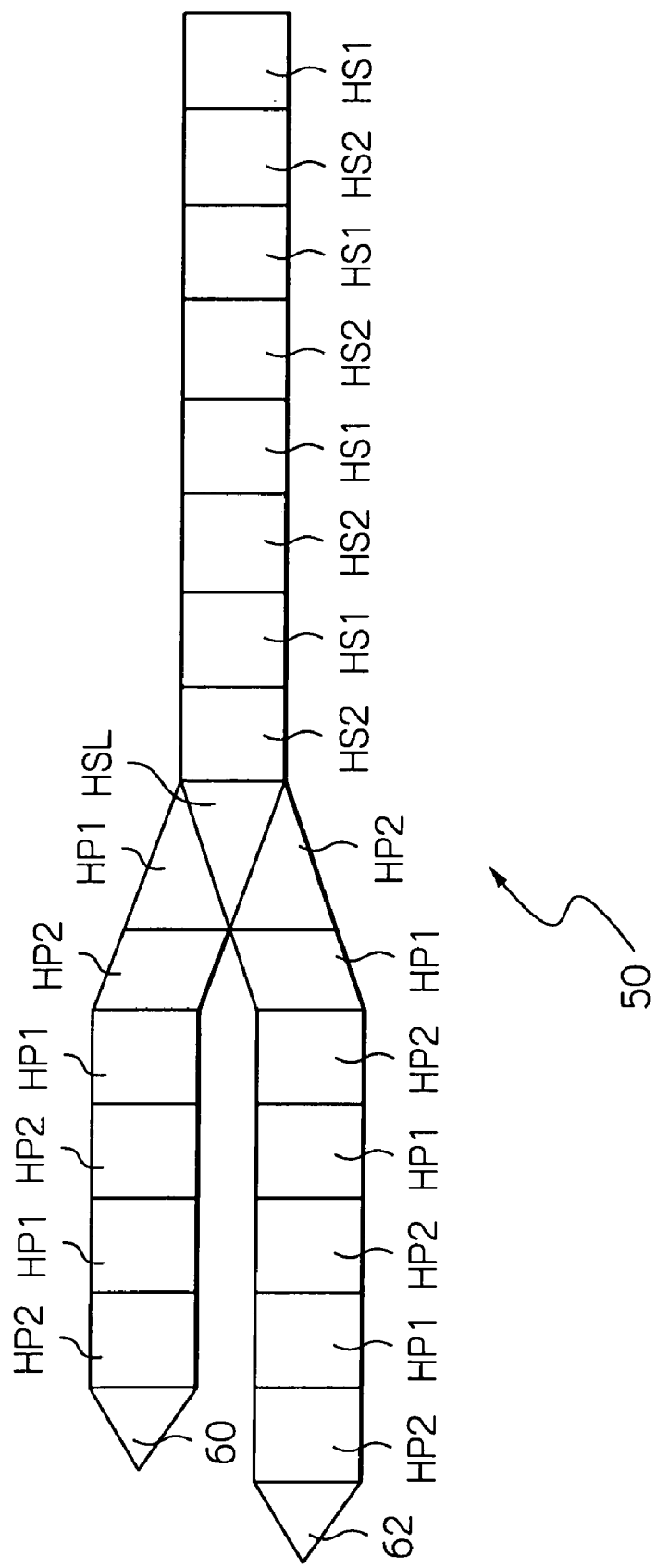
FIG. 51 is a plan view looked from above, showing a horizontal transfer path in the device of FIG. 1.

On the horizontal transfer path 50, there are formed polysilicon electrodes HS2 and HS1, in this order, from right to left, towards the branching section 54 (electrode HSL), as shown in FIG. 51. This set of the polysilicon electrodes constitutes a repetitive unit. On the horizontal transfer path 56, there are provided six polysilicon electrodes HP1, HP2, HP1, HP2, HP1, HP2, from the branching section 54 towards the output amplifier 60. On the horizontal transfer path 58, there are provided seven polysilicon electrodes HP2, HP1, HP2, HP1, HP2, HP1, HP2, from the branching section 54 towards the output amplifier 62. The horizontal transfer paths 56 and 58 are of the same structure as in FIGS. 4 and 7, as may be understood from FIGS. 51 and 52.

The drive signals applied to the respective electrodes will now be described. The drive signals $\phi$HS1 and $\phi$HS2 are supplied to the electrodes HS1 and HS2, respectively. The drive signal $\phi$HSL is supplied to the electrode HSL. The drive signal $\phi$HSL is a constant bias voltage. The drive signals $\phi$HP1 and $\phi$HP2 are supplied to the electrodes HP1 and P2, respectively. A drive signal $\phi$OG is supplied to the electrode OG. The drive signal $\phi$OG is a constant bias voltage. The drive signal $\phi$RS is supplied to the reset drain RS. The drive signal $\phi$RS is a constant bias voltage.

The flow of signal charges, transferred horizontally by these drive signals, inclusive of vertical transfer preceding horizontal transfer, will now be described. Initially, the signal charges are generated in the device 44 of the imaging unit 14. The array of pixels in the device 44 is shown in FIG. 53. In the device 44 of the present alternative embodiment, shown in FIG. 53, the filter array is generally of the so-called G-square RB-complete checkered pattern.

The charge transfer sequence on the vertical transfer path 48 is lines 201, 252, 203 and 254. On the line 201, the signal charges are arrayed in the order of R, B, R, B, . . . . On the lines 252, 254, the signal charges are arrayed in the order of G, G, G, G, . . . . On the line 203, the signal charges are arrayed in the order of B, R, B, R, . . . . This sequence is maintained on the horizontal transfer paths 50, 56 and 58, so that the signal charges are transferred in the sequence of R, B, R, B, . . . of line 201, G, G, G, G, . . . of line 252, B, R, B, R, . . . of line 203 and G, G, G, G, . . . of line 254

It is noted that R, B, R, B, . . . on the line 201 and B, R, B, R, . . . on the line 203 are transferred on the two horizontal transfer paths 56 and 58, while G, G, G, G, . . . on the lines 252, 254 are transferred on the sole horizontal transfer path 56. Moreover, as regards the R, B, R, B, . . . on the line 201 and B, R, B, R, . . . on the line 203, these are separated into R and B signals, by the branching section 54, so that the R signals and B signals are transferred at all times on the horizontal transfer paths 56 and 58, respectively.

This is shown in FIGS. 54A through 55E. FIGS. 54A through 54E show how the R, B, R, B, . . . on the line 201 and B, R, B, R, . . . on the line 203 are transferred horizontally at times t=1, 2, 3, 4 and 5. FIGS. 55A through 55E show how the G, G, G, G, . . . on the lines 252, 254, transferred next to lines 201 and 203, respectively, are transferred horizontally at times t=1, 2, 3, 4 and 5. The times t=1, 2, 3, 4 and 5 are those at which signal charges are transferred on the horizontal transfer path 50 towards left by one transfer element at a time. Since the horizontal transfer paths 56 and 58 are driven in FIG. 54 at a frequency equal to one-half that for the horizontal transfer path 50, the transfer speed on the horizontal transfer paths 56 and 58 is one-half that on the horizontal transfer path 50. On the other hand, the horizontal transfer paths 56 and 58 are driven in FIG. 55 at a frequency equal to that for the horizontal transfer path 50, and the transfer speed on the horizontal transfer paths 56 and 58 is equal to that on the horizontal transfer path 50. The method for implementing this will be described in detail subsequently.

In the signal processor, next following the horizontal transfer paths, processing is carried out on the assumption that a first line is formed by signal charges on the lines 201 and 252 and that a second line is formed by signal charges on the lines 203 and 254. Meanwhile, RGBGRGBG . . . and BGRGBGRG . . . are stated as first and second lines on the horizontal transfer path 50 shown in FIG. 51. This indicates in which locations on the horizontal transfer path 50 the signal charges descend in the drawing from the vertical transfer paths 48, but does not indicate that the signal charges are transferred in the sequence of RGBGRGBG . . . and BGRGBGRG . . . on the horizontal transfer path 50.

Reverting to FIGS. 55A through 55E, the signal charges read out from the photosensitive cells 46 to the vertical transfer path 48 are transferred on the vertical transfer path 48 towards the horizontal transfer path 50 by eight-phase drive signals $\phi V1$ to $\phi V8$ supplied to the vertical transfer path 48. On the horizontal transfer path 50, there are provided the electrodes HS1, HS2, HS1, HS2, . . . are provided from its left end, as described previously.

With the honeycomb array and with G-square RB-complete checkered pattern, as in the present alternative embodiment, the G signals and the RB signals descend on separate lines, that is, lines 201 and 252, respectively. However, with a routine array of photosensitive cells and the color filter segments, the G signals and the RB signals do not necessarily descend in separated states. In such case, it becomes necessary to re-array the G signals and the RB signals. To this end, it is sufficient to provide a line memory between the vertical transfer path 48 and the horizontal transfer path 50 for re-arraying the signals and subsequently transfer the re-arrayed signals to the horizontal transfer path 50.

Figure 56:
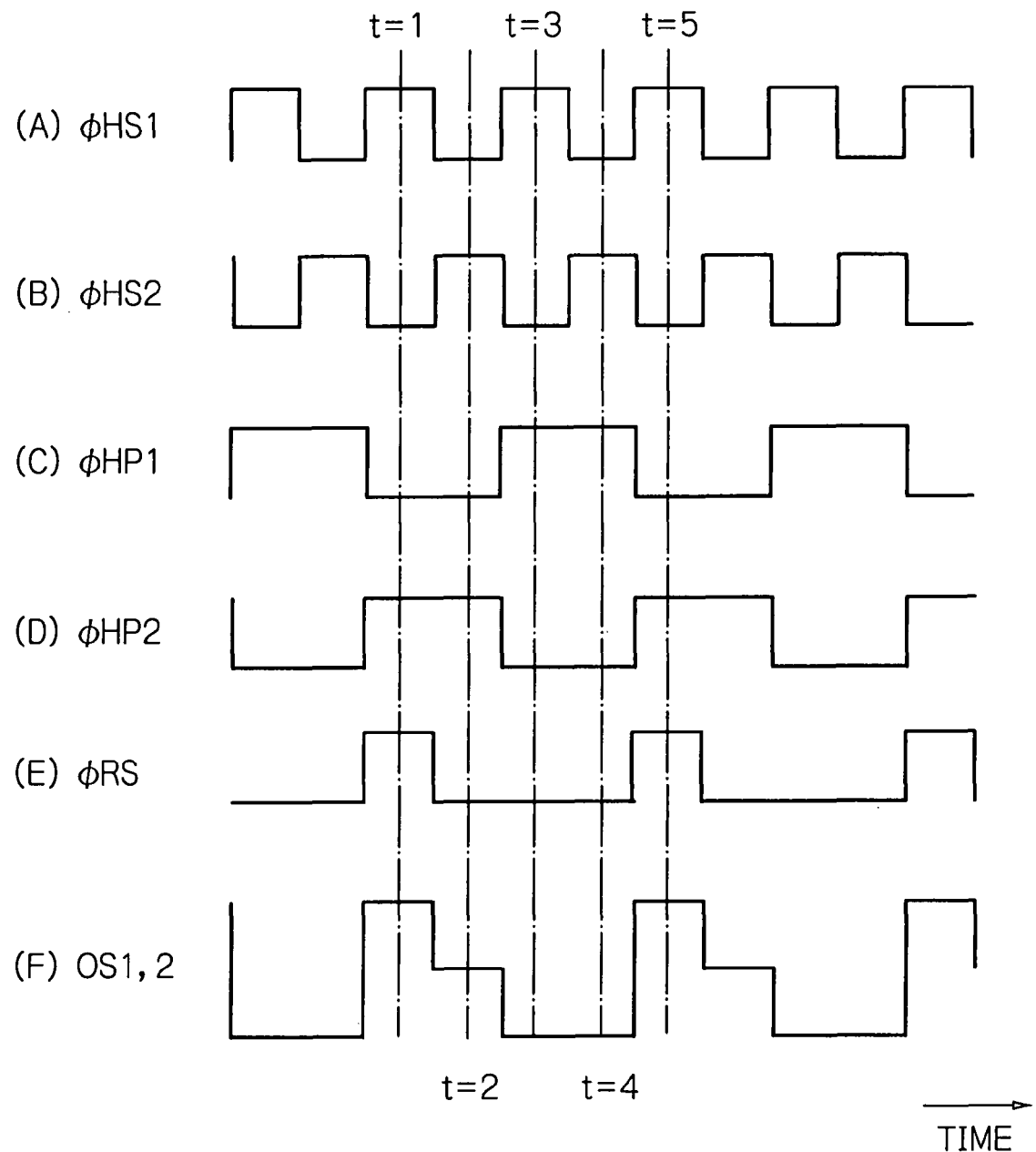
FIG. 56 is a timing chart showing the supply timing of drive signal to the electrode of FIG. 51.

The drive signals on the horizontal transfer paths 50, 54, 56 and 58 will now be described. Initially, the case of transferring R, B, R, B, . . . on the line 201 and B, R, B, R, . . . on the line 203 will be described. FIG. 56 shows drive signals for transferring R, B, R, B, . . . on the lines 201 and 203. If attention is directed to the phase of the drive signals, the drive signal $\phi HS1$ of FIG. 56, part (A), is a two phase drive signal phase-shifted by 180° from the drive signal $\phi HS2$ of part (B). The drive signal $\phi HP1$ of part (C) and the drive signal $\phi HP2$ of part (D) are phase-reversed from each other and are two phase drive signals.

If attention is directed to the periods of the drive signals, the drive signals of FIG. 56, parts (A) and (B) are each of a period equal to one-half the period of parts (C) and (D). That is, the frequency of each of the drive signals of parts (A) and (B) is twice the frequency of each of the drive signals of parts (C) and (D). The drive signal $\phi RS$ as shown in part (E) becomes "H" in level at, e.g. the time t=1, . . . , t=5, that is at time t=4n+1, where n is an integer including zero. Output signals OS1 and OS2 are output as shown in part (F).

Figure 52:
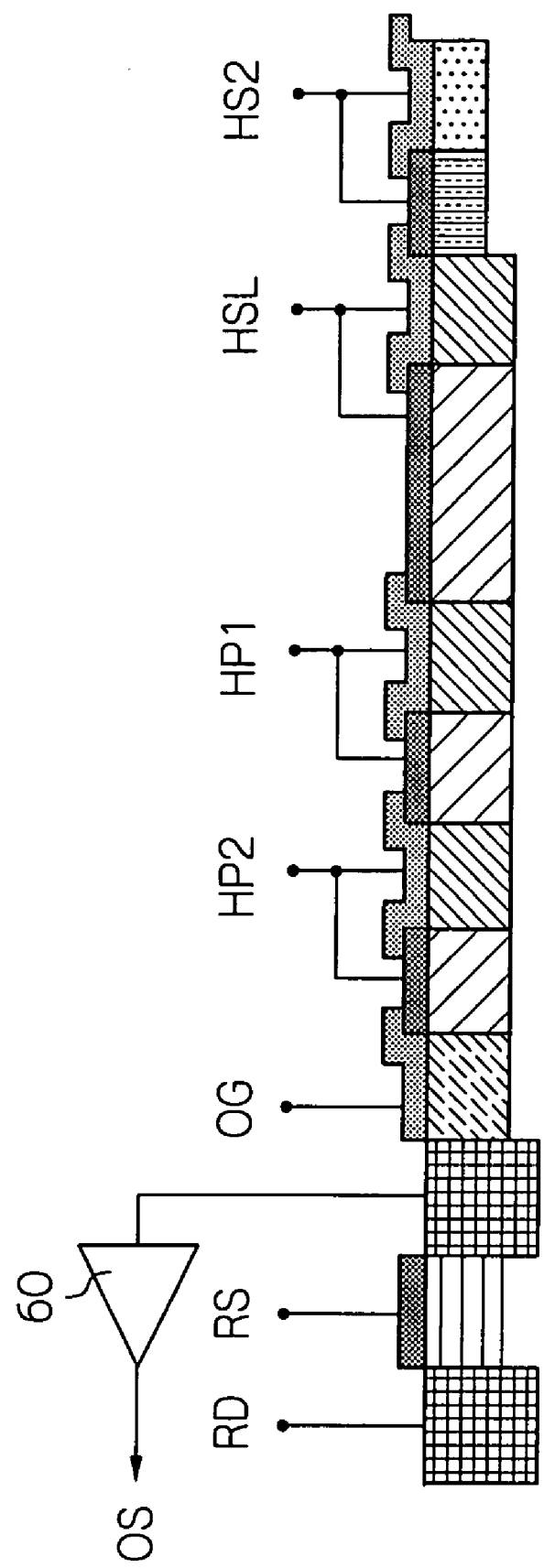
FIG. 52 is a partial cross-sectional view showing essential part of a horizontal transfer path of FIG. 51.
Figure 54A:
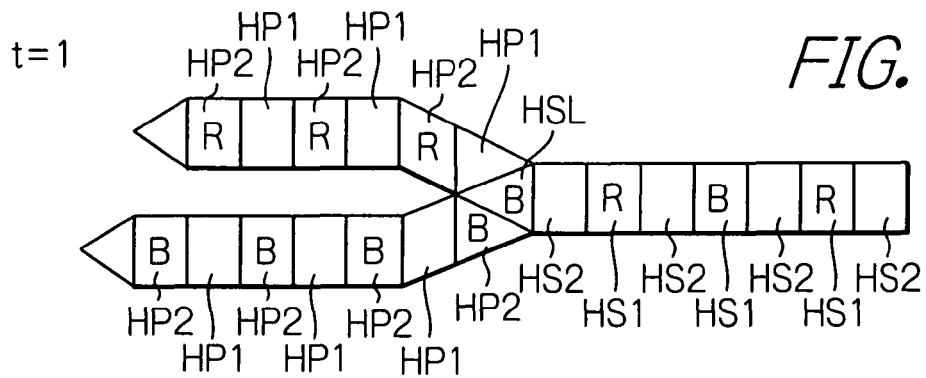
FIGS. 54A through 54E and 55A through 55E schematically show transfer of signal charges R and B, and signal charges G on the horizontal transfer path of FIG. 1, respectively.
Figure 54B:
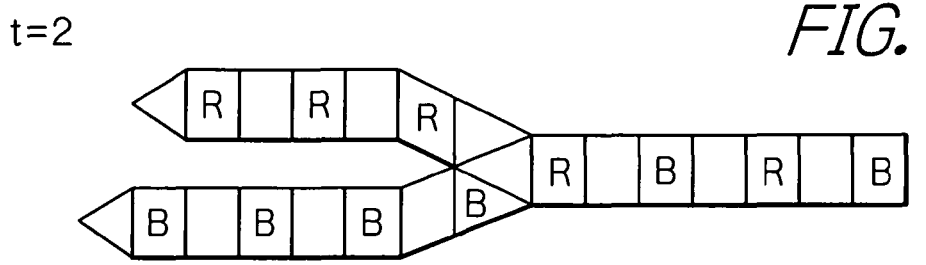
Figure 57A:
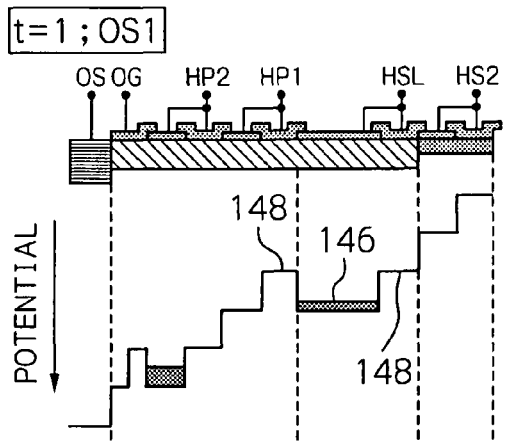
FIGS. 57A through 61B schematically show the potential levels generated on the horizontal transfer path when the drive signal shown in FIG. 56 is applied.
Figure 61A:
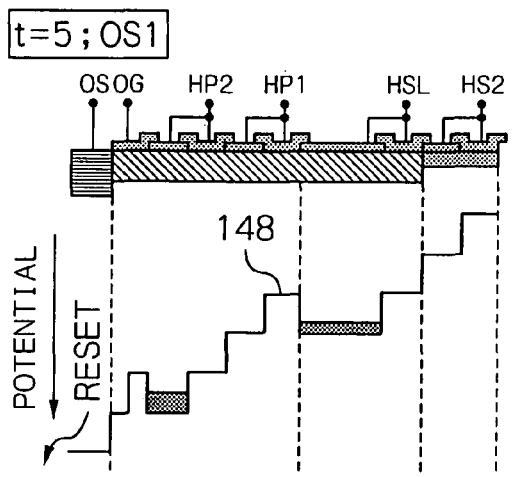
Figure 61B:
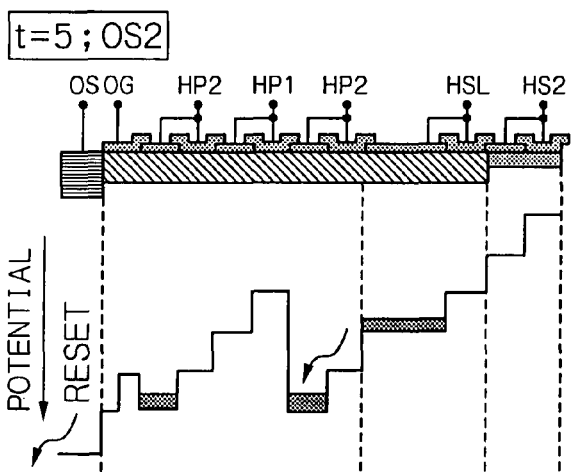

FIGS. 57A through 61B show the potential generated on the horizontal transfer paths 50, 54, 56 and 58 in case the above drive signals are applied to the horizontal transfer paths 50, 54, 56 and 58. Those figures also depict the structure shown in FIG. 52. A simplified diagram of FIG. 52 is also shown for indicating the potential positions. FIGS. 57A and 57B are for time t=1 of FIG. 54A, FIGS. 58A and 58B are for time t=2 of FIG. 54B, and FIGS. 59A and 59B are for time t=3 of FIG. 54C. FIGS. 60A and 60B are for time t=4 of FIG. 54D, and FIGS. 60A and 61B are for time t=5 of FIG. 54E. FIGS. 57A, 58A and 59A, and 60A and 61A stand for the horizontal transfer paths 50, 54 and 56. FIGS. 57B, 58B and 59B, and 60B and 61B stand for the horizontal transfer paths 50, 54 and 58. Thus, as may be seen from the figures, the potential levels of FIGS. 57A, 58A, 59A, 60A and 61A, and of FIGS. 57B, 58B, 59B, 60B and 61B are the same insofar as the horizontal transfer paths 50 and 54 are concerned.

Referring further to FIGS. 56 through 61B, horizontal transfer will be described. Since the drive signal $\phi HSL$ is supplied, in a manner not shown, there are generated a potential level of the reference level 146 always fixed, and a potential level (barrier) 148 which prohibits reverse flow of signal charges supplied from the horizontal transfer path 50, in a region directly below the electrode HSL supplied with the drive signal $\phi HSL$.

The shifting of the signal charges by the variable potential levels generated responsive to the drive signals supplied, and the constant potential levels 146, 148 will now be described. The signal charges corresponding to the colors R, G and B are referred to below as signal charges R, G and B. Initially, the transfer of the signal charge R on the horizontal transfer path 56 will be described with reference to FIGS. 57A, 58A, 59A, 60A and 61A.

The reason the signal charges may be distributed in the branching section 54 in the present alternative embodiment will now be described. There are provided impurity layers directly underneath the electrodes HP2 and HP1 of the horizontal transfer paths 56 and 58 next following the branching section 54. Thus, when the electrodes HP2 and HP1 are supplied with the level "H", there are generated stepped potential levels, that is, a level lower by one step than the reference level 146 and the deepest level. The reference level 146 is generated at all times in the branching section 54 by the constant bias voltage. This is shown for example in FIG. 57B. When the electrodes HP2 and HP1 are supplied with the level "L", there are generated a potential level higher by one step than the reference level 146 and a potential level which is the same as the reference level 146. This is shown for example in FIG. 57A. Hence, the potential level generated is sequentially lowered in steps along the signal charge transfer direction. Based on the above, the operation with lapse of time will now be described.

At time t=1 in FIG. 56, the drive signals $\phi HS1$, $\phi HS2$, $\phi HSL$ and $\phi HP1$ are supplied. The drive signals $\phi HS2$ and $\phi HP1$ are "L" in level. In case the drive signals are supplied in this manner, the signal charge B is retained in the branching section 54. At this time, there is generated, in the impurity layer directly underneath the electrode HP1 of the horizontal transfer path 56 neighboring to the electrode HSL, by the above supply of the level "L", a potential level 148 or a barrier which is just enough to prevent the signal charge B from mixing into the horizontal transfer path 56.

Figure 57B:
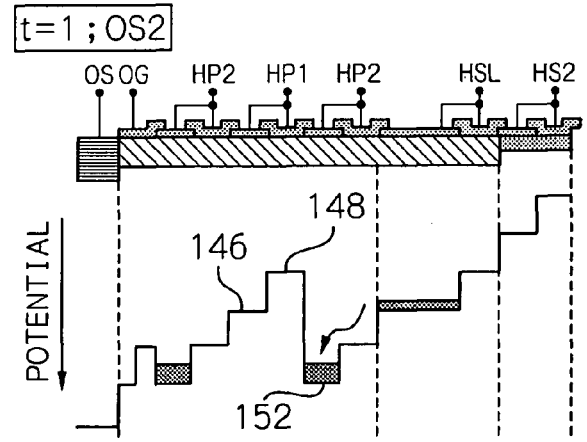

The electrode HP2 on the horizontal transfer path 58, neighboring to the branching section 54, is supplied with the potential level "H" of the drive signal $\phi HP2$. By this, a potential level 152 lower than the reference level is generated as shown in FIG. 57B such as to permit the signal charge B to flow into the horizontal transfer path 58. At this time, the signal charge B is held in both packets of the reference level 146 and the potential level 152. At time t=1, signal charges R are retained at every other electrode on the horizontal transfer path 56.

Figure 58A:
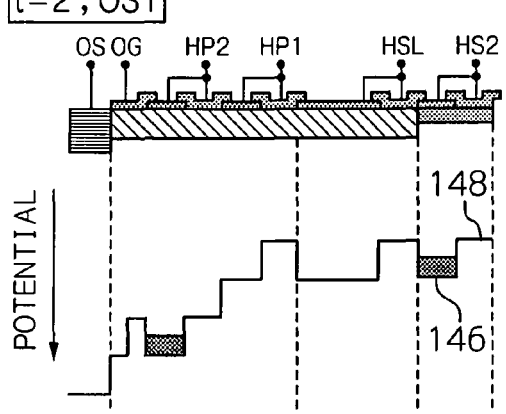
Figure 58B:
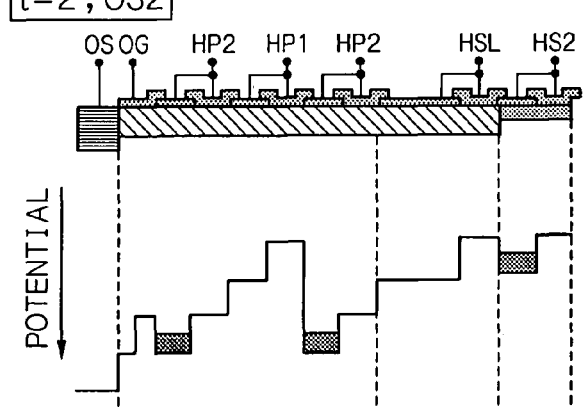

Then, at time t=2 in FIG. 54B, a drive signal $\phi HS2$ at level "H" is applied to the electrode HS2 on the horizontal transfer path 52. With the drive signal, thus applied, there are generated the potential level 148 and the reference level 146 below the electrode HS2. With these potential levels applied, a packet is generated between the electrodes HS2 and HSL. In this packet is retained the signal charge R. To the electrodes of the horizontal transfer paths 56 and 58 are supplied drive signals of the same level as that at time t=1. Hence, the potential levels generated is not changed as from time t=1. In the interim, the signal charge B is shifted from the electrode HSL to the electrode HP2 on the horizontal transfer path 58, as shown in FIG. 58B.

Figure 54C:
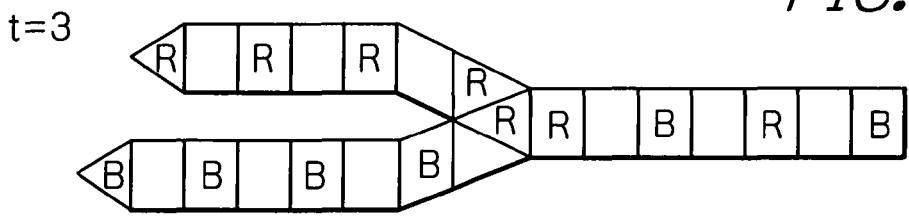
Figure 54D:
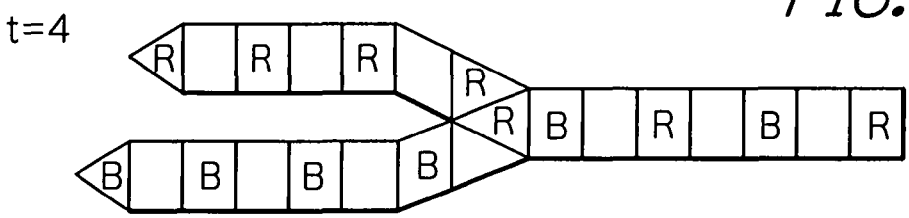
Figure 54E:
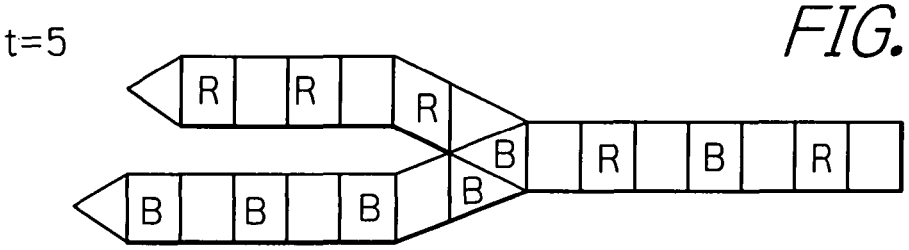
Figure 55A:
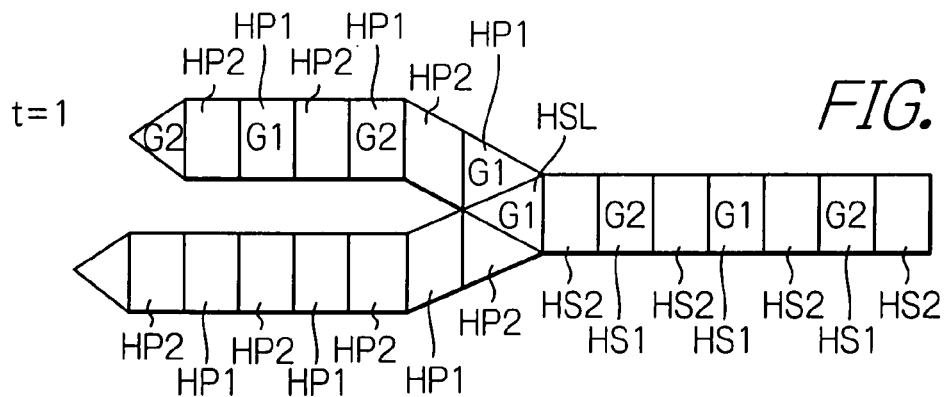
Figure 55B:
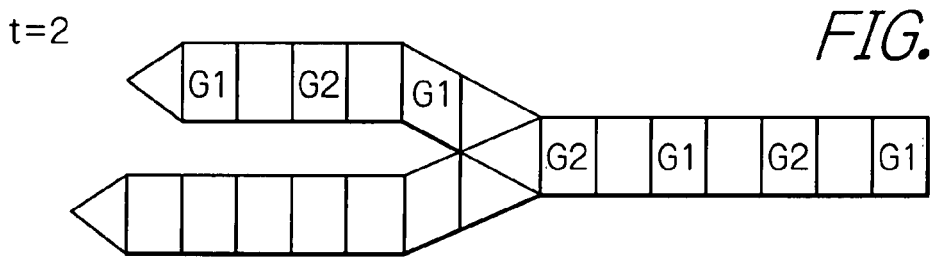
Figure 55C:
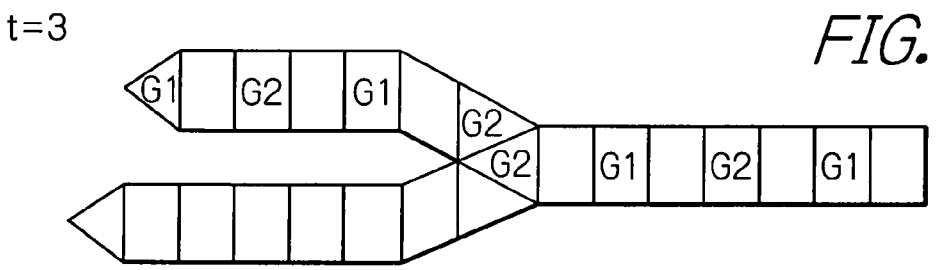
Figure 55D:
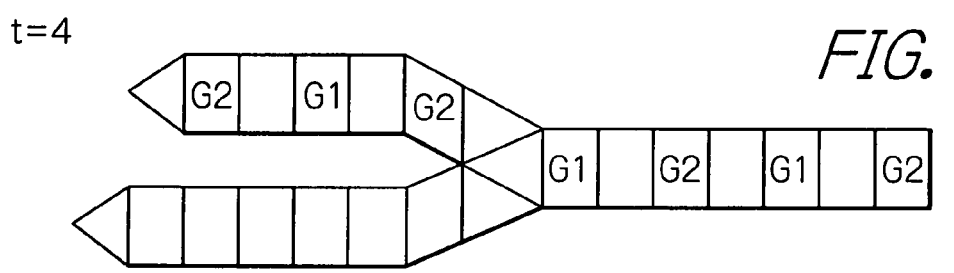
Figure 55E:
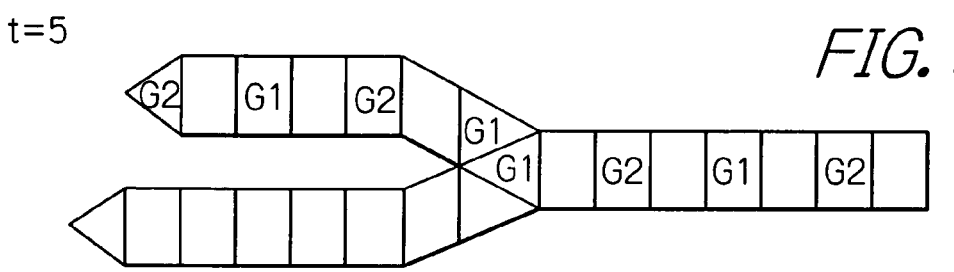
Figure 59A:
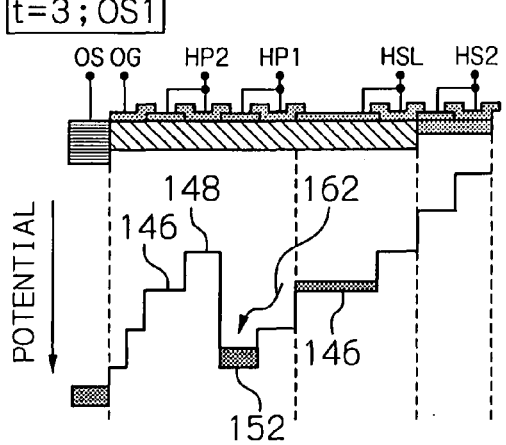
Figure 59B:
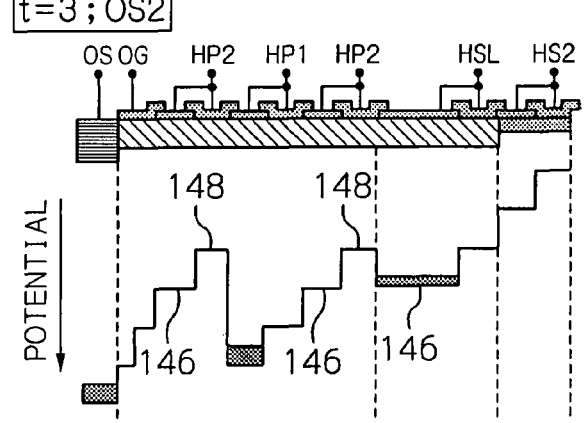
Figure 60A:
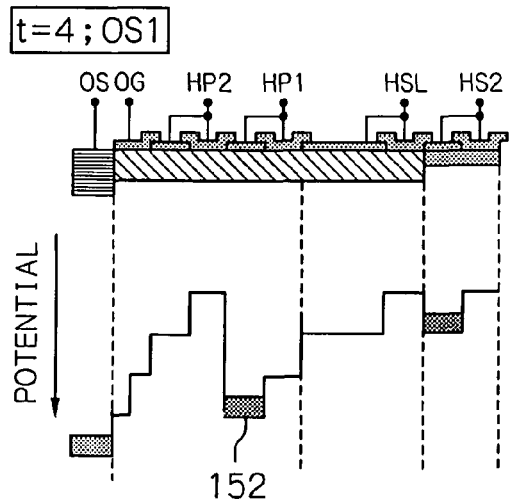
Figure 60B:
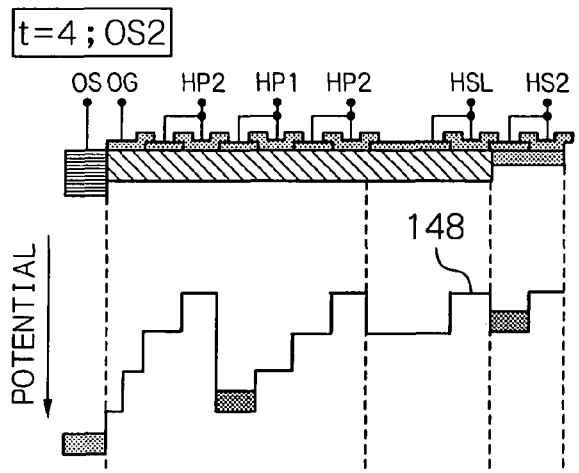

Then, at time t=3 in FIG. 54C, there is generated the drive signal φHS2 at level "L" at the electrode HS2. By this drive signal applied, the potential level is as shown at time t=1. By this potential level, the signal charge R retained in the packet generated at the electrode HS2 at time t=2 is moved to the reference level 146 of the branching section 54, as shown in FIG. 59A. At this time, the level "H" drive signal φHP1 is supplied to the electrode HP1 of the horizontal transfer path 56 neighboring to the electrode HSL. The potential level generated underneath the electrode HP1 is a low level 152 which is lower than the reference level 146. As a result, the signal charge R is held in both packets of the reference level 146 and the potential level 152. At this time, the level "L" drive signal φHP2 is supplied to the electrode HP2 on the horizontal transfer path 58. Hence, a potential level 148 is generated at the electrode HP2, as shown in FIG. 59B. This potential level 148 prohibits the signal charge R from mixing into the horizontal transfer path 58. The signal charge R of the branching section 54 is moved towards the packet generated at the electrode HP1 on the horizontal transfer path 56, as shown in FIG. 59A.

The level "L" drive signal φHP2 is supplied to the electrode HP2 on the horizontal transfer path 58 neighboring to the electrode HSL, as described above. Thus, the potential level 148 and the reference level 146 are generated below the electrode HP2, while the level "H" drive signal φHP1 is applied to the electrode HP1 neighboring to the electrode HP2. This generates a potential level one step lower than the reference level 146 and the deepest potential level below the electrode HP1. In addition, the potential level 148 and the potential level of the reference level 146 are generated by the potential level "L" supplied to the neighboring electrode HP2. As a result, the signal charge B retained by the packet at time t=2 is moved to and retained by the packet generated at the electrode HP1.

The signal charges R, B at the electrode HP2 retained in a packet generated just in rear of the output parts 60, 62 of the horizontal transfer paths 56, 58, at time t=2, are moved towards the output side with rise in the potential level, and transferred via electrode OG to the section FD.

Then, at time t=4, the level "H" drive signal φHS2 is supplied to the electrode HS2, so that there is generated a potential which is the same as that at time t=2. The signal charge B is retained in the packet generated at this time. The signal charge R at the branching section 54 is moved to the packet formed directly below the electrode HP1 of the horizontal transfer path 56. The downstream side electrodes on the horizontal transfer paths 56 and 58 are supplied with drive signals of the same level as that at time t=3. Hence, the potential levels generated are the same as those at time t=3.

Then, at time t=5, the same potential as that at time t=1 is generated at the impurity layer in register with the electrode HS2. This generates a potential level 148 directly below the HP1 neighboring to the branching section 54. The potential level 148 thus generated proves a potential barrier against the signal charge B. This signal charge B may be prohibited from mixing into the horizontal transfer path 56. The branching section 54 shifts the signal charge 148 transferred thereto further to the horizontal transfer path 58, as the branching section generates a packet. The drive signal of the same level as that at time t=1 is supplied to the horizontal transfer path 56. Hence, the potential level generated is the same as that at time t=1. At time t=5, the signal charges R, B supplied to the section FD are converted into analog voltage signals, which are then output to the output amplifier 60.

The transfer on the horizontal transfer path 58 will now be described. On the horizontal transfer path 58, there are formed a plural number of impurity layers, directly underneath the respective electrodes on a P-type substrate, in the same way as on the horizontal transfer path 56. The impurity layers are obtained on partitioning a sole impurity layer in keeping with the sizes of the electrodes of polycrystalline silicon. Each of the impurity layer has the impurity concentration adjusted, for generating preset potential levels as later described, in keeping with the voltage levels of the drive signals applied. The horizontal transfer path 58 is featured by having one more electrode than the number of the electrodes on the horizontal transfer path 56.

At time t=1, the level "H" drive signal φHP2, the drive signal φHSL of the low bias voltage and the level "L" drive signal φHP1 are supplied to each of the electrodes on the horizontal transfer path 58 as shown in FIG. 54A. With these drive signal applied, the signal charge B is retained at the branching section 54. With the drive signal φHP2 applied, the potential level at the impurity layer of the electrode HP2 on the horizontal transfer path 58 neighboring to the electrode HSL is a level 152 one step lower than the reference level 146. The potential level 148 generated below the electrode HP1 of the horizontal transfer path 56 operates as a potential barrier and prohibits mixing of the signal charge B.

Since the level "L" drive signals φHP1 is supplied to the electrode HP1, there are generated the potential level 148 and the potential level of the reference level 146 directly below the electrode HP1. The level "H" drive signals φHP2 is supplied to the electrode HP2. This generates a potential level one step lower than the reference level 146 and a potential level of the lowest level directly below the electrode HP2.

At time t=1, when the drive signals are generated as described above, there are generated packets directly below the respective electrodes HP2. The signal charges B are retained in these packets.

Then, at time t=2, the level "H" drive signal φHS2 is applied to the electrode HS2, as shown in FIG. 54B. With the drive signal applied, there is generated a potential level in the impurity layer below the electrode HS2, as shown in FIGS. 58A and 58B, to generate a packet. In this packet is retained the signal charge R. The drive signals of the same level as that at time t=1 are supplied to the further downstream side electrodes on the horizontal transfer path 58. Hence, the potential levels generated are the same as those at time t=1.

FIG. 59B shows the potential at time t=3. The level "L" drive signal φHS2 is applied at this time t=3 to the electrode HS2. With the drive signal applied, the potential level is as at time t=1. The signal charge R retained by a packet directly underneath the electrode HS2 at time t=2 is moved to the branching section 54 which is at reference level 146. At this time, the level "L" drive signal φHP2 is supplied to the electrode HP2 on the horizontal transfer path 58 neighboring to the electrode HSL. The potential level of the impurity layer underneath the electrode HP2 becomes a potential level 148 which is higher than the reference level 146. That is, a potential barrier is generated. With the barrier produced, the signal charge R is not mixed into the horizontal transfer path 58. On the other hand, a potential level 152 is generated by the level "H" supplied to the electrode HP1 on the horizontal transfer path 56. This shifts the signal charge R as indicated by an arrow 162. Directly below the electrode HP1 on the horizontal transfer path 56 supplied with the drive signal φHP1, there is generated a packet by the potential level 152 as shown in FIG. 59A.

On the horizontal transfer path 58, there is generated a packet below the electrode HP1, at time t=3, by the level "H" supplied to the drive signal φHP1. The signal charge B is retained by the packet at the electrode HP1. With rise in the potential, the signal charge B retained by the packet, generated at time t2, is moved towards the output side and transferred towards the section FD via electrode OG.

Then, at time t=4, the same potential as that at t=2 is generated directly underneath the electrode HS2. The signal charge B is retained in a packet generated at this time. The drive signals of the same level as that at time t=3 are supplied to further downstream side electrodes on the horizontal transfer path 58. Thus, the potential levels generated are of the same level as those at time t=3. The potential level generated directly underneath the electrode HP2 neighboring to the electrode HSL is in the state of the potential level 148 which is higher than the reference level 146. The potential level generated directly underneath the electrode HP1 neighboring to the electrode HSL is in the state of the potential level 152 which is lower than the reference level 146.

Then, at time t=5, the same potential as that at time t=1 is generated. The signal charge B is retained in a packet of the electrode HP2. The horizontal transfer shown in FIG. 54 is achieved as described above. The horizontal transfer operation will now be described with reference to FIGS. 54A through 54E and further with reference to FIGS. 57A through 58B.

In the horizontal transfer, the signal charges supplied at time t=1 from the horizontal transfer path 50 to the branching section 54, such as R, B, R, B, are distributed by the branching section 54 to the horizontal transfer paths 56 or 58. As may be seen from FIGS. 54A through 54E, the signal charges are retained at every other transfer element. Only the signal charge R is transferred on the horizontal transfer path 56, responsive to the drive signal supplied. On the other hand, only the signal charge B is transferred on the horizontal transfer path 58, responsive to the drive signal supplied. Since the potential barrier wall is generated at this time point at the electrode HP1 on the horizontal transfer path 56 neighboring to the branching section 54, the signal charge B is prevented from mixing into the horizontal transfer path 56.

The horizontal transfer path 50 is run at twice the frequency that of the horizontal transfer paths 56 and 58. Thus, at time t=2, the signal charges held on the horizontal transfer path 50 are horizontally transferred by one transfer element towards the branching section 54, responsive to the drive signals supplied. On the horizontal transfer path 56, no signal charge transfer occurs because the drive signals supplied are not changed in level. On the horizontal transfer path 58, no signal charge transfer occurs as well because the drive signals supplied are not changed in level. However, the signal charge B on the branching section 54 is moved to the packet generated below the electrode HP2 because the potential level, lower than the reference level 146 at the branching section 54, has been formed below the electrode HP2.

At time t=3, the signal charges held on the horizontal transfer path 50 are horizontally transferred by one transfer element towards the branching section 54. The signal charges R are retained in the packets formed on the branching section 54 and directly underneath the electrodes HP1 on the horizontal transfer path 56 neighboring to the branching section 54. At this time point, a potential barrier is generated at the electrode HP2 on the horizontal transfer path 58 neighboring to the branching section 54. Hence, the signal charge R is prohibited from mixing into the horizontal transfer path 58. The signal charges retained on the horizontal transfer paths 56 and 58, are horizontally transferred towards the output sections 60, 62, each by one transfer element, depending on the levels of the drive signals supplied. This sends the signal charges R and B to the output amplifiers 60 and 62 on the horizontal transfer paths 56 and 58.

Then, at time t=4, the signal charges retained on the horizontal transfer path 50 are horizontally transferred, each by one transfer element, towards the branching section 54, depending on the drive signals supplied. The signal charge R is moved to the packet generated directly below the electrode HP1 on the horizontal transfer path 56 neighboring to the branching section 54.

Then, at time t=4, the signal charges, held on the horizontal transfer path 50, are horizontally transferred, each by one transfer element, towards the branching section 54, depending on the drive signals supplied. The signal charge R is moved to the packet, generated directly underneath the electrode HP1 of the horizontal transfer path 56 neighboring to the branching section 54.

At time t=5, the signal charges held on the horizontal transfer paths 50, 56 and 58 are horizontally transferred towards the output side, each by one transfer element. The signal charges of the colors R and B are then transformed simultaneously into corresponding analog voltage signals, so as to be output as output signals OS1 and OS2 from the output amplifiers 60 and 62, respectively. These output signals OS1 and OS2 are processed by completely parallel processing. This eliminates differential signal intensities attributable to processing in the time domain of the output signals OS1 and OS2. Meanwhile, in case the differential signal intensities attributable to processing in the time domain are tolerable, the output signals OS1 and OS2 may be output alternately.

By the above processing, the signal charges may be transferred and output without mixing. In general, in keeping with increasing numbers of pixels, it is required of a solid state imaging device to read out the signal charges at a high speed. In order to meet this demand, it is necessary to raise the frequency range of the output amplifiers on the horizontal transfer paths. The solid state imaging device is difficult to drive at a frequency higher than a preset frequency. This is due for example to shortage in the frequency band of the output amplifier. With the device 44 of the instant alternative embodiment, it is possible to read out output signal charges, from color to color, without the frequency of the output amplifier increased, by bifurcating an output and increasing the number of output channels, even though the driving frequency of the horizontal transfer path 50 is raised to cope with the increasing number of pixels. That is, an improved signal charge readout speed may be achieved.

The drive signals on the horizontal transfer paths 50, 54, 56 and 58 for transferring signal charges of the same color G, G, G, G, . . . on the lines 252 and 254 will now be described. For signal charges of the same color only the horizontal transfer path 56 out of the horizontal transfer paths 56 and 58 is used in the present alternative embodiment. In this case, the drive signals φHS1 and φHS2 shown in FIG. 56, parts (A) and (B), are of the same frequency as the drive signals φHP1 and φHP2 shown in parts (C) and (D). That is, the drive signals φHS1 and φHS2 are lower in speed than in FIG. 56.

At time t=1, the drive signal φHS2 supplied to the last stage HS2 on the horizontal transfer path 50 is "L", while the drive signal φHP1 supplied to the last stage HP1 is "H", and drive signal φHP2 supplied to the final stage HP2 is "L". Hence, the signal charge is transferred via branching section (HSL) 54 to the electrode HP1, that is, to the horizontal transfer path 56.

Figures 63A, 63B:
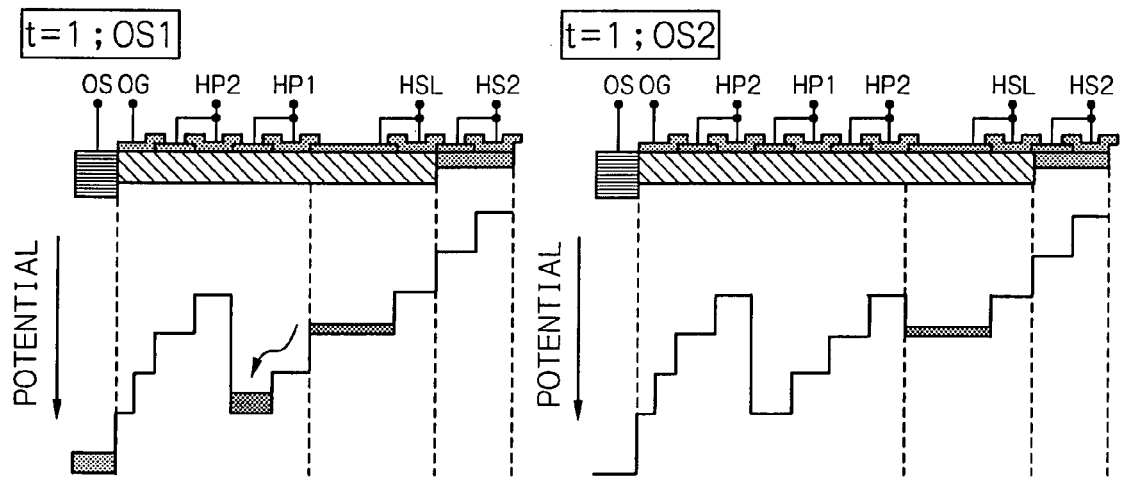
Figures 64A, 64B:
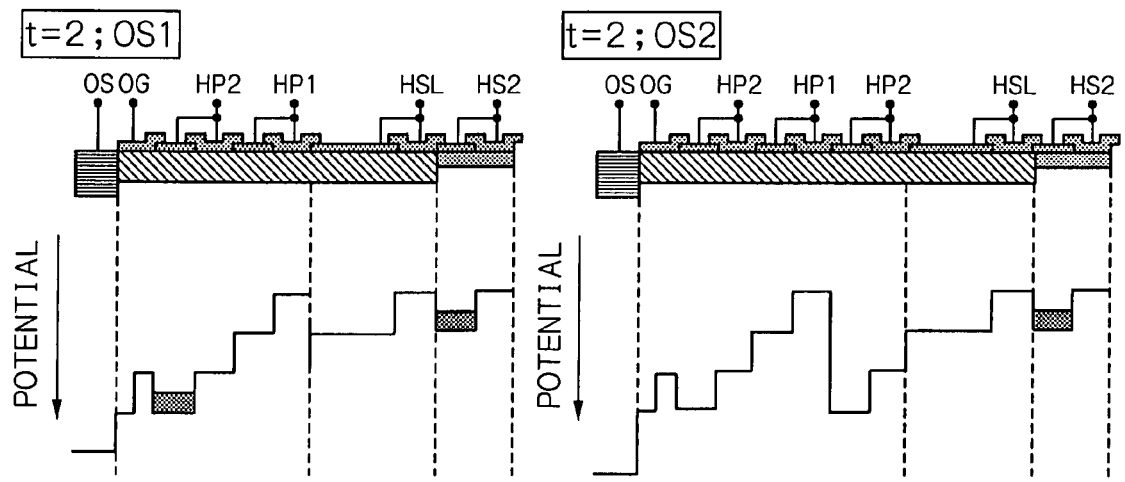

The potential levels generated on the horizontal transfer paths 50, 54, 56 and 58, when the above drive signals are applied thereto, are shown in FIGS. 63A through 64B. FIGS. 63A through 64B show the structure shown in FIG. 52. A simplified form of FIG. 52 is also shown for indicating the potential positions. FIGS. 63A and 63B are for time t=1 of FIG. 62, and FIGS. 64A and 64B are for time t=2 of FIG. 62. FIGS. 63A and 64A stand for the horizontal transfer paths 50, 54 and 56, and FIGS. 63B and 64B stand for the horizontal transfer paths 50, 54 and 58.

At time t=2, the drive signals φHS2 supplied to the last electrode HS2 of the horizontal transfer path 50 is at level "H". The drive signals φHP1 supplied to the electrode HP1 is at level "L" and the drive signal φHP2 supplied to the electrode HP2 is at level "H". Thus, the signal charge is at the transfer element HS2. The signal charge is also transferred from the transfer element HP1 to the transfer element HP2.

The state at time t=3 is the same as that at time t=1, while the state at time t=4 is the same as that at time t=2. The reason the states at time t=1 and those at time t=2 are repeated is that the drive signals φHS1, φHS2, φHP1 and φHP2 are of the same frequency and the phase adjustment has been made so that only the two states will be generated.

As for the output parts, the reset signal φRS shown in FIG. 62, part (E), is applied, while the output signals OS1, OS2 shown in FIG. 62, parts (F) and (G), are output. As for the transfer of the signal charges G, the device 44 is in one-line outputting state for outputting only the output signal OS1, while the output signal OG2 is not used. Hence, the power supply for the output amplifier 62 may be turned off. In this case, the power supply by the amplifier power supply 16 is controlled by the control signal 86 from the power supply control 122 to turn off the power supply 66.

It is also possible to reverse the phase of each of the drive signals φHP1, φHP2, φHS1 and φHS2, in order to run only the output amplifier 62. By so doing, only the horizontal transfer path 58 may be run by way of one-line outputting. Thus, in the instant alternative embodiment, it is readily possible to switch between one-line outputting and two-line outputting or to freely select the output amplifiers.

If the sequence of R and B pixels in the first line and that in the second line are compared to each other, the sequence on the first line 201 is R, B, R, B, while that on the second line 252 is B, R, B, R, as shown in FIG. 53. Thus, the first pixels of the lines differ from each other. If the same horizontal transfer drive signals are used for the first and second lines, the pixels output from the output amplifier 60 differ from line to line. The same may be said of the output amplifier 62. The output amplifiers 60 and 62 slightly differ from each other in characteristics, such as gain, so that step differences are produced at the output stages for the same color. For avoiding this, the same color is desirably output from the same output amplifier. The method for implementing this will now be described.

Figure 65:
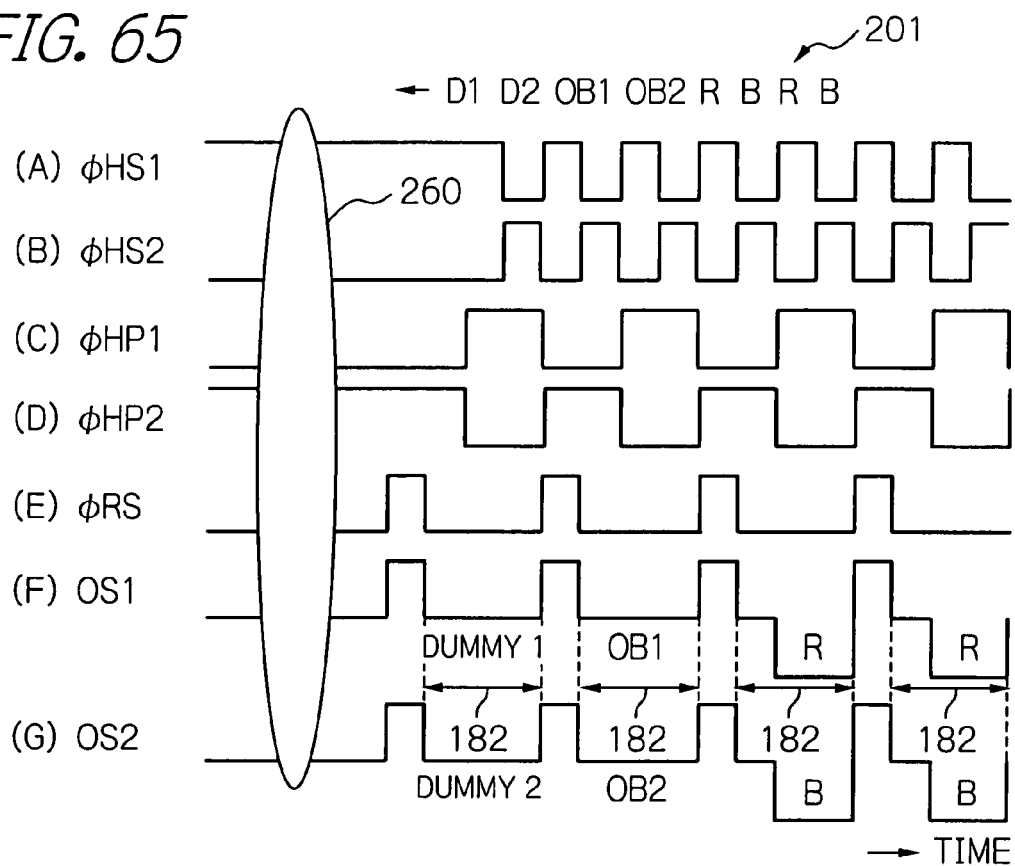
FIGS. 65 and 66 are timing charts showing drive signals for providing the same color of the signal charges output from the same output amplifier in the first and second lines.
Figure 66:
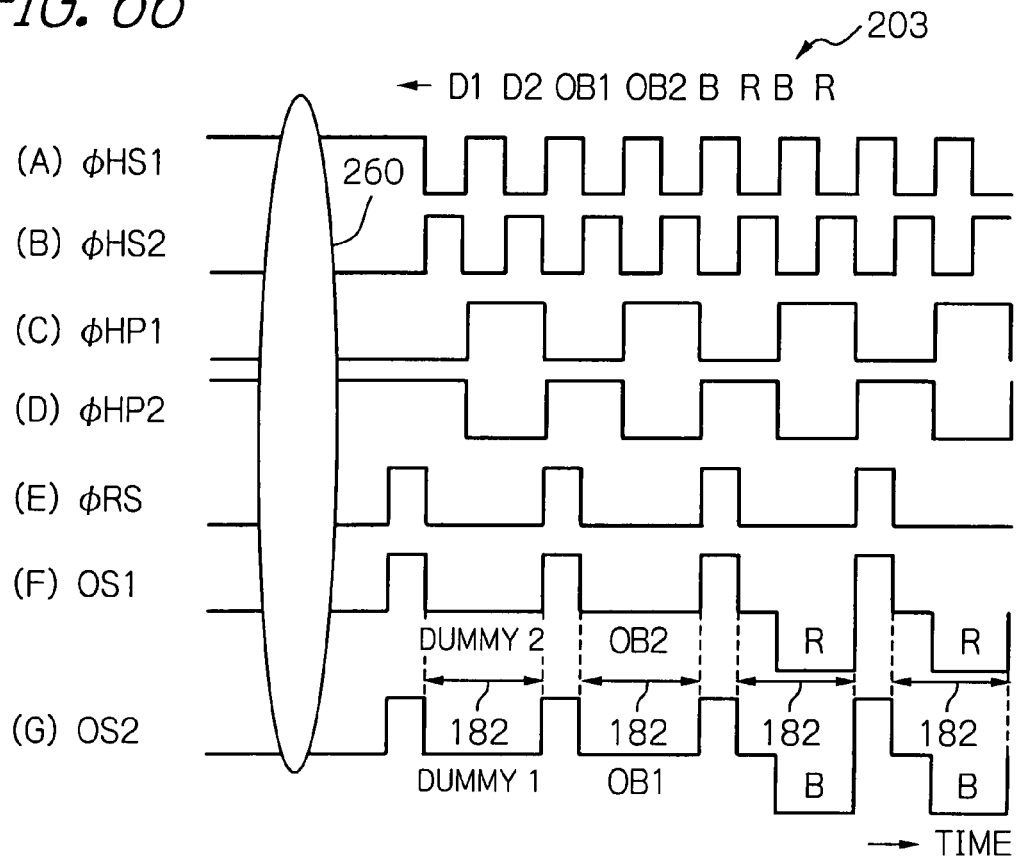
Figure 67A:
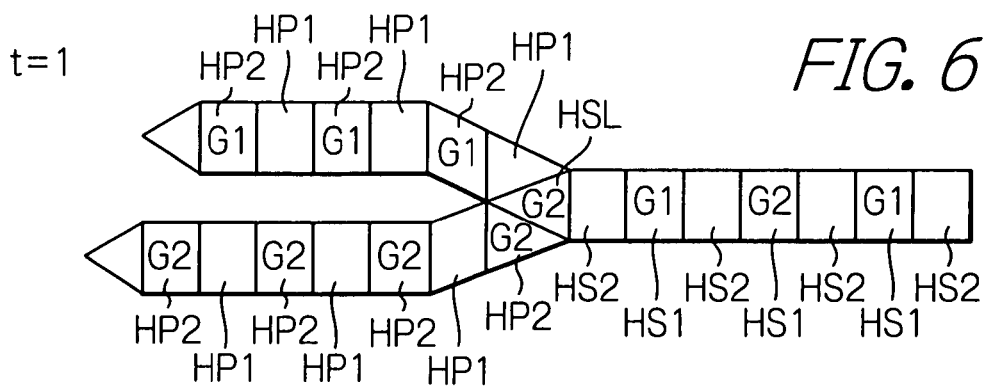
FIGS. 67A to 67E schematically illustrate the transfer of signal charges G in two horizontal transfer paths.
Figure 67B:
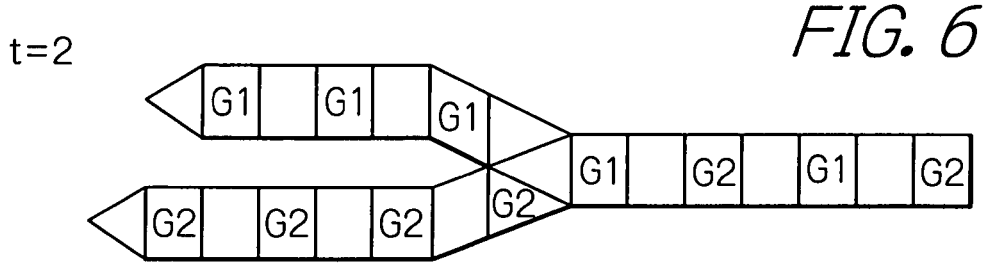
Figure 67C:
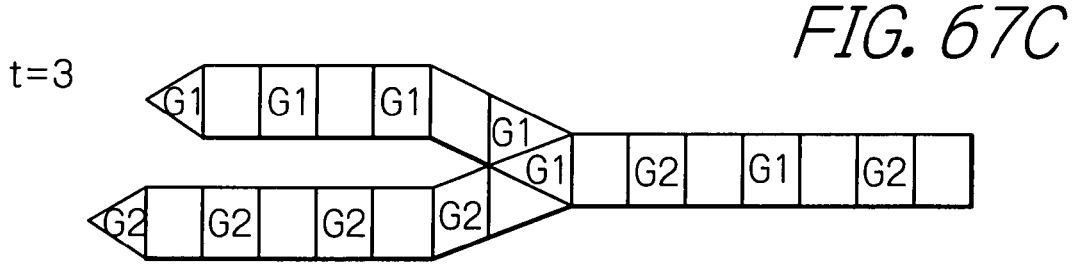
Figure 67D:
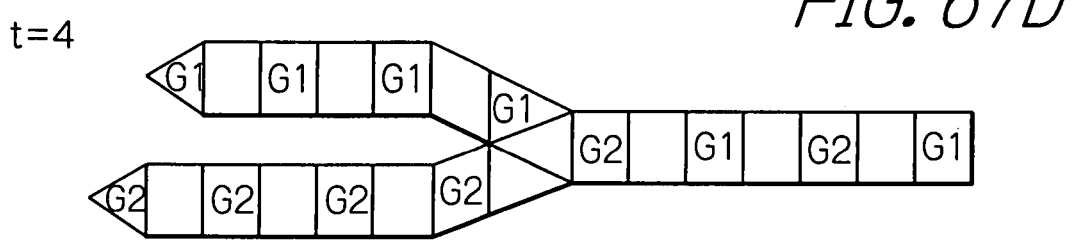
Figure 67E:
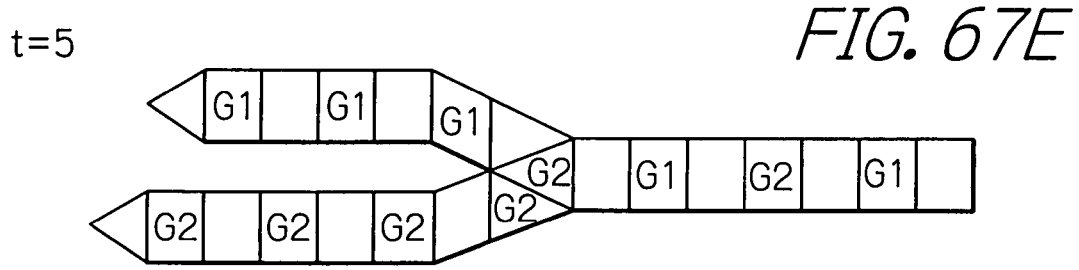

The horizontal transfer drive signals for horizontal transfer on the lines 201, 203 of the first and second lines are shown in FIGS. 65 and 66, respectively. Initially, the horizontal transfer on the line 201 will be described with reference to FIG. 65. From the line 201, the signal charges are transferred through the vertical transfer paths to the horizontal transfer path 50, beginning from the line 201, in the sequence of the dummy pixels D1 and D2, optically black pixels OB1 and OB2, R, B, . . . .

The drive signals φHS1 and φHS2 shown in FIGS. 65 and 66 are supplied to transfer the signal charges held on the horizontal transfer path 50, to the horizontal transfer paths 56 and 58. To these horizontal transfer paths 56 and 58, the drive signals φHP1 and φHP2 shown in FIG. 62, parts (C) and (D), are supplied. The transfer start position is such a position where the potential of the drive signal is changed for the first time from the lapse of the horizontal blanking period 260. In outputting, the reset signal φRS shown in FIG. 62, part (E), is supplied directly before the signal charge is supplied to the output stage, and the output signal is subsequently output in the output period 182.

The output stage converts signal charges into an analog voltage signal, and outputs the dummy D2, optical black OB2 and R, R . . . , in each output time domain 182 as output signal OS1 of FIG. 62, part (F). The output stage also outputs the dummy D1, optical black OB1 and B, B, . . . , in each output time domain 182 as output signal OS2 of FIG. 62, part (G). That is, the output signal OS1 on the horizontal transfer path 56 outputs the color R, while the output signal OS2 on the horizontal transfer path 58 outputs the color B.

On the other hand, in horizontally transferring the second line 203, outputting is switched to the first line 201. Hence, the drive signals φHS1 and φHS2 shown in FIG. 66, parts (A) and (B), respectively, are used. The other signals are the same as those of the first line. On the second line, as compared to the first line, the start positions of the drive signals φHS1 and φHS2 are faster by one period of these drive signals.

Hence, the output stage outputs the dummy D1, the optical black signal OB1 and R, R . . . , in each output time domain 182, as output signal OS1 of FIG. 66, part (F). The output stage also outputs the dummy D2, the optical black signal OB2 and B, B . . . , in each output time domain 182, as output signal OS2 of FIG. 66, part (G). In this manner, for the first and second lines, the same colors may be output from the same output stages.

In the present alternative embodiment, the technique of phase-shifting the drive signal φHS is used. The present invention is not limited to this and outputting may be to the horizontal transfer path 50 after re-arraying employing a line memory. FIGS. 65 and 66 show a case where the drive signals φHS1 and φHS2 are fast. However, the same technique may be used in case the speed of the drive signals φHS1 and φHS2 is low. In either case, the output signals may be changed over extremely readily.

In FIGS. 55A through 55E, the signal charges G are transferred only on the horizontal transfer path 50. Alternatively, the signal charges G may also be transferred using the horizontal transfer paths 56 and 58 as shown in FIGS. 67A through 67E. For the horizontal drive signals, it is sufficient to use the signals shown in FIG. 56. In this case, high speed transfer becomes possible with the signal charges G. However, since the same color is output from the different output stages, step differences for the same color, attributable to the output stages, may be produced.

As techniques for coping with the step difference, the following technique, for example, may be used. Data for correcting the difference in characteristics among plural output stages, such as gain difference, are acquired prior to shipment of the camera 10 from a plant. As the method for acquiring the data, a light source of a preset light volume is shot by the camera, and measurement is made of the output value of the signal charges G of the output stages 60, 62. Coefficient data for providing for the same output values of the output stages 60 and 62 are calculated and held in a non-volatile memory in the camera 10. In post-shipment correction, the signal processor 26 reads out the coefficient data stored in the memory, and multiplies the coefficient data by output values of the output stages 60 and 62 to correct the gain difference. This provides for the same output values of the signal charges G.

The entire disclosure of Japanese patent application Nos. 2006-094407, 2006-094567, 2006-095198 and 2006-095374, all filed on Mar. 30, 2006, including the specifications, claims, accompanying drawings and abstracts of the disclosure is incorporated herein by reference in the entirety thereof.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A solid state imaging device including:
   a two-dimensional array of photosensitive cells supplied with incident light from a field being imaged, via color filter segments for color separating the incident light, said photosensitive cells transducing the light transmitted through said color filter segments into electrical signals depending on a volume of transmitted light, the signal charges having color attributes, said device reading out from each of said photosensitive cells and transferring in a vertical direction;
   a first horizontal transfer circuit for transferring signal charges in a horizontal direction perpendicular to the vertical direction;
   a branching circuit arranged adjacent to an output end of said first horizontal transfer circuit for transiently holding the signal charges transferred and for distributing the signal charges to a plurality of output destinations related with the color attributes of the signal charges;
   a plurality of second horizontal transfer circuits connected to said branching circuit as branching destinations; and
   a plurality of output circuits each provided at an output end of each of said second horizontal transfer circuits, said output circuits each converting the signal charges into an analog voltage signal responsive to the amount of the signal charges to output the analog voltage signal;
   the signal charges supplied to said branching circuit at a horizontal transfer speed during horizontal transfer not lower than a preset transfer speed being classified depending on the color attributes and transferred to each of said second horizontal transfer circuits, said output circuits each converting the signal charges into said analog voltage signals;
   the analog voltage signals being output from selected second horizontal transfer circuit during horizontal transfer speed lower than said preset transfer speed, said output circuit converting the signal charges into said analog voltage signals;
   said plural output circuits exhibiting differential detection sensitivities for the signal charges depending on the color attributes of the signal charges supplied;
   said output circuits outputting the analog voltage signals.

2. The solid state imaging device in accordance with claim 1, wherein each of said output circuits includes an amplifier circuit for amplifying said analog voltage signals, said amplifier circuits having differential gate capacitances from each other.

3. The solid state imaging device in accordance with claim 1, wherein each of said output circuits includes a floating diffusion layer for converting the signal charges into said analog voltage signals, said output circuits having differential surface areas of said floating diffusion layers from each other.

4. The solid state imaging device in accordance with claim 1, wherein at least one of said output circuits includes a floating diffusion layer for converting the signal charges into said analog voltage signals, a nitride layer provided on the surface of said floating diffusion layer, the nitride film formed on each of said output circuits having differential thickness from each other.

5. The solid state imaging device in accordance with claim 4, wherein at least one of said plural output circuits is not provided with said floating diffusion layer.

6. A method for driving a solid state imaging device for transferring signal charges having color attributes, comprising the steps of:
   preparing a solid state imaging device which includes:
   a plurality of vertical transfer circuits for reading out signal charges having color attributes from each of photosensitive cells adapted for transducing incident light into an electrical signal, said vertical transfer circuits transferring the read-out signal charges having the color attributes in the vertical direction,
   a horizontal transfer circuit for transferring the signal charges transferred from said vertical transfer circuits, in the horizontal direction, and
   a plurality of horizontal transfer circuits branched from a transfer region adapted for branching the signal charges supplied from said horizontal transfer circuit, the signal charges having color attributes, said plural horizontal transfer circuits having differential detection sensitivities to the signal charges having the color attributes;
   classifying the signal charges, supplied to said branching transfer region with high speed driving with the horizontal transfer speed not less than a preset transfer speed, according to the color attributes, sending the signal charges of the color attributes on each of said plural horizontal transfer circuits, converting the signal charges of the color attributes into analog voltage signals, and outputting the analog voltage signals;
   sending the signal charges on selected horizontal transfer circuit with low speed driving at a horizontal transfer speed lower than the predetermined transfer speed the signal charges, converting the signal charges into analog voltage signals, and outputting the analog voltage signals from the selected horizontal transfer circuit; and
   changing the phase of a driving pattern in horizontal transfer, before branching, with respect to the driving in at least one branched horizontal transfer, and adjusting the branched output destination of the signal charges having color attributes.

7. The method in accordance with claim 6 wherein in said solid state imaging device said horizontal transfer circuit before branching is set as a first horizontal transfer circuit, one of said plural horizontal transfer circuits having the detection sensitivity for the signal charges having color attributes higher than a predetermined detection sensitivity is set as second horizontal transfer circuit, one of said plural horizontal transfer circuits having the detection sensitivity for the signal charges having color attributes lower than the predetermined detection sensitivity is set as third horizontal transfer circuit;
   said method further comprising the step of transferring green signal charges on said second horizontal transfer circuit and red and blue signal charges on said third horizontal transfer circuit at high speed driving.

8. The method in accordance with claim 6 wherein in said solid state imaging device said horizontal transfer circuit before branching is set as a first horizontal transfer circuit, one of said plural horizontal transfer circuits having the detection sensitivity for the signal charges having color attributes higher than a predetermined detection sensitivity is set as a second horizontal transfer circuit, one of said plural horizontal transfer circuits having the detection sensitivity for the signal charges having color attributes lower than the predetermined detection sensitivity is set as a third horizontal transfer circuit;

said method further comprising the step of transferring red and blue signal charges on said second horizontal transfer circuit and green signal charges on said third horizontal transfer circuit at high speed driving.

9. The method in accordance with claim 7 further comprising the steps of:

transferring green signal charges on said second horizontal transfer circuit and transferring red and blue charges on said third horizontal transfer circuit, by the high speed driving in a first driving mode; and transferring red and blue signal charges on said second horizontal transfer circuit and transferring green charges on said third horizontal transfer circuit, by the high speed driving in a second driving mode.

10. The method in accordance with claim 7 wherein the first driving mode is an automatic exposure mode or an automatic focusing mode, and the second driving mode is a mode other than the first mode.

11. The method in accordance with claim 6 further comprising the step of selecting said horizontal transfer circuit having detection sensitivity not lower than a predetermined detection sensitivity for signal charges having color attributes with the low speed driving to transfer signal charges.

12. The method in accordance with claim 6 further comprising the step of selecting said horizontal transfer circuit having detection sensitivity lower than a predetermined detection sensitivity for signal charges having color attributes with the low speed driving to transfer signal charges.

13. The method in accordance with claim 6 wherein in said solid state imaging device said horizontal transfer circuit before branching is set as a first horizontal transfer circuit, one of said plural horizontal transfer circuits having the detection sensitivity for the signal charges having color attributes higher than a predetermined detection sensitivity is set as a second horizontal transfer circuit, one of said plural horizontal transfer circuits having the detection sensitivity for the signal charges having color attributes lower than the predetermined detection sensitivity is set as a third horizontal transfer circuit;

said method further comprising the steps of:

selecting the horizontal transfer circuit used, depending on whether or not a selected sensitivity is not lower than the detection sensitivity;

driving said third horizontal transfer circuit at a high sensitivity as the selected sensitivity not lower than the predetermined detection sensitivity; and driving said second horizontal transfer circuit at a low sensitivity as the selected sensitivity lower than the predetermined detection sensitivity.

14. The method in accordance with claim 11 further comprising the steps of:

independently controlling power supply used for driving said plural horizontal transfer circuits; and interrupting the power supply used for driving horizontal driving circuit excluding horizontal transfer circuit used for the low speed driving.

15. The method in accordance with claim 6 wherein in said solid state imaging device said horizontal transfer circuit before branching is set as a first horizontal transfer circuit, said solid state imaging device including three horizontal transfer circuits as said plural horizontal transfer circuits;

said three horizontal transfer circuits setting the detection sensitivity of the signal charges having color attributes in three stages;

said method classifying the signal charges having color attributes in the high speed driving according to the color attributes and transfers the signal charges classified.

16. The method in accordance with claim 6 wherein in said solid state imaging device said horizontal transfer circuit before branching is set as a first horizontal transfer circuit, said solid state imaging device including four horizontal transfer circuits as said plural horizontal transfer circuits;

said four horizontal transfer circuits setting the detection sensitivities for the signal charges having color attributes in three stages, setting charge the detection sensitivities for green signal charge neighboring to red color and green signal charge neighboring to red color to the same charge detection sensitivity different from the remaining two sensitivities;

said method further comprising the step of classifying the signal charges having color attributes in the high speed driving according to the color attributes and transfers the signal charges classified.

17. A solid state imaging apparatus including a solid state imaging device, said solid state imaging device including:

a plurality of photosensitive cells arrayed in a matrix of rows and columns for photo-electrically transducing incident light from a field being imaged into signal charges;

vertical transfer circuits for vertically transferring the signal charges read out from said photosensitive cells;

a first horizontal transfer circuit for receiving the signal charges vertically transferred from said vertical transfer circuits to transfer the received signal charges horizontally;

a branching circuit arranged at an output end of each of said first horizontal transfer circuit for distributing the horizontally transferred signal charges to any one of a plurality of output destinations;

second and third transfer circuits for receiving the signal charges distributed from said branching circuit to further horizontally transfer the signal charges; and first and second output circuits arranged at output ends of said second and third horizontal transfer circuits, respectively, for generating electrical signals from the signal charges;

said apparatus comprising a pre-branching transfer circuit arranged directly upstream of said branching circuit in said first horizontal transfer circuit for transferring the signal charges transferred by said first horizontal transfer circuit to said branching circuit;

at least either one of a duty cycle and a period of the drive signal driving said pre-branching transfer circuit being changed to provide for transfer time from said pre-branching transfer circuit to said branching circuit longer than a usual transfer time, further comprising a plurality of color filter segments arranged in register with said photosensitive cells for color separating the incident light into three primary colors of red, green and blue to cause the light of the respective colors to be incident on said photosensitive cells, wherein said photosensitive cells acquiring the incident light indicating red, green or blue colors, as primary colors, from said color filter segments, photo-electrically transduce the light into the signal charges of red, green or blue colors;

said branching circuit transferring signal charges of the red and blue colors to second horizontal transfer circuits and transferring the green signal charges to said third horizontal transfer circuits;

at least either one of the duty cycle and the period of the drive signal driving said pre-branching transfer circuit being changed to provide for transfer time of the red and blue color signal charges from said pre-branching transfer circuit to said branching circuit longer than the usual transfer time.

18. The solid state imaging apparatus in accordance with claim 17 wherein at lease either one of the duty cycle and the period of said drive signal driving at least one of said second and third horizontal transfer circuits is changed to provide for transfer time of said red and blue signal charges from said branching circuit to said second horizontal transfer circuits longer than the usual transfer time.

19. A solid state imaging apparatus including a solid state imaging device, said solid state imaging device including:
  a plurality of photosensitive cells arrayed in a matrix of rows and columns for photo-electrically transducing incident light from a field being imaged into signal charges;
  vertical transfer circuits for vertically transferring the signal charges read out from said photosensitive cells;
  a first horizontal transfer circuit for receiving the signal charges vertically transferred from said vertical transfer circuits to transfer the received signal charges horizontally;
  a branching circuit arranged at an output end of each of said first horizontal transfer circuit for distributing the horizontally transferred signal charges to any one of a plurality of output destinations;
  second and third transfer circuits for receiving the signal charges distributed from said branching circuit to further horizontally transfer the signal charges; and
  first and second output circuits arranged at output ends of said second and third horizontal transfer circuits, respectively, for generating electrical signals from the signal charges;
  said apparatus comprising a pre-branching transfer circuit arranged directly upstream of said branching circuit in said first horizontal transfer circuit for transferring the signal charges transferred by said first horizontal transfer circuit to said branching circuit;
  at least either one of a duty cycle and a period of the drive signal driving said pre-branching transfer circuit being changed to provide for transfer time from said pre-branching transfer circuit to said branching circuit longer than a usual transfer time,
  further comprising a temperature detector for detecting a temperature of said solid state imaging device; wherein
  in case the temperature detected by said temperature detectors is lower than a predetermined value, the transfer time is set to a longer time.

20. A solid state imaging apparatus including a solid state imaging device, said solid state imaging device including:
  a plurality of photosensitive cells arrayed in a matrix of rows and columns for photo-electrically transducing incident light from a field being imaged into signal charges;
  vertical transfer circuits for vertically transferring the signal charges read out from said photosensitive cells;
  a first horizontal transfer circuit for receiving the signal charges vertically transferred from said vertical transfer circuits to transfer the received signal charges horizontally;
  a branching circuit arranged at an output end of each of said first horizontal transfer circuit for distributing the horizontally transferred signal charges to any one of a plurality of output destinations;
  second and third transfer circuits for receiving the signal charges distributed from said branching circuit to further horizontally transfer the signal charges; and
  first and second output circuits arranged at output ends of said second and third horizontal transfer circuits, respectively, for generating electrical signals from the signal charges;
  said apparatus comprising a pre-branching transfer circuit arranged directly upstream of said branching circuit in said first horizontal transfer circuit for transferring the signal charges transferred by said first horizontal transfer circuit to said branching circuit;
  at least either one of a duty cycle and a period of the drive signal driving said pre-branching transfer circuit being changed to provide for transfer time from said pre-branching transfer circuit to said branching circuit longer than a usual transfer time,
  further comprising a temperature detector for detecting a temperature of said solid state imaging device; wherein
  in case the temperature detected by said temperature detectors is higher than a predetermined value, the transfer time is set to a usual value.

21. A solid state imaging apparatus including a solid state imaging device, said solid state imaging device including:
  a plurality of photosensitive cells arrayed in a matrix of rows and columns for photo-electrically transducing incident light from a field being imaged into signal charges;
  vertical transfer circuits for vertically transferring the signal charges read out from said photosensitive cells;
  a first horizontal transfer circuit for receiving the signal charges vertically transferred from said vertical transfer circuits to transfer the received signal charges horizontally;
  a branching circuit arranged at an output end of each of said first horizontal transfer circuit for distributing the horizontally transferred signal charges to any one of a plurality of output destinations;
  second and third transfer circuits for receiving the signal charges distributed from said branching circuit to further horizontally transfer the signal charges; and
  first and second output circuits arranged at output ends of said second and third horizontal transfer circuits, respectively, for generating electrical signals from the signal charges;
  said apparatus comprising a pre-branching transfer circuit arranged directly upstream of said branching circuit in said first horizontal transfer circuit for transferring the signal charges transferred by said first horizontal transfer circuit to said branching circuit;
  at least either one of a duty cycle and a period of the drive signal driving said pre-branching transfer circuit being changed to provide for transfer time from said pre-branching transfer circuit to said branching circuit longer than a usual transfer time,
  further comprising a color temperature detector for detecting a color temperature of a field being imaged;

said transfer time being made longer in case the color temperature as detected by said color temperature detector is higher or lower than a predetermined range.

22. A solid state imaging apparatus including a solid state imaging device, said solid state imaging device including:
- a plurality of photosensitive cells arrayed in a matrix of rows and columns for photo-electrically transducing incident light from a field being imaged into signal charges;
- vertical transfer circuits for vertically transferring the signal charges read out from said photosensitive cells;
- a first horizontal transfer circuit for receiving the signal charges vertically transferred from said vertical transfer circuits to transfer the received signal charges horizontally;
- a branching circuit arranged at an output end of each of said first horizontal transfer circuit for distributing the horizontally transferred signal charges to any one of a plurality of output destinations;
- second and third transfer circuits for receiving the signal charges distributed from said branching circuit to further horizontally transfer the signal charges; and
- first and second output circuits arranged at output ends of said second and third horizontal transfer circuits, respectively, for generating electrical signals from the signal charges;
- said apparatus comprising a pre-branching transfer circuit arranged directly upstream of said branching circuit in said first horizontal transfer circuit for transferring the signal charges transferred by said first horizontal transfer circuit to said branching circuit;
- at least either one of a duty cycle and a period of the drive signal driving said pre-branching transfer circuit being changed to provide for transfer time from said pre-branching transfer circuit to said branching circuit longer than a usual transfer time,
- wherein the transfer time is made longer in case of higher sensitivity.

23. A solid state imaging apparatus including a solid state imaging device, said solid state imaging device including:
- a plurality of photosensitive cells arrayed in a matrix of rows and columns for photo-electrically transducing incident light from a field being imaged into signal charges;
- vertical transfer circuits for vertically transferring the signal charges read out from said photosensitive cells;
- a first horizontal transfer circuit for receiving the signal charges vertically transferred from said vertical transfer circuits to transfer the received signal charges horizontally;
- a branching circuit arranged at an output end of each of said first horizontal transfer circuit for distributing the horizontally transferred signal charges to any one of a plurality of output destinations;
- second and third transfer circuits for receiving the signal charges distributed from said branching circuit to further horizontally transfer the signal charges; and
- first and second output circuits arranged at output ends of said second and third horizontal transfer circuits, respectively, for generating electrical signals from the signal charges;
- said apparatus comprising a pre-branching transfer circuit arranged directly upstream of said branching circuit in said first horizontal transfer circuit for transferring the signal charges transferred by said first horizontal transfer circuit to said branching circuit;
- at least either one of a duty cycle and a period of the drive signal driving said pre-branching transfer circuit being changed to provide for transfer time from said pre-branching transfer circuit to said branching circuit longer than a usual transfer time,
- wherein said transfer time is made a usual transfer time at a time of low speed driving.

24. A solid state imaging apparatus including a solid state imaging device, said solid state imaging device including:
- a plurality of photosensitive cells arrayed in a matrix of rows and columns for photo-electrically transducing incident light from a field being imaged into signal charges;
- vertical transfer circuits for vertically transferring the signal charges read out from said photosensitive cells;
- a first horizontal transfer circuit for receiving the signal charges vertically transferred from said vertical transfer circuits to transfer the received signal charges horizontally;
- a branching circuit arranged at an output end of each of said first horizontal transfer circuit for distributing the horizontally transferred signal charges to any one of a plurality of output destinations;
- second and third transfer circuits for receiving the signal charges distributed from said branching circuit to further horizontally transfer the signal charges; and
- first and second output circuits arranged at output ends of said second and third horizontal transfer circuits, respectively, for generating electrical signals from the signal charges;
- said apparatus comprising a pre-branching transfer circuit arranged directly upstream of said branching circuit in said first horizontal transfer circuit for transferring the signal charges transferred by said first horizontal transfer circuit to said branching circuit;
- at least either one of a duty cycle and a period of the drive signal driving said pre-branching transfer circuit being changed to provide for transfer time from said pre-branching transfer circuit to said branching circuit longer than a usual transfer time;
- further comprising a signal processing circuit for removing the noise in the electrical signals by a correlated double sampling system; wherein
- a phase of a sampling pulse used in the correlated double sampling system is changed in case the transfer time is changed.

25. A solid state imaging apparatus including a solid state imaging device, said solid state imaging device including:
- a plurality of photosensitive cells arrayed in a matrix of rows and columns for photo-electrically transducing incident light from a field being imaged into signal charges;
- vertical transfer circuits for vertically transferring the signal charges read out from said photosensitive cells;
- a first horizontal transfer circuit for receiving the signal charges vertically transferred from said vertical transfer circuits to transfer the received signal charges horizontally;
- a branching circuit arranged at an output end of each of said first horizontal transfer circuit for distributing the horizontally transferred signal charges to any one of a plurality of output destinations;
- second and third transfer circuits for receiving the signal charges distributed from said branching circuit to further horizontally transfer the signal charges; and first and second output circuits arranged at output ends of said second and third horizontal transfer circuits, respectively, for generating electrical signals from the signal charges;

said apparatus comprising a pre-branching transfer circuit arranged directly upstream of said branching circuit in said first horizontal transfer circuit for transferring the signal charges transferred by said first horizontal transfer circuit to said branching circuit;

at least either one of a duty cycle and a period of the drive signal driving said pre-branching transfer circuit being changed to provide for transfer time from said pre-branching transfer circuit to said branching circuit longer than a usual transfer time, further comprising a transfer efficiency calculator for calculating the transfer efficiency; wherein at lease either one of the duty cycle and the period for providing for longer transfer time is determined responsive to the transfer efficiency calculated by said transfer efficiency calculator.

26. The solid state imaging apparatus in accordance with claim 25 wherein when said transfer efficiency calculator calculates the transfer efficiency, said vertical transfer circuits transfer a signal charge set composed of a predetermined number of horizontally arrayed signal charges, to said first horizontal transfer circuit;

said first horizontal transfer circuit mixing said predetermined number of signal charges by a horizontal pixel mixing system to generate a reference signal pixel and first and second void pixels deprived of signal charges by mixing, the first and second void pixels being arrayed next to the trailing end of said reference signal pixel;

said branching circuit branching the reference signal pixel, said first void pixel and said second void pixel to transfer the reference signal pixel and the second void pixel to one of said second and third horizontal transfer circuits and to transfer the first void pixel to the other of said second and third horizontal transfer circuits;

said transfer efficiency calculator calculating the transfer efficiency using the residual charge quantity detected from the first and second void pixels.

27. The solid state imaging apparatus in accordance with claim 26 wherein said transfer efficiency calculator calculates the transfer efficiency between said branching circuit and the horizontal transfer circuits, on which the reference signal is transferred, using the residual charge quantity as detected from said first void pixel;

at lease either one of the duty cycle and the period for providing for longer transfer time being determined based on the transfer efficiency.

28. The solid state imaging apparatus in accordance with claim 26 wherein the horizontal pixel mixing system is a horizontal eight pixel mixing system.

29. The solid state imaging apparatus in accordance with claim 26 wherein in calculating the transfer efficiency, a light source of a predetermined light volume is shot beforehand at the time of shipment from a plant and the reference pixel, the first void pixel and the second void pixel are generated using signal charges obtained by the shooting;

said transfer efficiency calculator calculating the transfer efficiency using the reference pixel, the first void pixel and the second void pixel;

at lease either one of the duty cycle and the period for providing for longer transfer time being determined depending on the transfer efficiency determined based on the transfer efficiency calculated by said transfer efficiency calculator.

* * * * *